United States Patent
Il et al.

(10) Patent No.: US 9,837,982 B2
(45) Date of Patent: Dec. 5, 2017

(54) VIBRATING ELEMENT, VIBRATOR, OSCILLATOR, AND ELECTRONIC DEVICE WITH STEPPED EXCITATION SECTION

(71) Applicant: SEIKO EPSON CORPORATION, Tokyo (JP)

(72) Inventors: Toshihiro Il, Kamiina-gun (JP); Matsutaro Naito, Kamiina-gun (JP)

(73) Assignee: SEIKO EPSON CORPORATION, Tokyo (JP)

( * ) Notice: Subject to any disclaimer, the term of this patent is extended or adjusted under 35 U.S.C. 154(b) by 198 days.

(21) Appl. No.: 14/682,466

(22) Filed: Apr. 9, 2015

(65) Prior Publication Data
US 2015/0214921 A1     Jul. 30, 2015

Related U.S. Application Data

(62) Division of application No. 13/416,612, filed on Mar. 9, 2012, now Pat. No. 9,030,078.

(30) Foreign Application Priority Data

Mar. 9, 2011 (JP) .................................. 2011-051311
Mar. 9, 2011 (JP) .................................. 2011-051312

(51) Int. Cl.
*H03H 9/19* (2006.01)
*H03H 3/02* (2006.01)
(Continued)

(52) U.S. Cl.
CPC ............... *H03H 9/19* (2013.01); *H03B 5/36* (2013.01); *H03H 3/02* (2013.01);
(Continued)

(58) Field of Classification Search
CPC .................................. H03H 9/17; H03H 9/19
(Continued)

(56) References Cited

U.S. PATENT DOCUMENTS 5,198,716 A     3/1993  Godshall et al.
6,191,524 B1 *  2/2001  Sasaki ................ H03H 9/02133
                                                         310/367
(Continued)

FOREIGN PATENT DOCUMENTS

EP    1780890 A2      5/2007
JP    58-0047316 A    3/1983
(Continued)

OTHER PUBLICATIONS

Jan. 12, 2015 Notice of Allowance issued in U.S. Appl. No. 13/416,612.
(Continued)

*Primary Examiner* — J. San Martin
(74) *Attorney, Agent, or Firm* — Oliff PLC

(57) ABSTRACT

A vibrating element includes a piezoelectric substrate having an excitation section adapted to excite a thickness-shear vibration, and provided with a step section in each of side surfaces on both ends, and a peripheral section having a thickness smaller than a thickness of the excitation section, and the peripheral section has at least one projection section disposed on both principal surfaces in an area where a vibratory displacement when the excitation section excites a vibration is sufficiently attenuated.

16 Claims, 30 Drawing Sheets

(51) Int. Cl.
*H03H 9/02* (2006.01)
*H03H 9/05* (2006.01)
*H03H 9/10* (2006.01)
*H03B 5/36* (2006.01)

(52) U.S. Cl.
CPC .... *H03H 9/02023* (2013.01); *H03H 9/02086* (2013.01); *H03H 9/02149* (2013.01); *H03H 9/02157* (2013.01); *H03H 9/0509* (2013.01); *H03H 9/0542* (2013.01); *H03H 9/0547* (2013.01); *H03H 9/0552* (2013.01); *H03H 9/1021* (2013.01); *H03H 2003/022* (2013.01)

(58) Field of Classification Search
USPC .......................................... 310/320–321, 365
See application file for complete search history.

(56) References Cited

U.S. PATENT DOCUMENTS

| | | |
|---|---|---|
| 6,518,688 B1 | 2/2003 | Sasaki |
| 7,388,454 B2 | 6/2008 | Ruby et al. |
| 7,518,294 B2 * | 4/2009 | Umetsu ............... H03H 3/02 29/25.35 |
| 7,535,154 B2 | 5/2009 | Umeda et al. |
| 7,608,986 B2 * | 10/2009 | Yong ................ H03H 9/02023 310/346 |
| 8,450,906 B2 | 5/2013 | Taniguchi et al. |
| 8,536,761 B2 | 9/2013 | Yamashita et al. |
| 8,614,607 B2 | 12/2013 | Il et al. |
| 8,638,022 B2 * | 1/2014 | Yamashita ........... H03H 9/1021 310/320 |
| 8,766,514 B2 | 7/2014 | Il et al. |
| 9,030,078 B2 | 5/2015 | Il et al. |
| 9,093,634 B2 | 7/2015 | Il et al. |
| 9,231,183 B2 * | 1/2016 | Naito .................. H01L 41/053 |
| 9,431,995 B2 | 8/2016 | Yamashita |
| 9,496,480 B2 | 11/2016 | Naito et al. |
| 9,503,045 B2 | 11/2016 | Naito et al. |
| 2003/0111935 A1 | 6/2003 | Akane et al. |
| 2004/0095044 A1 | 5/2004 | Yagishita |
| 2005/0258146 A1 | 11/2005 | Umetsu |
| 2007/0008829 A1 | 1/2007 | Kitahara et al. |
| 2007/0096596 A1 | 5/2007 | Naito et al. |
| 2010/0148637 A1 | 6/2010 | Satou |
| 2010/0277251 A1 | 11/2010 | Kondo |
| 2011/0203083 A1 | 8/2011 | Sasaki et al. |
| 2012/0056514 A1 | 3/2012 | Ishikawa et al. |
| 2012/0126668 A1 | 5/2012 | Il et al. |
| 2012/0178648 A1 | 7/2012 | Kawase et al. |
| 2012/0235762 A1 | 9/2012 | Il et al. |
| 2013/0032842 A1 | 2/2013 | Park et al. |
| 2013/0063002 A1 | 3/2013 | Mizusawa et al. |
| 2013/0106247 A1 | 5/2013 | Ariji et al. |
| 2013/0106249 A1 | 5/2013 | Ariji et al. |
| 2013/0193807 A1 | 8/2013 | Mizusawa |
| 2013/0249353 A1 | 9/2013 | Naito et al. |
| 2013/0328452 A1 | 12/2013 | Fujihara et al. |
| 2014/0139074 A1 | 5/2014 | Naito et al. |
| 2016/0032367 A1 | 2/2016 | Kawase et al. |

FOREIGN PATENT DOCUMENTS

| | | |
|---|---|---|
| JP | S58-45205 B2 | 10/1983 |
| JP | 02-057009 A | 2/1990 |
| JP | 06-052230 U | 7/1994 |
| JP | H10-308645 A | 11/1998 |
| JP | H11-355094 A | 12/1999 |
| JP | 2001-077647 A | 3/2001 |
| JP | 2001-230654 A | 8/2001 |
| JP | 2001-230655 A | 8/2001 |
| JP | 2004-200777 A | 7/2004 |
| JP | 2005-159717 A | 6/2005 |
| JP | 3731348 B2 | 10/2005 |
| JP | 2005-318477 A | 11/2005 |
| JP | 2006-014270 A | 1/2006 |
| JP | 2006-108949 A | 4/2006 |
| JP | 2007-124441 A | 5/2007 |
| JP | 2007-189492 A | 7/2007 |
| JP | 4075893 B2 | 2/2008 |
| JP | 2008-236439 A | 10/2008 |
| JP | 2008-263387 A | 10/2008 |
| JP | 2008-306594 A | 12/2008 |
| JP | 2009-065270 A | 3/2009 |
| JP | 2009-130543 A | 6/2009 |
| JP | 2009-130564 A | 6/2009 |
| JP | 4341583 B2 | 10/2009 |
| JP | 4341671 B2 | 10/2009 |
| JP | 2010-062723 A | 3/2010 |
| JP | 2010-109527 A | 5/2010 |
| JP | 2010-114620 A | 5/2010 |
| JP | 4506135 B2 | 7/2010 |
| JP | 4558433 B2 | 10/2010 |
| JP | 4572807 B2 | 11/2010 |
| JP | 2012-054796 A | 3/2012 |
| JP | 2012-114496 A | 6/2012 |
| JP | 2012-199602 A | 10/2012 |
| JP | 2013-098813 A | 5/2013 |
| JP | 2013-098814 A | 5/2013 |
| JP | 2013-141311 A | 7/2013 |
| JP | 2013-192044 A | 9/2013 |
| JP | 2013-197913 A | 9/2013 |
| JP | 2014-147091 A | 8/2014 |
| JP | 2014-180050 A | 9/2014 |
| JP | 2015-091240 A | 5/2015 |

OTHER PUBLICATIONS

Sep. 26, 2014 Office Action issued in U.S. Appl. No. 13/416,612.
Jun. 17, 2014 Office Action issued in U.S. Appl. No. 13/416,612.
A study on Improvement of Properties of At-Cut Quartz Resonator Having Mesa Structure, Mar. 2005, Tokyo Metropolitan University, pp. 1-29.
Goka et al: "Decoupling Effect of Stepped Mesa Structures on Spurious Vibrations of At-Cut Quartz Plates", Frequency Control Symposium and Exhibition, 2000, Jan. 1, 2000, pp. 397-400.
Goka et al.; Mode Decoupling Effect of Multistepped Bi-Mesa At-Cut Quartz; Japanese Journal of Applied Physics; vol. 43, No. 5B, pp. 3016-3019; May 2004.
Shen F et al: "Energy Trapping in Mesa-Shaped Quartz Crystal Microbalance", Proceedings of IEEE Sensors 2002, vol. 2, 12 Jun. 12, 2002, pp. 1154-1159.
Mar. 30, 2012 Search Report Issued in European Application No. EP11189519.9.
Sep. 14, 2017 Office Action Issued in U.S. Appl. No. 14/683,891.

* cited by examiner

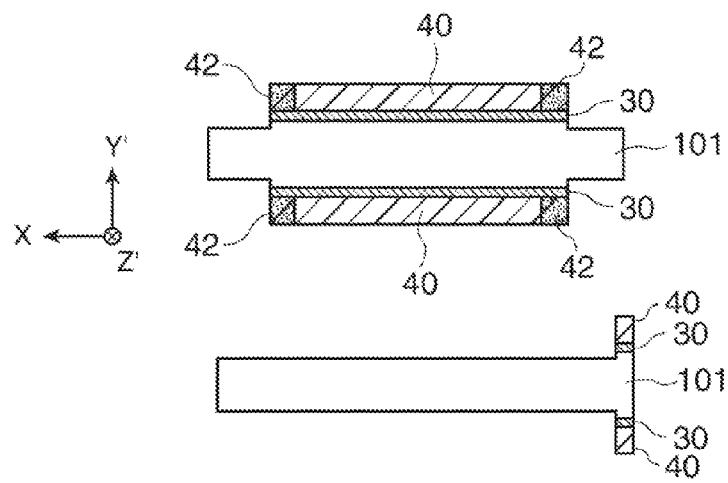
FIG. 31A
FIG. 31B
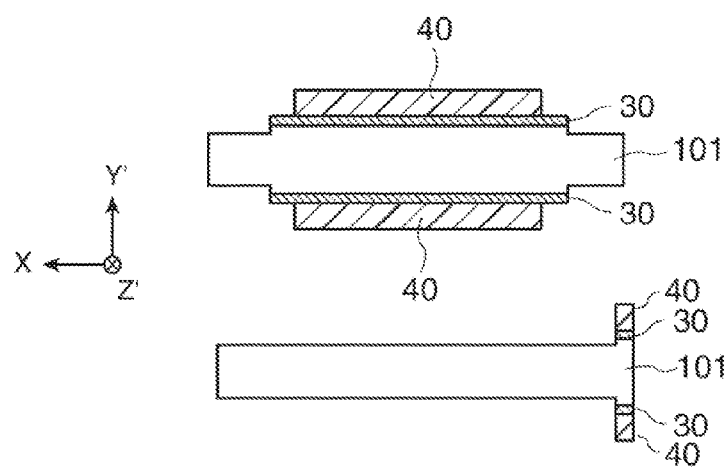
FIG. 32A
FIG. 32B
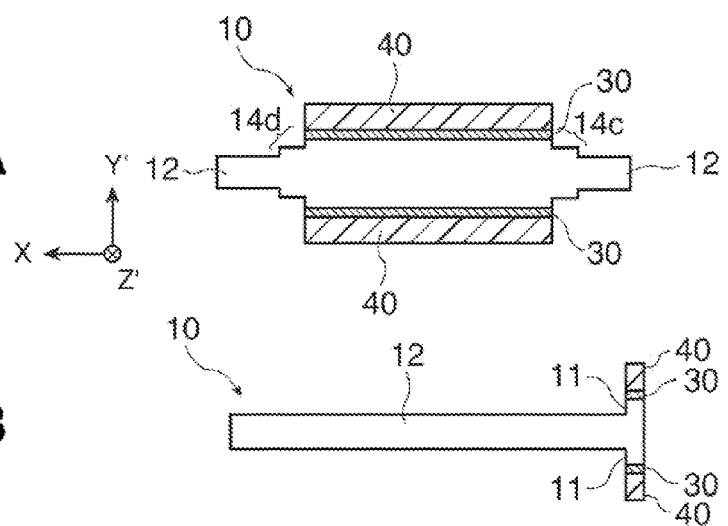
FIG. 33A
FIG. 33B

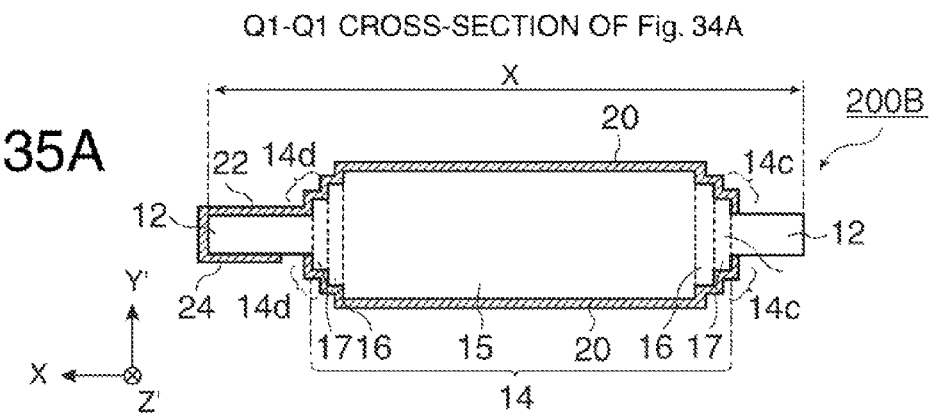
FIG. 35A  Q1-Q1 CROSS-SECTION OF Fig. 34A
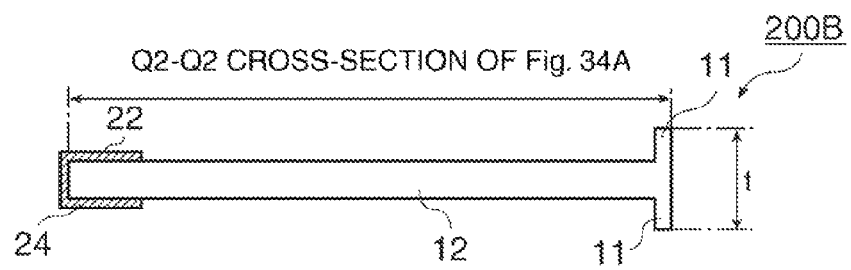
FIG. 35B  Q2-Q2 CROSS-SECTION OF Fig. 34A
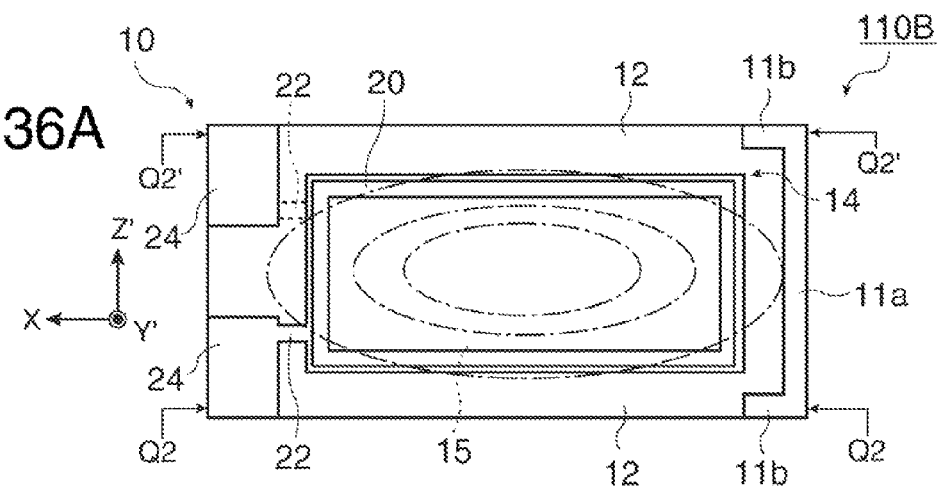
FIG. 36A
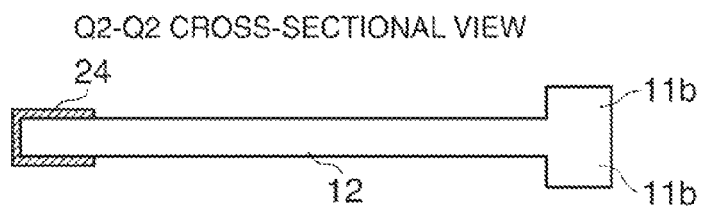
FIG. 36B  Q2-Q2 CROSS-SECTIONAL VIEW

VIBRATING ELEMENT, VIBRATOR, OSCILLATOR, AND ELECTRONIC DEVICE WITH STEPPED EXCITATION SECTION

This is a Divisional Application of application Ser. No. 13/416,612 filed Mar. 9, 2012 which claims priority to JP2011-051312 filed Mar. 9, 2011 and JP2011-051311 filed Mar. 9, 2011. The disclosure of the prior applications are hereby incorporate by reference herein their entirety.

BACKGROUND

1. Technical Field

The present invention relates to a thickness vibration mode piezoelectric vibrator, and in particular to a piezoelectric vibrating element (a vibrating element), a piezoelectric vibrator (a vibrator), a piezoelectric oscillator (an oscillator), and an electronic device each having a so-called mesa structure.

2. Related Art

A quartz crystal vibrating element using an AT-cut quartz crystal vibrating element has the vibration mode of thickness-shear vibration, and has frequency temperature characteristics showing an excellent cubic curve, and is therefore used in a number of fronts such as electronic equipment.

JP-A-58-047316 (Document 1) discloses a piezoelectric vibrator (an AT-cut quartz crystal vibrator) of a so-called mesa structure having the same level of energy confinement effect as that of the bevel structure or the convex structure.

It is known that, in the thickness-shear vibrator having a small length-to-thickness ratio (a ratio of the length of the side to the thickness), the contour vibration (e.g., flexural vibration) due to the contour dimension of the piezoelectric substrate is combined with the principal vibration to thereby degrade the characteristics of the principal vibration unless the length-to-thickness ratio is set appropriately.

JP-UM-A-06-052230 (Document 2) discloses the fact that, in view of the problem that an extraction electrode (a lead electrode) extending from each of excitation electrodes is broken if a sidewall in a boundary section between a mesa portion and a thin-wall portion is at an angle of 90° with a principal surface in an AT-cut quartz crystal vibrator formed to have a mesa structure, the broken line of the lead electrode can be prevented by forming the sidewall of the boundary section to be tilted or to have a curved surface. Further, it is also disclosed that by setting the roughness of a surface of the vibrating portion to a surface roughness as low as 0.2 micron in average roughness, the CI value is lowered, and thus the secondary vibration is suppressed.

Further, JP-A-2001-230655 (Document 3) discloses a quartz crystal vibrator having combination of the thickness-shear vibration and the flexural vibration suppressed by forming the AT-cut quartz crystal vibrator to have the mesa structure and tilting the sidewall of the mesa portion 63°, 35°.

Japanese Patent No. 4341583 (Document 4) discloses the fact that assuming that the frequency of a quartz crystal vibrating element is "f," the length of a long side (X axis) of a quartz crystal substrate is "X," the thickness of a mesa portion (the vibrating portion) is "t," the length of a long side of the mesa portion is "Mx," the length of a long side of each of excitation electrodes is "Ex," and the wavelength of a flexural vibration caused in the long-side direction of the quartz crystal substrate is "λ," by setting the parameters f, X, Mx, and Ex so as to fulfill the following four formulas, the thickness-shear vibration and the flexural vibration can be prevented from being combined.

$$\lambda/2 = (1.332/f) - 0.0024 \quad (1)$$

$$(Mx - Ex)/2 = \lambda/2 \quad (2)$$

$$Mx/2 = (n/2 + 1/4)\lambda \text{ (where } n \text{ is an integer)} \quad (3)$$

$$X \geq 20t \quad (4)$$

JP-A-2008-263387 (Document 5) discloses the fact that assuming that the dimension of the long side of a piezoelectric substrate is "x," and the thickness dimension of a mesa portion (a vibrating portion) is "t," by setting the length-to-thickness ratio so that the height (a digging amount of a step section) y of a mesa portion of the piezoelectric substrate having a mesa structure fulfills the following formula with reference to the substrate thickness t, an unwanted mode can be suppressed.

$$y = -0.89 \times (x/t) + 34 \pm 3 (\%)$$

JP-A-2010-062723 (Document 6) discloses the fact that assuming that the length of a short side of a piezoelectric substrate having a mesa structure is "Z," the thickness of a mesa portion (a vibrating portion) is "t," and the electrode dimension in a short side direction of the mesa portion is "Mz," by setting these parameters to fulfill the following relationship, the unwanted mode can be suppressed.

$$15.68 \leq Z/t \leq 15.84, \text{ and } 0.771 \leq Mz/Z \leq 0.82$$

However, in the piezoelectric vibrator having smaller length-to-thickness ratio, there is a problem that the vibratory displacement is not sufficiently attenuated in an end portion of the X axis to thereby excite the unwanted flexural mode in the end surface, which is combined with the principal vibration.

JP-A-02-057009 (Document 7) discloses the fact that by making the mesa structure have multiple steps, it becomes possible to more completely confine the vibration energy of the principal vibration.

Japanese Patent No. 3731348 (Document 8) discloses the fact that by constituting a piezoelectric substrate having a convex cross-sectional shape along the envelope curve of a supposed convex shape so as to have a staircase shape, it can approximately be replaced, and further, if the side surface having the staircase shape is replaced with a slope, the degree of approximation is increased.

JP-A-2008-236439 (Document 9) and JP-A-2010-109527 (Document 10) disclose the fact that by making a mesa portion of a piezoelectric substrate having a mesa structure have multiple steps, it is possible to enhance the energy confinement effect of a principal vibration to thereby suppress the unwanted mode.

JP-A-2009-130543 (Document 11) discloses a mesa vibration device using a step portion of a mesa structure as a flow stopper of an electrically-conductive adhesive to thereby achieve inflow prevention of the adhesive to the mesa portion. As described above, Documents 7 through 11 disclose the fact that it is effective for suppressing the combination of the principal vibration and the flexural vibration to making the mesa structure of the piezoelectric substrate be the multistage mesa structure to thereby deepen the energy confinement.

In the recent small-sized piezoelectric vibrator, when housing the piezoelectric vibrating element having a mesa structure inside a surface mount package and then sealing the package with a lid member, the piezoelectric vibrating element is supported by a so-called cantilever method in which one edge portion of the piezoelectric vibrating element is adhesively fixed to an element mounting pad in the package using an electrically-conductive adhesive, and the other edge portion opposed to the one edge portion is set to a free end. However, since the package shape is small, there is a problem that a necessary amount of electrically-conductive adhesive fails to be provided to thereby easily degrade the adhesion force, and thus the principal surface of the piezoelectric vibrating element is tilted, and the excitation electrodes have contact with an inner bottom of the package to thereby cause a malfunction.

Japanese Patent No. 4075893 (Document 12) discloses a manufacturing method of an AT-cut quartz crystal vibrator having a multistage mesa structure using a laser.

Further, JP-A-2004-200777 (Document 13) discloses a piezoelectric vibrating element having a structure in which a vibrating portion has a mesa structure, one edge of a thin-wall portion across the mesa portion is formed as a thick-wall projection section, and at least apart of the other edge opposed thereto is formed as a thick-wall projection section. When mounting the thick-wall projection section on the other edge on the element mounting pad using the electrically-conductive adhesive, the thick-wall projection section provided to the one edge stays in a space of a cavity of the package, has contact with an inner bottom of the package, or has contact with a lid member. It is disclosed that, because of the configuration described above, since there is no possibility for excitation electrodes provided to the mesa portion to have contact with the inner bottom of the package or the lid member, and the vibration of the piezoelectric vibrating element is not hindered, stable characteristics can be obtained.

However, the vibratory displacement energy of the quartz crystal vibrating element takes the maximum value at the center of each of the excitation electrodes, and is attenuated as the position moves away from the center toward the periphery. When plotting the parts having the same value of the vibratory displacement energy, there is drawn a plurality of ellipses having substantially similar shapes centered on the center thereof called isodynamic lines. In the quartz crystal vibrating element of Document 13, there is a problem that although the thick-wall projection section provided to the one edge thereof in the longitudinal direction (the X-axis direction) has the function of preventing the excitation electrodes and the package from having contact with each other, some of the vibratory displacement energy of the quartz crystal vibrating element is lost due to the interference with the thick-wall projection section provided to the one edge. The smaller the quartz crystal vibrating element is made, the larger the influence rate of the loss becomes, and there is a problem that it is difficult to stabilize the electrical characteristics of the quartz crystal vibrator.

JP-A-2010-114620 (Document 14) discloses a piezoelectric vibrating element having a mesa structure having a projection section at one end portion opposed to the other end portion at which the piezoelectric vibrating element is cantilevered. The projection section is disposed in at least one place in the corner portions excepting the central portion in the width direction of the other end portion. The projection section is disposed in the corner portion furthest from the center of the piezoelectric vibrating element having the mesa structure to thereby make the projection section have contact with the housing member. It is disclosed that according to this configuration, a piezoelectric vibrator with stable electrical characteristics can be obtained even if the piezoelectric vibrating element is miniaturized.

However, in the thickness-shear vibrating element using a quartz crystal substrate having a multistage mesa structure with the long-side direction parallel to the X axis (the electrical axis as one of the crystal axes of the quartz crystal), there is a problem that in the condition in which the X length-to-thickness ratio (the ratio X/t of the long-side dimension X to the thickness t) is low, for example, the ratio X/t is equal to or lower than 17, there occurs the combination of the thickness-shear vibration and contour vibration (e.g., a flexural vibration) in a direction parallel to a Z' axis (an axis obtained by rotating an optical axis as one of the crystal axes of the quartz crystal as much as a predetermined angle taking the X axis as the central axis).

Further, the pad provided to an end portion of the quartz crystal vibrating element having the multistage mesa structure is mounted on the element mounting pad formed on the inner bottom of the package, and is then fixed with an electrically-conductive adhesive in a conductive manner to thereby constitute a quartz crystal vibrator. On this occasion, there is a problem that it is difficult to keep the both principal surfaces of the quartz crystal vibrating element and the bottom of the package parallel to each other due to the amount and the viscosity of the electrically-conductive adhesive applied to the element mounting pad, and the excitation electrodes of the quartz crystal vibrating element have contact with the bottom of the package or the lid member for seal to thereby deteriorate the electrical characteristics of the quartz crystal vibrator.

SUMMARY

An advantage of some aspects of the invention is to realize a vibrating element, a vibrator, an oscillator, and an electronic device using the vibrating element, the vibrating element being a thickness-shear piezoelectric vibrating element having excitation electrodes provided to the excitation section of a piezoelectric substrate having a low long-side ratio to the thickness, and provided with a multistage mesa structure in the long-side direction, wherein the combination of the thickness-shear vibration and the contour vibration (e.g., a flexural vibration) in the Z'-axis direction is suppressed, and projection sections perpendicular to the principal surface of the piezoelectric substrate are respectively provided to both of obverse and reverse sides of an end portion of the piezoelectric substrate.

Application Example 1

This application example of the invention is directed to a vibrating element including a piezoelectric substrate having an excitation section adapted to excite a thickness-shear vibration, and provided with a step section in each of side surfaces on both ends, and a peripheral section having a thickness smaller than a thickness of the excitation section, wherein the peripheral section has at least one projection section disposed on both principal surfaces in an area where a vibratory displacement when the excitation section excites a vibration is sufficiently attenuated.

By providing the projection sections on the both principal surfaces in the area on the piezoelectric substrate where the vibratory displacement is sufficiently attenuated, there is an advantage that the possibility for the excitation electrodes provided to the excitation section to have contact with the inner surface of the package when installing the element to the package can be eliminated. Further, according to the vibrating element using the piezoelectric substrate, there is an advantage that the combination of the thickness-shear vibration and the unwanted mode such as a contour vibration in a direction perpendicular to the plane having the non-stepped shape can be suppressed to thereby reduce the CI value.

Application Example 2

This application example of the invention is directed to the vibrating element according to Application Example 1, which further includes excitation electrodes disposed respectively on the obverse and reverse principal surfaces of the excitation section, extraction electrodes extending from the respective excitation electrodes toward one end of the peripheral section, and pads electrically connected to the respective extraction electrodes and disposed in the one end of the peripheral section.

By providing the excitation electrodes, the extraction electrodes, and the pads to the piezoelectric substrate according to Application Example 1, the vibrating element provided with the advantages described above can be built.

Application Example 3

This application example of the invention is directed to the vibrating element according to Application Example 1 or 2, wherein the projection section is disposed on the other end across the excitation section from the pads.

The positional relationship between the pads and the projection section can be adjusted with ease in layout.

Application Example 4

This application example of the invention is directed to the vibrating element according to Application Example 3, wherein the excitation section has a rectangular shape, and the step section is disposed on each of the side surfaces at one both ends of the excitation section.

Although the shapes of the piezoelectric substrate and the excitation section are not particularly limited, it is preferable for the production efficiency, downsizing, and improvement in characteristics to form the excitation section to have a rectangular shape.

Application Example 5

This application example of the invention is directed to the vibrating element according to Application Example 4, wherein, assuming that in an orthogonal coordinate system composed of an X axis as an electrical axis, a Y axis as a mechanical axis, and a Z axis as an optical axis, which are crystal axes of a quartz crystal, an axis obtained by tilting the Z axis toward a −Y direction of the Y axis around the X axis is a Z' axis, and an axis obtained by tilting the Y axis toward a +Z direction of the Z axis around the X axis is a Y' axis, the piezoelectric substrate is a quartz crystal substrate composed of planes parallel to the X axis and the Z' axis and having a thickness in a direction parallel to the Y' axis, the one both ends of the excitation section are parallel to the Z' axis, and the projection section is disposed along an edge along the Z' axis.

By configuring the vibrating element using the quartz crystal, there is an advantage that the vibrating element is superior in frequency temperature characteristics, and at the same time, the combination of the thickness-shear vibration and the contour vibration in the Z'-axis direction can be suppressed to thereby reduce the CI value. Further, by providing the projection sections on the both principal surfaces in the area on the substrate where the vibratory displacement is sufficiently attenuated, there is an advantage that the possibility for the excitation electrodes provided to the excitation section to have contact with the inner surface of the package when installing the element to the package can be eliminated.

Application Example 6

This application example of the invention is directed to the vibrating element of the above application example, wherein, assuming that a dimension of the quartz crystal substrate in a direction parallel to the Z' axis is Z, a dimension of a short side of the excitation section is Mz, and a thickness of the excitation section is t, $8 \leq Z/t \leq 11$, and $0.6 \leq Mz/Z \leq 0.8$ are fulfilled.

By configuring the vibrating element as described above, there is an advantage that the reduction in the CI value can further be achieved, and at the same time, the yield ratio in manufacture of the vibrating element can significantly be improved since the contact between the excitation electrode and the inner surface of the package is eliminated.

Application Example 7

This application example of the invention is directed to the vibrating element of the above application example, wherein, assuming that a dimension of the quartz crystal substrate in a direction parallel to the X axis is X, $X/t \leq 17$ is fulfilled.

By configuring the vibrating element as described above, there is an advantage that the reduction in the CI value can be achieved while achieving downsizing, and at the same time, the yield ratio in manufacture of the vibrator can significantly be improved since the contact between the excitation electrode and the inner surface of the package is eliminated.

Application Example 8

This application example of the invention is directed to the vibrating element according to any of Application Examples 5 to 7, wherein the projection section includes a first projection part disposed along an edge of the quartz crystal substrate along the Z' axis, and second projection parts respectively disposed contiguously from both ends of the first projection part in the Z'-axis direction so as to be folded toward a direction along the X axis.

By forming the projection sections having the bracket shape in the end portion of the piezoelectric substrate as described above, there can be obtained an advantage that even if the vibrating element is fixed by bonding to the package after being rotated in the X-axis direction, there is no possibility that the excitation electrodes have contact with the inner surface of the package, and the yield ratio is significantly improved when manufacturing the vibrator.

Application Example 9

This application example of the invention is directed to the vibrating element according to any of Application Examples 5 to 7, wherein a total thickness of thicknesses of the projection sections on obverse and reverse sides and a thickness of the peripheral section is equal to a thickness of the excitation section.

By making the total thickness of the thicknesses of the respective projection sections on the obverse and reverse sides and the thickness of the peripheral section equal to the thickness of the excitation section, there is an advantage that the manufacture of the piezoelectric substrate is easy, there is no possibility for the excitation electrodes to have contact with the inner surface of the package, and the yield ratio can significantly be improved when manufacturing the vibrator.

Application Example 10

This application example of the invention is directed to the vibrating element according to any of Application Examples 5 to 7, the side surfaces at the other both ends of the excitation section are each a non-stepped plane.

According to such a configuration, the combination of the thickness-shear vibration and the unwanted mode such as a contour vibration in a direction perpendicular to the plane having the non-stepped shape can be suppressed to thereby reduce the CI value.

Application Example 11

This application example of the invention is directed to the vibrating element according to any of Application Examples 5 to 7, wherein the step section is additionally disposed on each of the side surfaces at the other both ends of the excitation section.

According to this configuration, since the excitation section has the multistage mesa structure, there can be obtained an advantage that the combination of the thickness-shear vibration and the unwanted mode such as the contour vibration can be suppressed, and at the same time, the CI value can be reduced while achieving downsizing since the vibration energy can be confined in the excitation section.

Application Example 12

This application example of the invention is directed to a vibrator including the vibrating element according to Application Example 1 or 2, and a package adapted to house the vibrating element.

By configuring the vibrator as described above, since the vibrating element according to any of the application examples described above is provided, there is an advantage that the reduction in the CI value can be achieved, and at the same time, the yield ratio in manufacture of the vibrator can significantly be improved since the contact between the excitation electrode and the inner surface of the package is eliminated.

Application Example 13

This application example of the invention is directed to an oscillator including the vibrating element according to Application Example 1 or 2, an oscillator circuit adapted to drive the vibrating element, and a package.

By configuring the oscillator as described above, since the piezoelectric vibrator with small CI value according to the above application example and the oscillator circuit are provided, and therefore the oscillatory frequency is stable and the current (the oscillation current) of the oscillator circuit can be reduced, there is an advantage that the power consumption of the oscillator can be reduced. Further, the oscillator can be miniaturized.

Application Example 14

This application example of the invention is directed to the oscillator according to the above application example, wherein the oscillator circuit is installed in an IC.

By configuring the piezoelectric oscillator as described above, by making the oscillator circuit as an IC, there is an advantage that the piezoelectric oscillator is miniaturized, and at the same time, the reliability is also enhanced.

Application Example 15

This application example of the invention is directed to an electronic device including a package having the vibrating element according to Application Example 1 or 2, and at least one electronic component.

According to the configuration of the electronic device, since the electronic device is composed of the piezoelectric vibrating element according to the above application example and the electronic component, the electronic device having the piezoelectric vibrating element with a small CI value can be configured, and therefore, there is an advantage that the electronic device can be applied to purposes of a variety of fields.

Application Example 16

This application example of the invention is directed to the electronic device according to Application Example 15, wherein the electronic component is one selected from a group consisting of a thermistor, a capacitor, a reactive element, and a semiconductor element.

According to the configuration of the electronic device described above, since the electronic device is configured using at least one electronic component among the thermistor, the capacitor, the reactive element, and the semiconductor element, and the piezoelectric vibrating element, there is an advantage that the electronic device becomes a useful device for electronic equipment.

BRIEF DESCRIPTION OF THE DRAWINGS

The invention will be described with reference to the accompanying drawings, wherein like numbers reference like elements.

FIGS. 1A through 1C are schematic diagrams showing a piezoelectric vibrating element having a mesa structure according to a first embodiment of the invention, wherein FIG. 1A is a plan view, FIG. 1B is a P1-P1 cross-sectional view, and FIG. 1C is a P2-P2 cross-sectional view.

FIGS. 12A through 12C are diagrams according to a modified example of the present embodiment, wherein FIG. 12A is a plan view, FIG. 12B is a P4-P4 cross-sectional view, and FIG. 12C is a P5-P5 cross-sectional view.

FIGS. 14A and 14B are diagrams according to another modified example of the present embodiment, wherein FIG. 14A is a plan view, and FIG. 14B is a Q2-Q2 cross-sectional view.

FIGS. 15A and 15B are diagrams according to another modified example of the present embodiment, wherein FIG. 15A is a plan view, and FIG. 15B is a Q1-Q1 cross-sectional view.

FIGS. 16A and 16B are diagrams according to another modified example of the present embodiment, wherein FIG. 16A is a plan view, and FIG. 16B is a Q2-Q2 cross-sectional view.

FIGS. 17A through 17D are cross-sectional views schematically showing the piezoelectric vibrator according to the present embodiment, wherein FIG. 17A is a cross-sectional view of a central portion in a longitudinal direction, FIG. 17B is a cross-sectional view of an end portion in the longitudinal direction, and FIGS. 17C and 17D are explanatory cross-sectional views.

FIGS. 23A through 23C are schematic diagrams showing a piezoelectric vibrating element having a mesa structure according to a second embodiment of the invention, wherein FIG. 23A is a plan view, FIG. 23B is a P1-P1 cross-sectional view, and FIG. 23C is a P2-P2 cross-sectional view.

FIGS. 31A and 31B are cross-sectional views schematically showing the method of manufacturing the piezoelectric vibrating element according to the present embodiment, wherein FIG. 31A is the cross-sectional view of a central portion, and FIG. 31B is the cross-sectional view of an end portion.

FIGS. 32A and 32B are cross-sectional views schematically showing the method of manufacturing the piezoelectric vibrating element according to the present embodiment, wherein FIG. 32A is the cross-sectional view of the central portion, and FIG. 32B is the cross-sectional view of the end portion.

FIGS. 33A and 33B are cross-sectional views schematically showing the method of manufacturing the piezoelectric vibrating element according to the present embodiment, wherein FIG. 33A is the cross-sectional view of the central portion, and FIG. 33B is the cross-sectional view of the end portion.

FIGS. 34A through 34C are diagrams showing a configuration of a modified example of the present embodiment, wherein FIG. 34A is a plan view, FIG. 34B is a P1-P1 cross-sectional view, and FIG. 34C is a P2-P2 cross-sectional view.

FIG. 35A is a Q1-Q1 cross-sectional view of FIG. 34A, and FIG. 35B is a Q2-Q2 cross-sectional view of FIG. 34A.

FIGS. 36A and 36B are diagrams according to another modified example of the present embodiment, wherein FIG. 36A is a plan view, and FIG. 36B is a Q2-Q2 cross-sectional view.

FIGS. 37A and 37B are diagrams according to another modified example of the present embodiment, wherein FIG. 37A is a plan view, and FIG. 37B is a Q1-Q1 cross-sectional view.

FIGS. 38A and 38B are diagrams according to another modified example of the present embodiment, wherein FIG. 38A is a plan view, and FIG. 38B is a Q2-Q2 cross-sectional view.

FIGS. 39A through 39D are cross-sectional views schematically showing the piezoelectric vibrator according to the present embodiment, wherein FIG. 39A is a cross-sectional view of a central portion in a longitudinal direction, FIG. 39B is a cross-sectional view of an end portion in the longitudinal direction, and FIGS. 39C and 39D are explanatory cross-sectional views.

DESCRIPTION OF EXEMPLARY EMBODIMENTS

First Embodiment of the Invention

A first embodiment of the invention will hereinafter be explained with reference to the accompanying drawings. The invention is not at all limited by the embodiment described below, and includes a variety of types of modified examples put into practice within a scope or spirit of the invention. It should be noted that all of the constituents described in the following embodiment below are not necessarily essential elements of the invention.

1. Piezoelectric Vibrating Element (Vibrating Element)

Figure 1A:
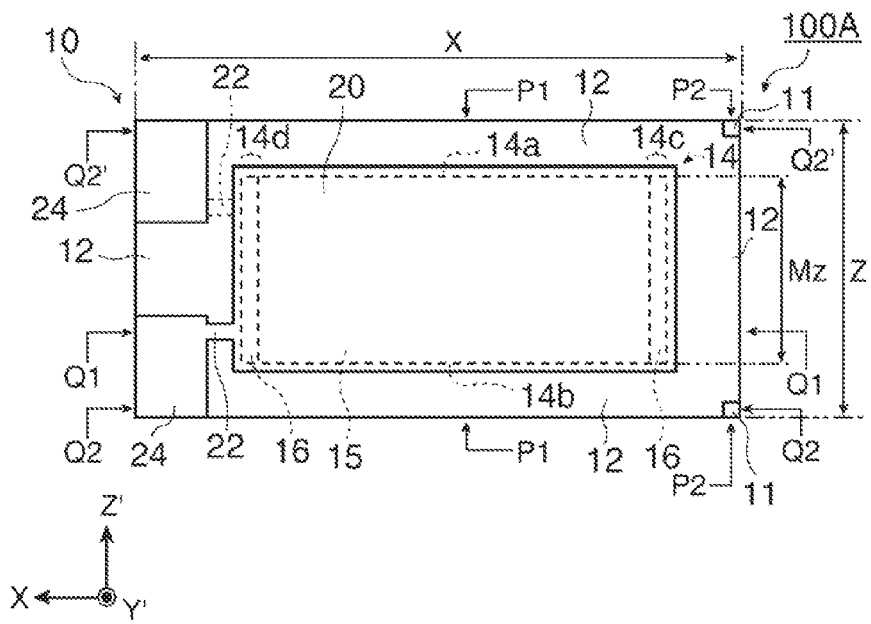
Figure 1B:
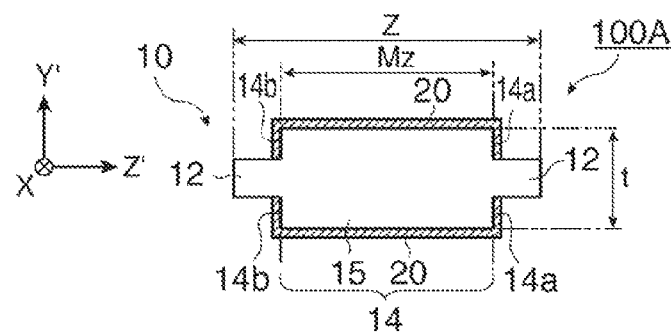
Figure 1C:
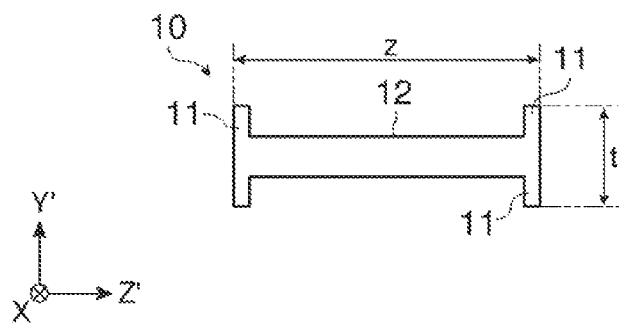
Figure 2A:
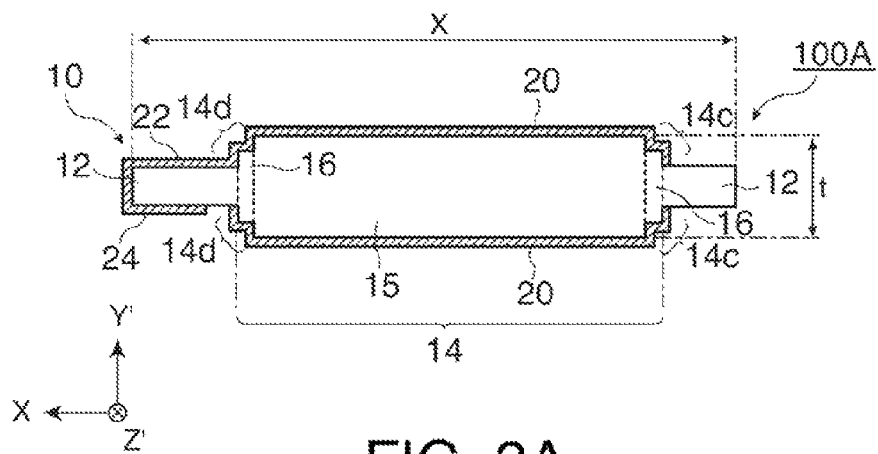
FIG. 2A is a Q1-Q1 cross-sectional view of FIG. 1A.
Figure 2B:
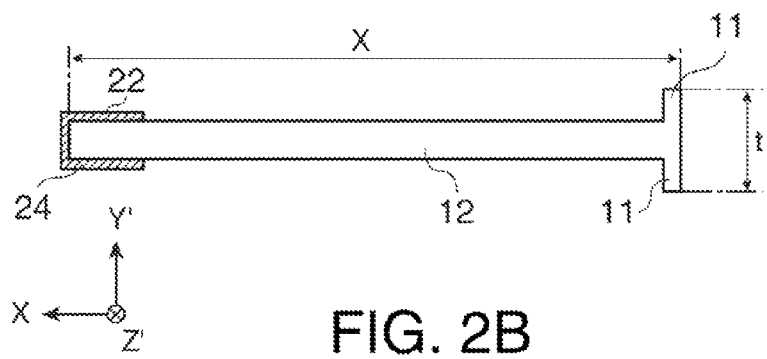
FIG. 2B is a Q2-Q2 cross-sectional view of FIG. 1A.

Firstly, a piezoelectric vibrating element according to the present embodiment will be explained with reference to the accompanying drawings. FIGS. 1A through 1C, 2A, and 2B are schematic diagrams showing a configuration of a piezoelectric vibrating element (a vibrating element) 100A according to an embodiment of the invention. FIG. 1A is a plan view of the piezoelectric vibrating element 100A, FIG. 1B is a P1-P1 cross-sectional view of FIG. 1A, and FIG. 1C is a P2-P2 cross-sectional view of FIG. 1A. FIG. 2A is a Q1-Q1 cross-sectional view of FIG. 1A, and FIG. 2B is a Q2-Q2 cross-sectional view of FIG. 1A or a Q2'-Q2' cross-sectional view thereof.

The piezoelectric vibrating element (the vibrating element) 100A according to the present embodiment is provided mainly with a piezoelectric substrate 10 having a excitation section 14 with a multistage mesa structure located in a central portion and a thin-wall peripheral section 12 contiguously formed on the periphery of the excitation section 14, excitation electrodes 20 disposed on the respective principal surfaces of the excitation section 14 so as to be opposed to each other, extraction electrodes 22 extending from the respective excitation electrodes 20 toward the end portion of the piezoelectric substrate 10, and pads 24 respectively formed at the ends of the extraction electrodes 22 and in two corner portions of the piezoelectric substrate 10.

The excitation section 14 is a thick-wall section having the central portion of the piezoelectric substrate protruding in the both principal surface directions, and the peripheral section 12 is formed so as to project from an intermediate portion in the thickness direction of at least a part of the peripheral side surface of the excitation section 14 in the diameter direction.

The piezoelectric substrate 10 has the excitation section 14 located in the central portion thereof and forming a principal vibration area, and the peripheral section 12 having a smaller thickness than the excitation section 14 and formed along the periphery of the excitation section 14. The two side surfaces (the both side surfaces along the longitudinal direction) opposed to each other of the excitation section 14 each having a roughly rectangular planar shape are each a single plane with no step sections, and the other two side surfaces (the two side surfaces along the short-side direction) opposed to each other of the excitation section 14 each have a structure having a step section in the thickness direction.

When applying an alternating voltage to the excitation electrodes 20, the piezoelectric vibrating element 100A is excited at a natural vibration frequency. On each of the obverse and reverse surfaces of the peripheral section 12 of the area where the vibratory displacement thus excited is sufficiently attenuated, there is formed at least one projection section 11 perpendicular to the principal surface direction of the piezoelectric substrate 10.

In the example shown in FIGS. 1A through 1C, 2A, and 2B, two projection sections 11 are formed on each of the obverse and reverse surfaces in corner portions (on the right side of FIG. 1A) opposed to pads 24 respectively formed in two corner portions (on the left side of FIG. 1A) of the piezoelectric substrate 10. In other words, the two projection sections 11 formed on each of the obverse and reverse surfaces of the peripheral section 12 are disposed in the corner portions of the peripheral section 12 of the piezoelectric substrate 10. The total of the thickness of the projection sections 11 on the obverse and reverse sides and the thickness of the peripheral section 12 can be arranged to be equal to the thickness of the center of the excitation section 14.

Figure 3:
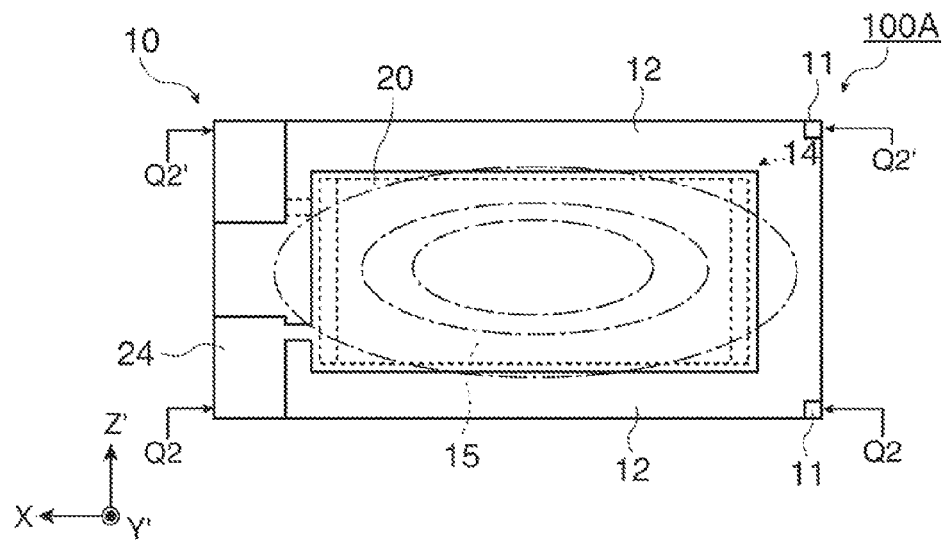
FIG. 3 is a diagram showing isodynamic lines formed by connecting the points having the same vibratory displacement energy superimposed on the plan view of the piezoelectric vibrating element with the mesa structure.

FIG. 3 shows the isodynamic lines, which are obtained by connecting the points having the same vibratory displacement energy (the product of the square of the vibratory displacement and the mass at the point) generated when the piezoelectric vibrating element 100A is excited, on the plan view of the piezoelectric vibrating element 100A with the dashed-dotted line. In the piezoelectric vibrating element 100A shown in FIG. 3, since the excitation section 14 has a rectangular shape elongated in the X-axis direction, each of the isodynamic lines has an elliptical shape with a large long diameter in the X-axis direction and a small short diameter in the Z'-axis direction. The dimension of the vibratory displacement is the largest in the central portion of the excitation section 14, and decreases as the distance from the central portion increases. In other words, it is distributed on the cosine in both of the X-axis direction and the Z'-axis direction on the excitation electrodes 20, and is attenuated in an exponential manner in the area without the excitation electrodes 20.

Figure 4:
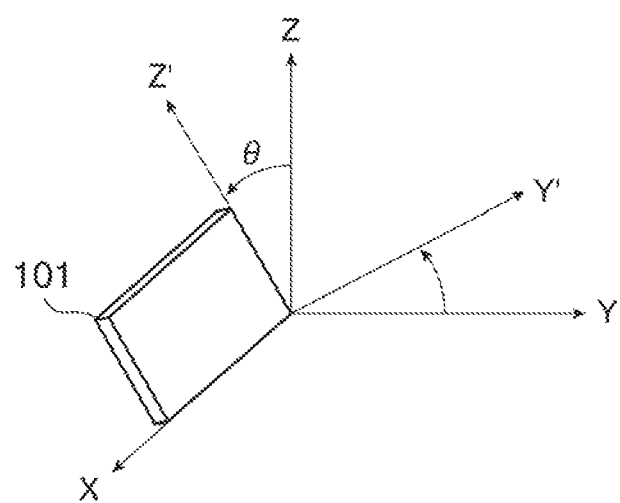
FIG. 4 is a diagram showing a relationship between new orthogonal axes X, Y', and Z' formed by rotating the crystal axes X, Y, and Z of a quartz crystal as much as an angle θ around the X axis and an AT-cut quartz crystal substrate.

In the piezoelectric vibrating element 100A shown in FIGS. 1A through 1C, the projection sections 11 are disposed in the areas where the vibratory displacement energy is sufficiently attenuated, namely the corner portions of the peripheral section 12. Therefore, even if the projection sections 11 are provided, the vibratory displacement section of the piezoelectric vibrating element 100A is hardly affected. In other words, nothing is different in the electrical characteristics of the piezoelectric vibrating element 100A. Incidentally, the piezoelectric material such as a quartz crystal belongs to a trigonal system, and has the crystal axes X, Y, and Z perpendicular to each other as shown in FIG. 4. The X axis, the Y axis, and the Z axis are referred to the electrical axis, the mechanical axis, and the optical axis, respectively. The AT-cut quartz crystal substrate 101 is a flat plate curved from the quartz crystal along a plane obtained by rotating the X-Z plane as much as an angle θ around the X axis. In the case of the AT-cut quartz crystal substrate 101, the angle θ equals to about 35°15'. It should be noted that the Y' axis and the Z' axis are obtained by rotating the Y axis and the Z axis as much as the angle θ around the X axis. Therefore, the AT-cut quartz crystal substrate 101 has the crystal axes X, Y', and Z' perpendicular to each other. The AT-cut quartz crystal substrate 101 has the thickness direction of the Y'-axis direction, and the principal surface of the X-Z' plane (the plane including the X axis and the Z' axis) perpendicular to the Y' axis, and the thickness-shear vibration is excited therein. By processing the AT-cut quartz crystal substrate 101, the piezoelectric substrate 10 can be obtained.

In other words, as shown in FIG. 4, assuming that in the orthogonal coordinate system composed of the X axis (the electrical axis), the Y axis (the mechanical axis), and the Z axis (the optical axis), the axis obtained by tilting the Z axis toward the −Y direction of the Y axis around the X axis is the Z' axis, and the axis obtained by tilting the Y axis toward the +Z direction of the Z axis around the X axis is the Y' axis, the piezoelectric substrate 101 is formed of the AT-cut quartz crystal substrate composed of the planes parallel to the X axis and the Z' axis and having the thickness in the direction parallel to the Y' axis.

As shown in FIG. 1A, the piezoelectric substrate 10 can have a rectangular shape having a direction (hereinafter referred to as a "Y'-axis direction") parallel to the Y' axis as the thickness direction, the direction (hereinafter referred to as an "X-axis direction") parallel to the X axis as the long side, and the direction (hereinafter referred to as a "Z'-axis direction") parallel to the Z' axis as the short side. The piezoelectric substrate 10 has the excitation section 14, and the peripheral section 12 formed along the periphery of the excitation section 14. Here, it is assumed that the "rectangular shape" includes rectangular shapes in a literal sense and shapes obtained by chamfering the corners of rectangles.

As shown in FIGS. 1A through 1C, 2A, and 2B, the peripheral section 12 is provided to at least a part of the peripheral surface (the side surface) of the excitation section 14, and has a thickness (thinner wall) smaller than that of the excitation section 14.

As shown in FIGS. 1A through 1C, 2A, and 2B, the excitation section 14 according to the present embodiment is surrounded by the peripheral section 12 in the entire periphery thereof, and has a thickness (thicker wall) larger than the thickness of the peripheral section 12 in the Y'-axis direction. In other words, as shown in FIGS. 1B and 2A, the excitation section 14 projects in the Y'-axis direction with respect to the peripheral section 12. In the example shown in the drawings, the excitation section 14 projects on the +Y'-axis side and the −Y'-axis side with respect to the peripheral section 12. It is possible for the excitation section 14 to have, for example, a point (not shown) to be the center of symmetry, and have a shape point-symmetric about the central point.

As shown in FIG. 1A, the excitation section 14 has a rectangular shape having the long side in the X-axis direction, and the short side in the Z'-axis direction. In other words, the excitation section 14 has a side parallel to the X axis as the long side, and a side parallel to the Z' axis as the short side. Therefore, the excitation section 14 has side surfaces 14a, 14b extending in the X-axis direction and side surfaces 14c, 14d extending in the Z'-axis direction. Therefore, the longitudinal direction of the side surfaces 14a, 14b extending in the X-axis direction is the X-axis direction, and the longitudinal direction of the side surfaces 14c, 14d extending in the Z'-axis direction is the Z'-axis direction. In the example shown in the drawings, among the side surfaces 14a, 14b, the side surfaces 14a are the side surfaces on the +Z'-axis side, and the side surfaces 14b are the side surfaces on the −Z'-axis side. Further, among the side surfaces 14c, 14d, the side surfaces 14c are the side surfaces on the −X-axis side, and the side surfaces 14d are the side surfaces on the +X-axis side.

The side surfaces 14a extending in the X-axis direction are formed so as to respectively project toward the +Y' axis side and the −Y' axis side with respect to the peripheral section 12 as shown in, for example, FIG. 1B. This applies also to the side surfaces 14b, 14c, and 14d. Each of the side surfaces 14a, 14b extending in the X-axis direction has a non-stepped shape included in a plane as shown in FIG. 1B. Specifically, the side surface 14a on the +Y'-axis side is in a plane, and the side surface 14a on the −Y'-axis side is in a plane. Similarly, the side surface 14b on the +Y'-axis side is in a plane, and the side surface 14b on the −Y'-axis side is in a plane.

It should be noted that in the description related to the present embodiment, the term "in a plane" includes the case in which the side surface of the excitation section 14 is a flat surface, and the case in which it has an unevenness corresponding to the crystal anisotropy of the quartz crystal. That is, when processing the AT-cut quartz crystal substrate using a solution including hydrofluoric acid as an etching liquid, there are two cases, namely the case in which the R-plane of the quartz crystal is exposed on the side surface of the excitation section 14 so as to be parallel to the X-Y' plane, and the case in which the m-plane of the quartz crystal is exposed thereon so as to have the unevenness corresponding to the crystal anisotropy of the quartz crystal. In the description related to the present embodiment, it is assumed that the side surface having the unevenness due to the m-plane of the quartz crystal described above is also included "in a plane."

For the sake of convenience, in FIGS. 1A and 2A, the unevenness due to the m-plane is omitted. It should be noted that it is also possible to expose only the R-plane of the quartz crystal by processing the AT-cut quartz crystal substrate using the laser.

Each of the side surfaces 14c, 14d extending in the Z'-axis direction has a step as shown in FIG. 2A. The excitation section 14 has a first part 15 located at the center and having the maximum thickness and second parts 16 having a thickness smaller than that of the first part 15, and the steps of the side surfaces 14c, 14d are formed by the difference in thickness between the first part 15 and the second parts 16. In the example shown in the drawings, each of the side surfaces 14c, 14d is composed of a surface parallel to the Y'-Z' plane of the first part 15, a surface parallel to the X-Z' plane of the second part 16, and a surface parallel to the Y'-Z' plane of the second part 16.

As shown in FIGS. 1A and 2A, for example, the second parts 16 are formed so as to sandwich the first part 15 on the both sides in the X-axis direction. Therefore, as shown in FIG. 1B, the side surfaces 14a, 14b extending in the X-axis direction are each formed of a side surface of the first part 15. As described above, the excitation section 14 has the two types of parts 15, 16 different in thickness from each other, and it can be said that the piezoelectric vibrating element 100A has a two-stage (a multistage) mesa structure.

The excitation section 14 can vibrate with the thickness-shear vibration as the principal vibration. Since the excitation section 14 has the two-stage mesa structure, the piezoelectric vibrating element 100A can exert the energy confinement effect.

Here, assuming that the dimension (the dimension of the short side) of the piezoelectric substrate 10 in the Z'-axis direction is "Z," the dimension of the short side of the excitation section 14 is "Mz," and the thickness (the thickness of the first part 15 of the excitation section 14) of the excitation section is "t," the relationship of the formula 1 below is preferably fulfilled.

$$8 \leq Z/t \leq 11, \text{ and } 0.6 \leq Mz/Z \leq 0.8 \quad (1)$$

Thus, the combination of the thickness-shear vibration and the unwanted mode such as a contour vibration can be suppressed, and the reduction of the CI value and the improvement in the frequency temperature characteristics can be achieved (the details will be described later). In general, the smaller the area of the piezoelectric substrate is, the more difficult it is to suppress such a combination of the thickness-shear vibration and the contour vibration. Therefore, for example, assuming that the dimension (the dimension of the long side) of the piezoelectric substrate 10 in the X-axis direction is X, by adopting the design fulfilling the relationship of the formula 1 described above in such a small piezoelectric vibrating element 100A as to fulfill the relationship of the formula 2 below, it is possible to more remarkably suppress the combination of the thickness-shear vibration and the contour vibration.

$$X/t \leq 17 \quad (2)$$

The excitation electrodes 20 are provided to the excitation section 14. In the example shown in FIGS. 1B and 2A, the excitation electrodes 20 are formed on the obverse and reverse surfaces of the excitation section 14. More specifically, the excitation electrodes 20 are respectively disposed in vibrating areas (the excitation section 14) of the both principal surfaces (the surfaces parallel to the X-Z' plane) of the piezoelectric substrate 10 so as to be opposed to each other on the obverse and reverse sides. A voltage can be applied to the excitation section 14 via the excitation electrodes 20. The excitation electrodes 20 are respectively connected to the pads 24 via, for example, the extraction electrodes 22. The pads 24 are electrically connected to, for example, an IC chip (not shown) for driving the piezoelectric vibrating element 100A. As a material of the excitation electrodes 20, the extraction electrodes 22, and the pads 24, a material having chromium and gold stacked in this order from the piezoelectric substrate 10 side, for example, can be used. The piezoelectric vibrating element 100A according to the present embodiment has the following features, for example. There is an advantage that the combination of the thickness-shear vibration and the unwanted mode such as a contour vibration in a direction perpendicular to the plane having the non-stepped shape can be suppressed to thereby reduce the CI value (the details will be described later). Further, by providing the projection sections 11 on the both principal surfaces in the area on the piezoelectric substrate where the vibratory displacement is sufficiently attenuated, there is an advantage that the possibility for the excitation electrodes provided to the excitation section to have contact with the inner surface of the package when installing the element to the package can be eliminated.

Further, by configuring the piezoelectric vibrating element using the quartz crystal as in the example of the embodiment shown in FIGS. 1A through 1C, there is an advantage that the piezoelectric vibrating element is superior in frequency temperature characteristics, and at the same time, the combination of the thickness-shear vibration and the contour vibration in the Z'-axis direction can be suppressed to thereby reduce the CI value. Further, by providing the projection sections 11 on the both principal surfaces in the area on the piezoelectric substrate where the vibratory displacement is sufficiently attenuated, there is an advantage that the possibility for the excitation electrodes provided to the excitation section to have contact with the inner surface of the package when installing the element to the package can be eliminated.

Since the projection sections 11 are disposed in the corner portions of the peripheral section 12 opposed to the pads 24 of the piezoelectric substrate 10 as in the example of the embodiment shown in FIGS. 1A through 1C, the vibratory displacement of the thickness-shear vibration as the principal vibration excited on the piezoelectric substrate 10 is sufficiently attenuated, and therefore, the operation thereof is not hindered, and no change is caused in the electrical characteristics. Moreover, since the possibility for the excitation electrodes provided to the excitation section to have contact with the inner surface of the package when installing the piezoelectric vibrating element 100A having the projection sections 11 to the package is eliminated, there is an advantage that the yield ratio in manufacturing the piezoelectric vibrator (the vibrator) can significantly be improved.

Further, according to the piezoelectric vibrating element 100A, by arranging that the dimension Z of the short side of the piezoelectric substrate 10, the dimension Mz of the short side of the excitation section 14, and the thickness t of the excitation section 14 fulfill the relationship of the formula 1 as described above, the reduction of the CI value can be achieved.

According to the piezoelectric vibrating element 100A, by arranging that the X length-to-thickness ratio (X/t) fulfills the relationship of the formula 2 as described above, the reduction of the CI value can be achieved while achieving downsizing.

2. Method of Manufacturing Piezoelectric Vibrating Element

Then, a method of manufacturing the piezoelectric vibrating element according to the present embodiment will be explained with reference to the accompanying drawings. FIGS. 5A through 5C, 6A through 6C, 7A through 7C, 8A through 8C, 9A through 9D, 10A through 10D, and 11A through 11D are diagrams schematically showing the manufacturing process of the piezoelectric vibrating element (the vibrating element) 100A according to the present embodiment. It should be noted that in FIGS. 5A through 5C, 6A through 6C, 7A through 7C, 8A through 8C, 9A through 9D, 10A through 10D, and 11A through 11D, FIGS. 5A, 6A, 7A, 8A, 9A, 10A, and 11A are plan views, FIGS. 5B, 6B, 7B, 8B, 9B, 10B, and 11B are P3-P3 cross-sectional views of FIGS. 5A, 6A, 7A, 8A, 9A, 10A, and 11A, and FIGS. 5C, 6C, 7C, 8C, 9C, 10C, and 11C are Q3-Q3 cross-sectional views of FIGS. 5A, 6A, 7A, 8A, 9A, 10A, and 11A, respectively. Further, in FIGS. 9A through 9D, 10A through 10D, and 11A through 11D, FIGS. 9D, 10D, and 11D are Q4-Q4 cross-sectional views or Q4'-Q4' cross-sectional views.

Figure 5A:
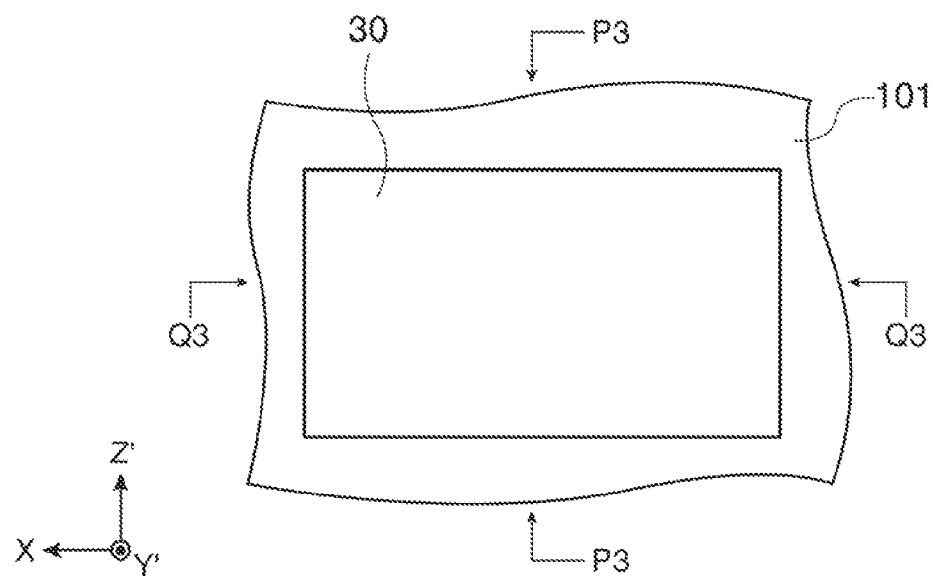
FIGS. 5A through 5C are a plan view and cross-sectional views schematically showing a method of manufacturing the piezoelectric vibrating element according to the present embodiment.
Figure 5B:
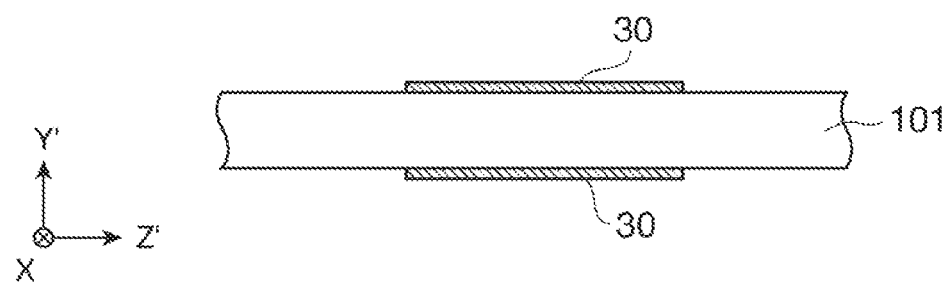
Figure 5C:
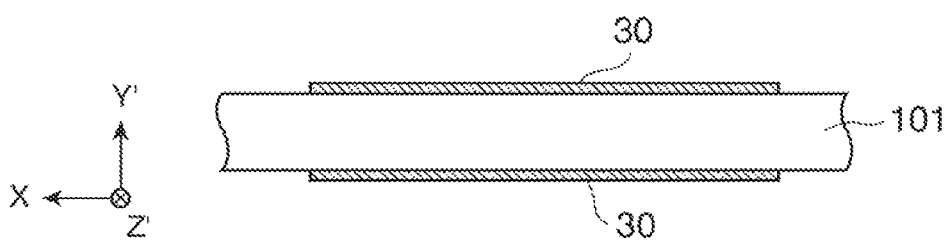

As shown in FIGS. 5A through 5C, corrosion-resistant films 30 are formed respectively on the obverse and reverse principal surfaces (the surfaces parallel to the X-Z' plane) of the AT-cut quartz crystal substrate 101. The corrosion-resistant films 30 are formed by stacking chromium and gold in this order using, for example, a sputtering method or a vacuum evaporation method, and then patterning chromium and gold thus stacked. The patterning is performed using, for example, a photolithography process and an etching process. The corrosion-resistant films have corrosion resistance to the solution including hydrofluoric acid to be the etching liquid when processing the AT-cut quartz crystal substrate 101.

Figure 6A:
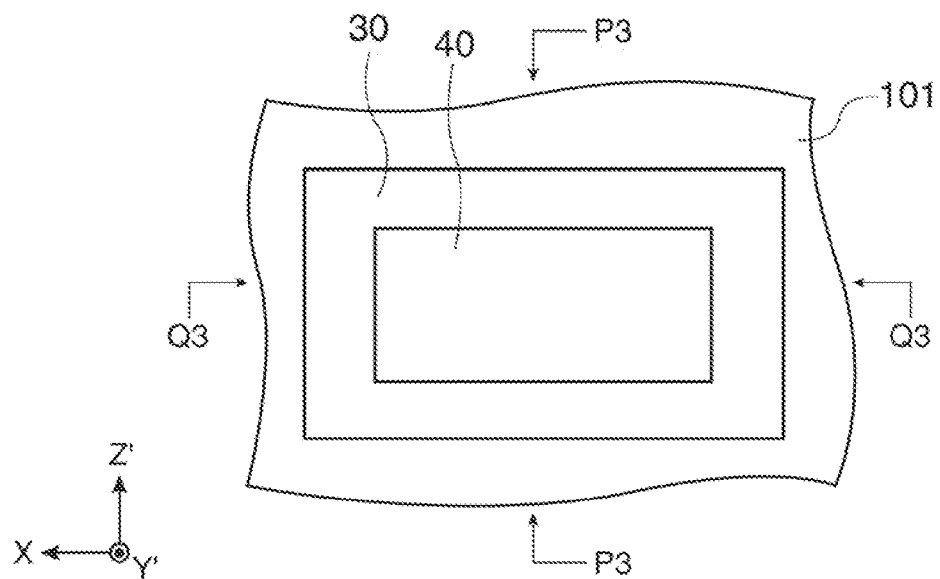
FIGS. 6A through 6C are a plan view and cross-sectional views schematically showing the method of manufacturing the piezoelectric vibrating element according to the present embodiment.
Figure 6B:
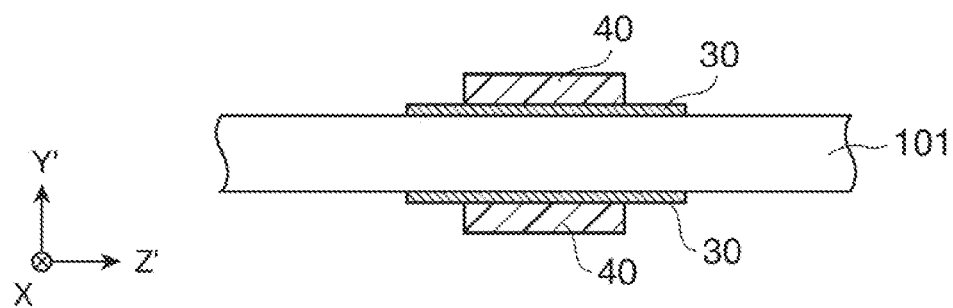
Figure 6C:
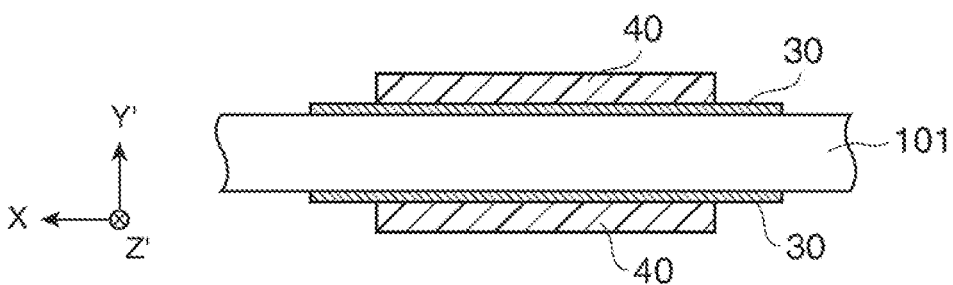

As shown in FIGS. 6A through 6C, after applying positive photoresist films respectively to the surfaces of the corrosion-resistant films 30, the photoresist films are exposed and then developed to thereby form resist films 40 having predetermined shapes. The resist films 40 are each formed to partially cover the corresponding corrosion-resistant film 30.

Figure 7A:
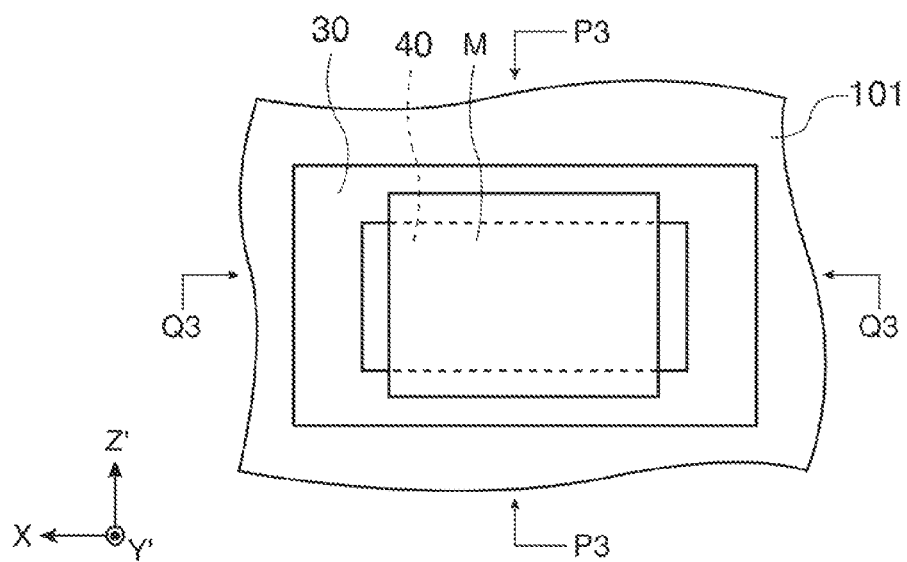
FIGS. 7A through 7C are a plan view and cross-sectional views schematically showing the method of manufacturing the piezoelectric vibrating element according to the present embodiment.
Figure 7B:
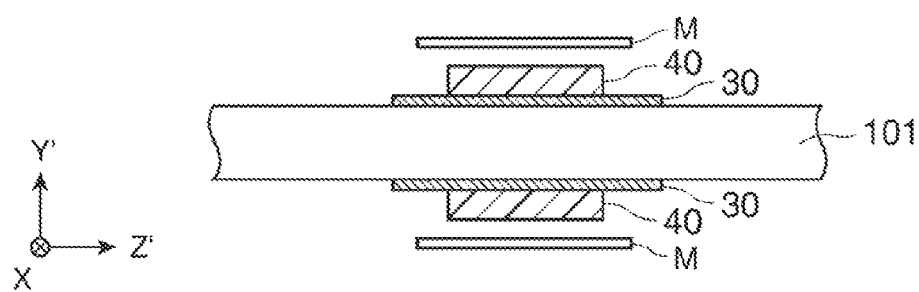
Figure 7C:
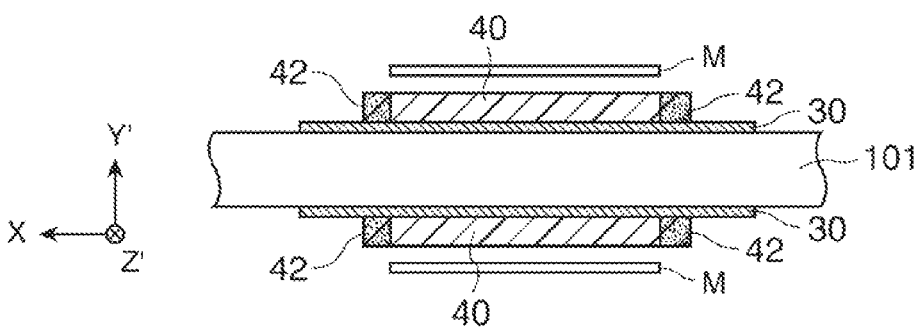

Subsequently, as shown in FIGS. 7A through 7C, the resist films 40 are partially exposed again using masks M to thereby form exposed sections 42. The masks M are disposed so as to intersect respectively with the resist films 40 viewed from the Y'-axis direction as shown in FIG. 7A. In other words, the dimension of the masks M in the X-axis direction is smaller than the dimension of the resist films 40 in the X-axis direction, and the dimension of the masks M in the Z'-axis direction is larger than the dimension of the resist films 40 in the Z'-axis direction. By performing the exposure using such masks M, the exposed sections 42 can be formed on both sides of each of the resist films 40 viewed from the Z'-axis direction as shown in FIG. 7C.

Figure 8A:
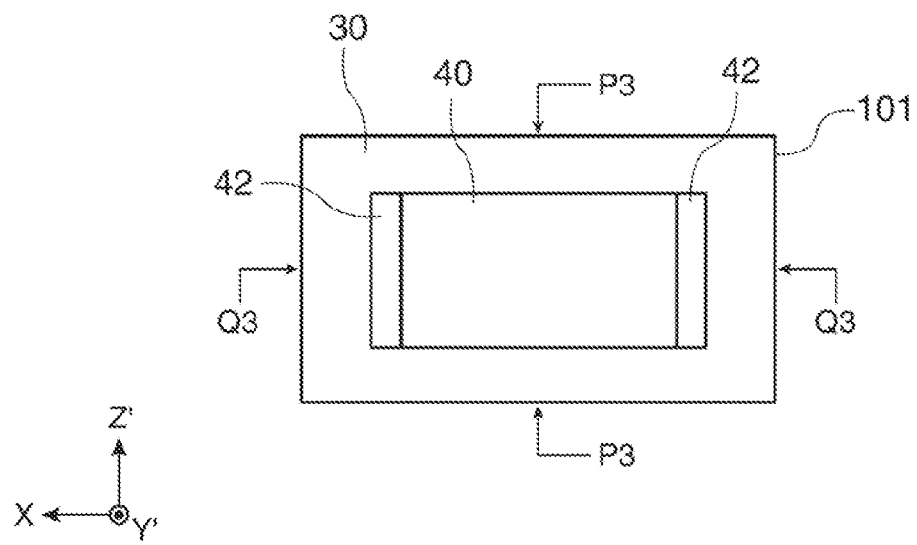
FIGS. 8A through 8C are a plan view and cross-sectional views schematically showing the method of manufacturing the piezoelectric vibrating element according to the present embodiment.
Figure 8B:
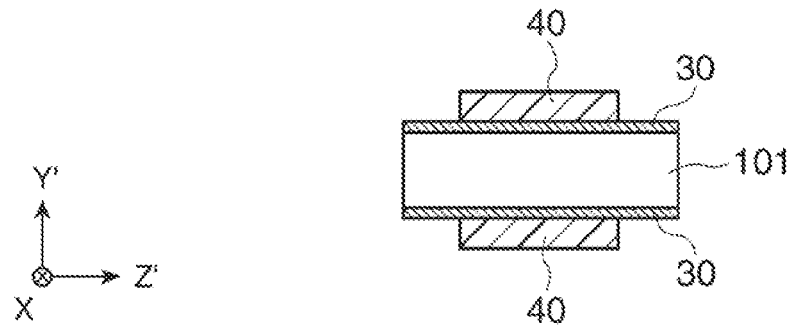
Figure 8C:
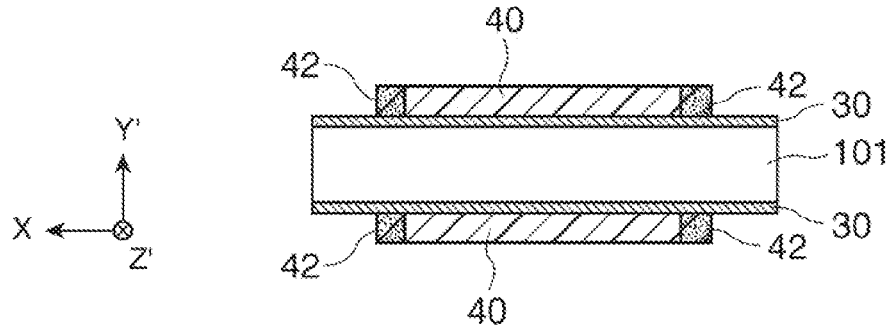
Figure 9A:
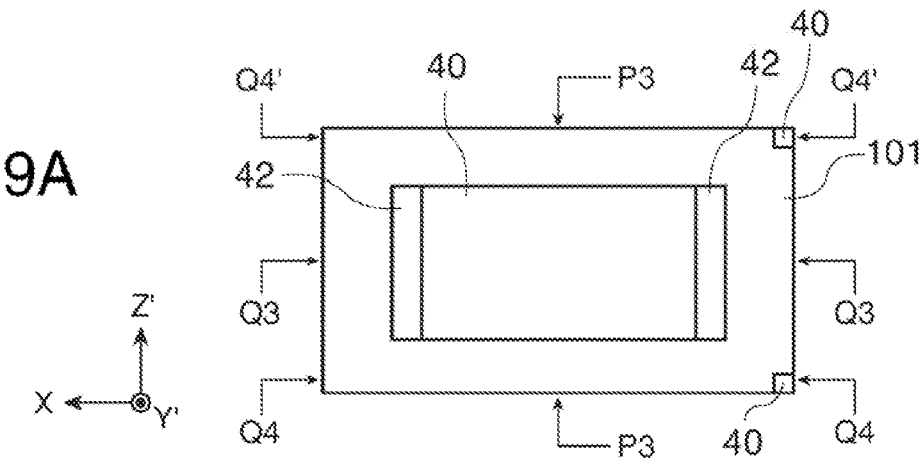
FIGS. 9A through 9D are a plan view and cross-sectional views schematically showing the method of manufacturing the piezoelectric vibrating element according to the present embodiment.
Figure 9B:
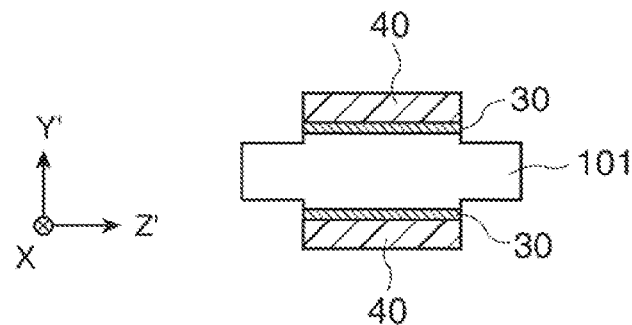
Figure 9C:
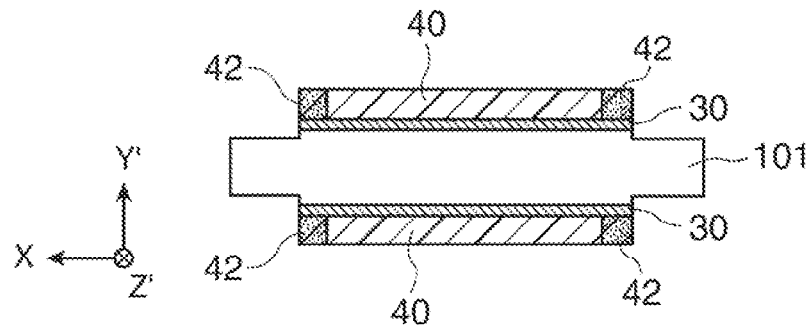
Figure 9D:
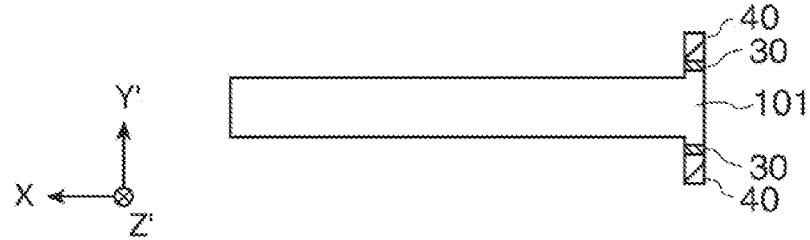
Figure 10A:
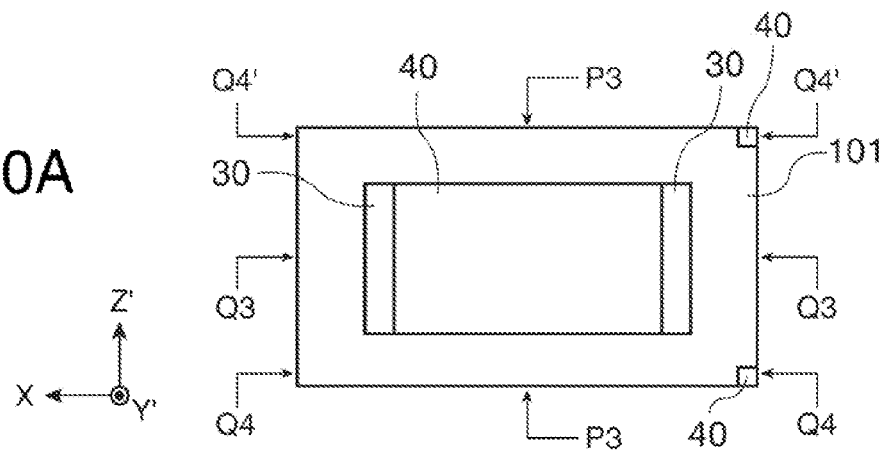
FIGS. 10A through 10D are a plan view and cross-sectional views schematically showing the method of manufacturing the piezoelectric vibrating element according to the present embodiment.
Figure 10B:
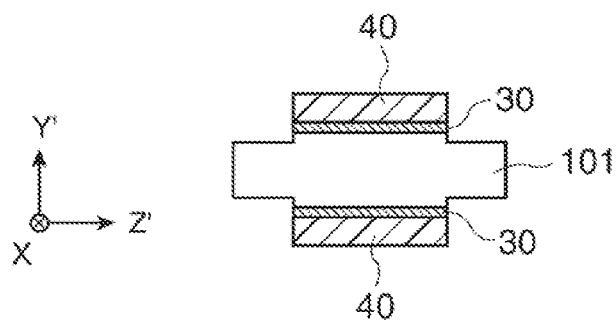
Figure 10C:
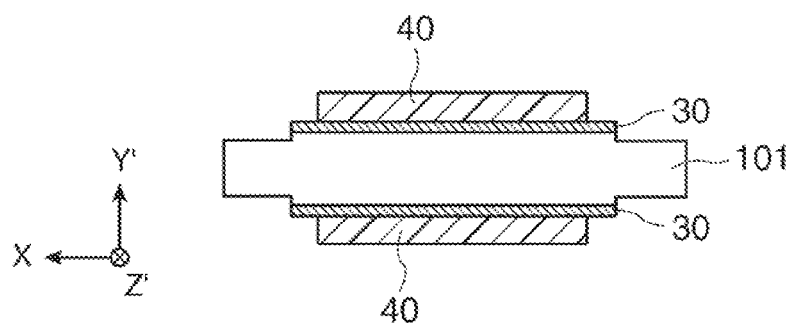
Figure 10D:
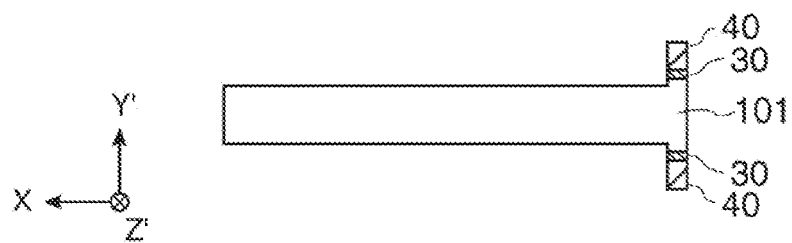
Figure 11A:
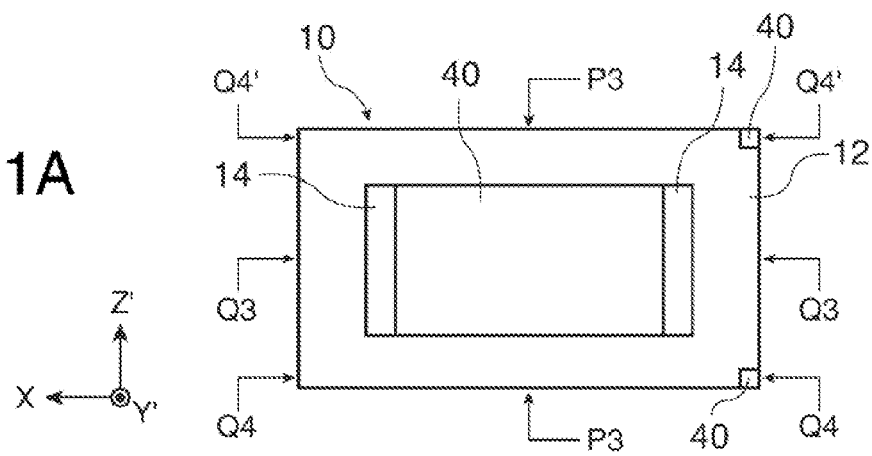
FIGS. 11A through 11D are a plan view and cross-sectional views schematically showing the method of manufacturing the piezoelectric vibrating element according to the present embodiment.
Figure 11B:
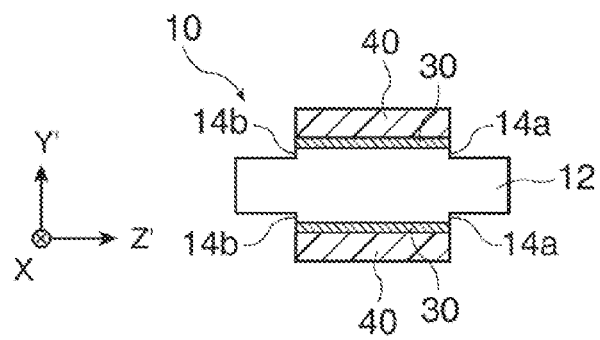
Figure 11C:
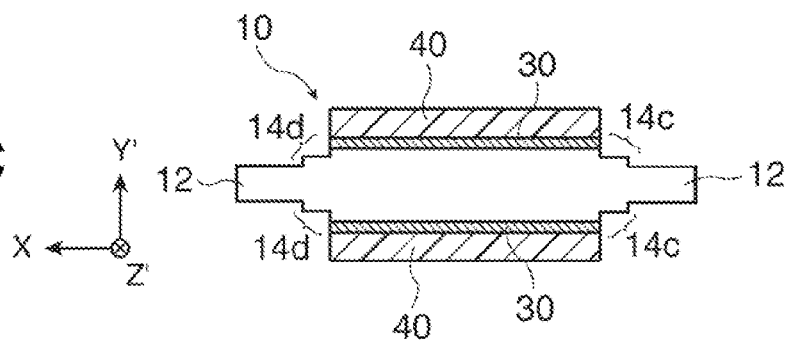
Figure 11D:
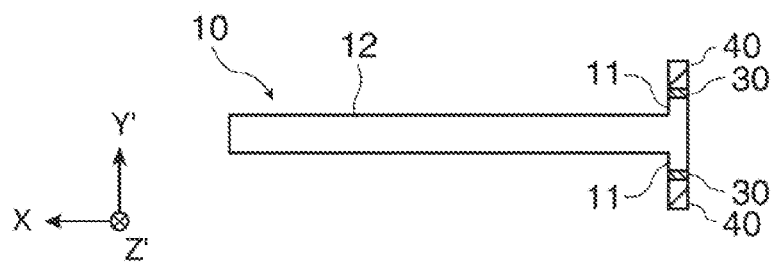

Subsequently, as shown in FIGS. 8A through 8C, an etching process is performed on the AT-cut quartz crystal substrate 101 using the corrosion-resistant films 30 as masks. The etching process is performed using, for example, the compound liquid of hydrofluoric acid and ammonium fluoride as an etching liquid. Thus, the outer shape (the shape thereof viewed from the Y'-axis direction) of the piezoelectric substrate 10 is formed as shown in FIG. 8A.

Subsequently, as shown in FIGS. 9A through 9D, after etching the corrosion-resistant films 30 with a predetermined etching liquid using the resist films 40 as masks, the AT-cut quartz crystal substrate 101 is further half-etched to a predetermined depth using the compound liquid described above as an etching liquid. Thus, the outer shape of the excitation section 14 and the outer shape of the projection sections 11 are formed.

Subsequently, as shown in FIGS. 10A through 10D, the exposed sections 42 of the resist films 40 are developed and then removed. Thus, the corrosion-resistant films 30 are partially exposed. It should be noted that prior to developing the exposed sections 42, asking is performed on altered layers (not shown) formed on the surfaces of the resist films 40 with, for example, oxygen plasma made by discharge in a vacuum or reduced-pressure atmosphere. Thus, the exposed sections 42 can surely be developed and then removed.

Subsequently, as shown in FIGS. 11A through 11D, after removing the exposed portions of the corrosion-resistant films 30 by etching with the predetermined etching liquid using the resist films 40 as masks, the AT-cut quartz crystal substrate 101 is further half-etched to a predetermined depth using the compound liquid described above as an etching liquid. Thus, each of the side surfaces 14a, 14b extending in the X-axis direction can be formed in a single plane. Further, it is possible to provide a step to each of the side surfaces 14c, 14d extending in the Z'-axis direction. Further, it is possible to form the projection sections 11 perpendicular to the peripheral section 12 respectively in the corner portions on the obverse and reverse sides of the peripheral section 12 of the piezoelectric substrate 10.

According to the process described above, the piezoelectric substrate 10 having the peripheral section 12, the excitation section 14, and the projection sections 11 can be formed. As shown in FIGS. 1A through 1C, 2A, and 2B, after removing the resist films 40 and the corrosion-resistant films 30, the excitation electrodes 20, the extraction electrodes 22, and the pads 24 are provided to the piezoelectric substrate 10. The excitation electrodes 20, the extraction electrodes 22, and the pads 24 are formed by stacking chromium and gold in this order using, for example, a sputtering method or a vacuum evaporation method, and then patterning chromium and gold thus stacked.

The piezoelectric vibrating element 100A according to the present embodiment can be manufactured by the process described hereinabove.

According to the method of manufacturing the piezoelectric vibrating element 100A, after developing the resist films 40 used for forming the outer shape of the excitation section 14 and removing the exposed sections, the side surfaces 14a, 14b extending in the X-axis direction can be exposed using the resist films 40 again. Here, the masks M for forming the exposed sections 42 have the size in the X-axis direction smaller than the size of the resist films 40, and have the size in the Z'-axis direction larger than the size of the resist films 40. Therefore, each of the side surfaces 14a, 14b can be formed in a single plane with accuracy. In the case of, for example, applying the resist film two times for forming the excitation section 14 (in the case of, for example, forming the outer shape of the excitation section using a first resist film, then exfoliating the first resist film, and then applying a second resist film to thereby expose the side surfaces of the excitation section), a displacement in positioning is caused between the first resist film and the second resist film, and the side surface of the excitation section fails to be formed in a single plane in some cases. According to the method of manufacturing the piezoelectric vibrating element 100A, such a problem can be solved.

Further, according to the method of manufacturing the piezoelectric vibrating element 100A, the projection sections 11 perpendicular to the obverse and reverse sides of the peripheral section 12 can be formed respectively in the corner portions of the peripheral section 12 opposed to the two pads 24 in the corner portions of the piezoelectric substrate 10.

3. Modified Examples of Piezoelectric Vibrating Element

Figure 12A:
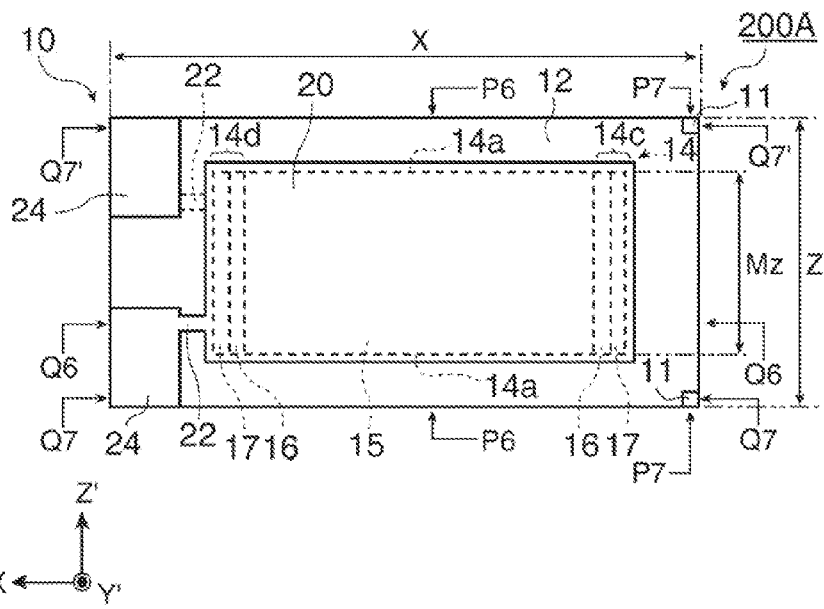
Figure 12B:
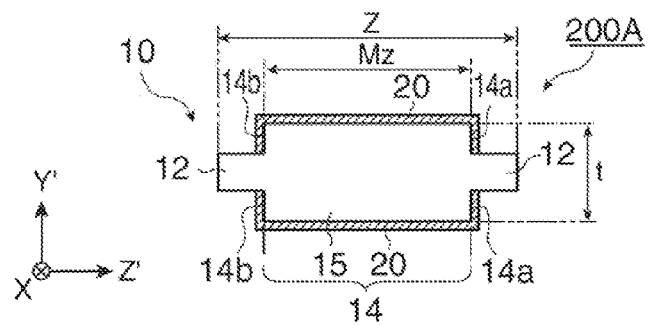
Figure 12C:
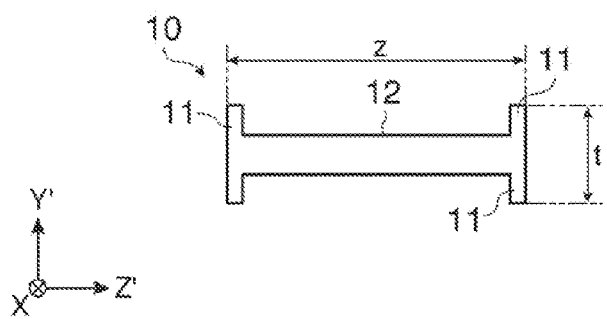
Figure 13A:
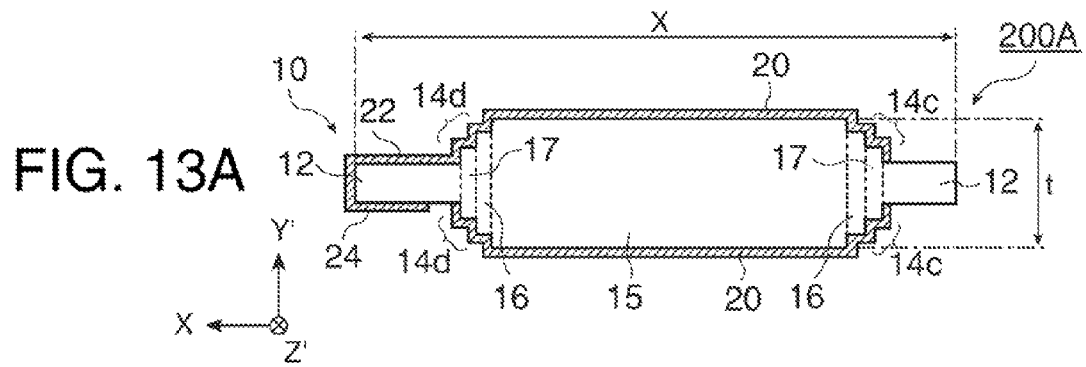
FIG. 13A is a Q6-Q6 cross-sectional view of FIG. 12A.
Figure 13B:
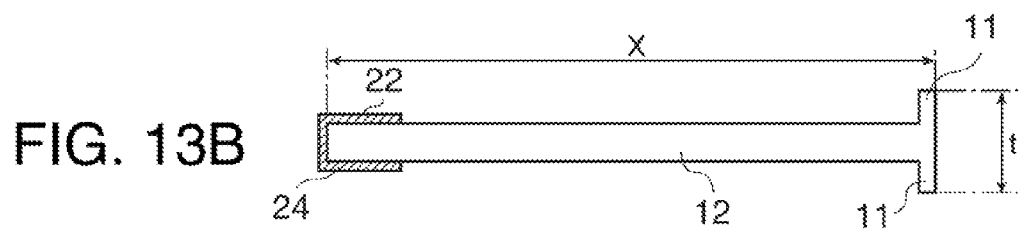
FIG. 13B is a Q7-Q7 cross-sectional view of FIG. 12A.

Then, piezoelectric vibrating elements (vibrating elements) according to modified examples of the present embodiment will be explained with reference to the accompanying drawings. FIG. 12A is a plan view schematically showing the piezoelectric vibrating element 200A according to the modified example of the present embodiment. FIG. 12B is a P6-P6 cross-sectional view of FIG. 12A, and FIG. 12C is a P7-P7 cross-sectional view of FIG. 12A. FIG. 13A is a Q6-Q6 cross-sectional view of FIG. 12A, and FIG. 13B is a Q7-Q7 cross-sectional view of FIG. 12A or a Q7'-Q7' cross-sectional view thereof. Hereinafter, in the piezoelectric vibrating element 200A according to the modified example of the present embodiment, the members having similar structures or functions to those of the constituents of the piezoelectric vibrating element 100A according to the present embodiment will be denoted by the same reference symbols, and the detailed explanation thereof will be omitted. In the example of the piezoelectric vibrating element 100A, as shown in FIGS. 1A through 1C, 2A, and 2B, the two-stage mesa structure having the first part 15 and the second parts 16 different in thickness from each other is explained.

In contrast thereto, the piezoelectric vibrating element 200A has a three-stage mesa structure as shown in FIGS. 12A through 12C, 13A, and 13B. Specifically, the excitation section 14 of the piezoelectric vibrating element 200A has third parts 17 with a thickness smaller than that of the second parts 16 in addition to the first part 15 and the second parts 16. In the example shown in FIGS. 12A through 12C, 13A, and 13B, the third parts 17 are formed so as to sandwich the first part 15 and the second parts 16 from the X-axis direction.

As shown in FIG. 13A, the steps of each of the side surfaces 14c, 14d extending in the Z'-axis direction are formed of the differences in thickness between the first part 15, the second part 16, and the third part 17. In the example shown in the drawings, each of the side surfaces 14c, 14d is composed of a surface parallel to the Y'-Z' plane of the first part 15, a surface parallel to the X-Z' plane of the second part 16, a surface parallel to the Y'-Z' plane of the second part 16, a surface parallel to the X-Z' plane of the third part 17, and a surface parallel to the Y'-Z' plane of the third part 17. Further, the excitation section 14 composed of the first part 15, the second parts 16, and the third parts 17 is provided with the peripheral section 12 with a thickness smaller than that of the third parts 17, formed along the periphery of the third parts 17. The excitation electrodes 20 provided to the excitation section 14 opposed to each other on the obverse and reverse sides, the extraction electrodes 22 from the respective excitation electrodes 20, and the two pads 24 as the terminals of the respective extraction electrodes 22 are also formed similarly to the piezoelectric vibrating element 100A. The projection sections 11 are formed respectively on the obverse and reverse surfaces so as to be perpendicular to the peripheral section 12 in the corner areas of the peripheral section 12 so as to be opposed to the two pads 24 disposed in the corner portions of the piezoelectric substrate 10.

The piezoelectric vibrating element 200A can be manufactured by applying the method of manufacturing the piezoelectric vibrating element 100A. Specifically, as shown in FIGS. 10A through 10D, after developing and then removing the exposed sections 42, the resist films 40 are exposed again to thereby form second exposed sections (not shown) with predetermined shapes. Subsequently, the corrosion-resistant films 30 and the AT-cut quartz crystal substrate 101 are etched using the resist films 40 having the second exposed sections as masks. Subsequently, asking is performed to remove the altered layers of the resist films 40, and then the second exposed sections are developed and then removed. Subsequently, the corrosion-resistant films 30 and the AT-cut quartz crystal substrate 101 are etched using the resist films 40, from which the second exposed sections are removed, as masks. According to the process described hereinabove, it is possible to form the three-stage mesa structure and the projection sections 11 perpendicular to the peripheral section 12 respectively on the obverse and reverse sides of the corner portions of the peripheral section 12 of the piezoelectric substrate 10. By providing the excitation electrodes 20 opposed to the excitation section having the three-stage mesa structure, the extraction electrodes 22 from the respective excitation electrodes 20, and the two pads 24 as the terminals of the extraction electrodes 22 to the piezoelectric substrate 10, the piezoelectric vibrating element 200A can be manufactured. According to the piezoelectric vibrating element 200A, the energy confinement effect can further be enhanced compared to the piezoelectric vibrating element 100A having the two-stage mesa structure. Further, according to the piezoelectric vibrating element 200A, since the projection sections 11 perpendicular to the obverse and reverse sides of the peripheral section 12 are formed respectively in the corner portions of the peripheral section 12 opposed to the two pads 24 in the corner portions of the piezoelectric substrate 10, the yield ratio can significantly be improved when installing the element in the package.

It should be noted that although in the example described above the piezoelectric vibrating element 200A having the three-stage mesa structure is explained, the number of stages (the number of steps) of the mesa structure of the invention is not particularly limited providing each of the side surfaces extending in the X-axis direction is in a single plane in the multistage mesa structure.

Figure 14A:
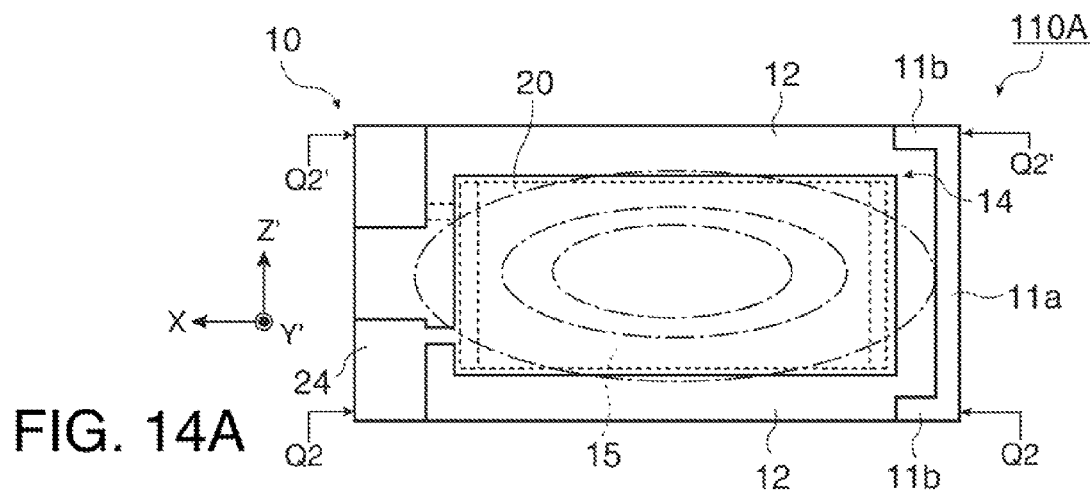
Figure 14B:
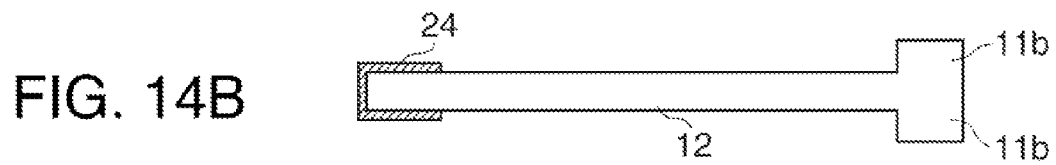

FIG. 14A is a plan view of a piezoelectric vibrating element 110A according to another modified example (although it is shown based on the piezoelectric vibrating element 100A, it is also possible to use the piezoelectric vibrating element 200A as the base), FIG. 14B is a Q2-Q2 cross-sectional view or a Q2'-Q2' cross-sectional view of FIG. 14A. The piezoelectric vibrating element 110A is provided with the piezoelectric substrate 10 having the excitation section 14 with a mesa structure formed in the central portion, and the thin-wall flange like peripheral section 12 formed in the periphery of the excitation section 14, the excitation electrodes 20 formed on the obverse and reverse sides of the excitation section 14 so as to be opposed to each other, the extraction electrodes 22 extending from the respective excitation electrodes 20 toward the end portion of the piezoelectric substrate 10, and the pads 24 as the terminals of the extraction electrodes 22. Further, the projection sections 11 each having a bracket shape are formed on the obverse and reverse sides, the projection section 11 having a first projection part 11a disposed along an edge along the Z' axis (the short side) on the peripheral section 12, opposed to the two pads 24 disposed in the corner portions of the piezoelectric substrate 10, and second projection parts 11b contiguously disposed respectively from the both longitudinal end portions of the first projection part 11a in a direction along the X axis in a folded manner. The total thickness of the thickness of the peripheral section 12 and the thickness of the projection sections 11 on the obverse and reverse sides can be made equal to the thickness of the excitation section 14 in the center thereof.

Figure 15A:
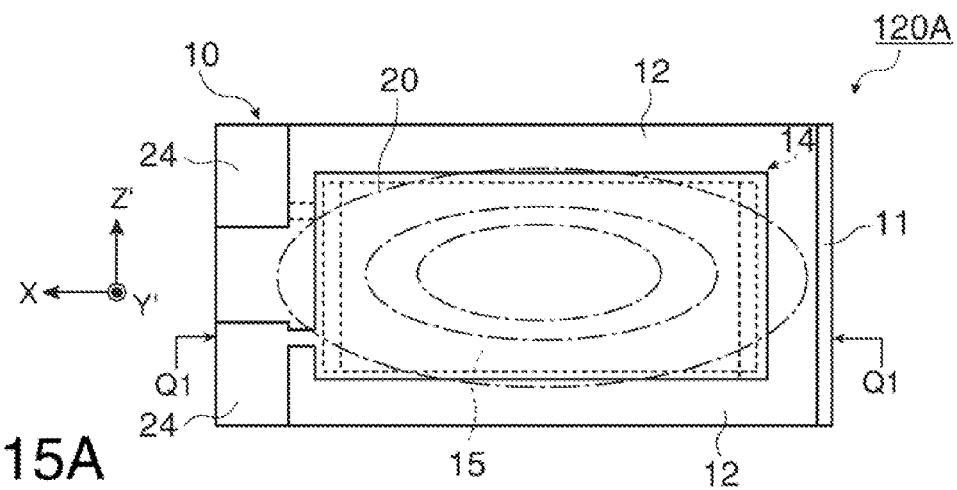
Figure 15B:
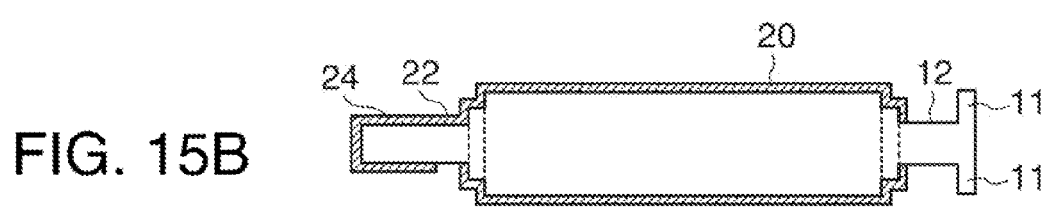

FIG. 15A is a plan view of the piezoelectric vibrating element 120A according to another modified example, and FIG. 15B is a Q1-Q1 cross-sectional view of FIG. 15A. The excitation section 14, the excitation electrodes 20, the extraction electrodes 22, and the pads 24 of the piezoelectric substrate 10 are substantially the same as those of the piezoelectric vibrating element 100A shown in FIGS. 1A through 1C, 2A, and 2B, and therefore, the explanation therefor will be omitted. The projection sections 11 each having a thin strip shape are formed along only the edge along the Z' axis (the short side) respectively on the obverse and reverse sides of the peripheral section 12 opposed to the two pads 24 disposed in the corner portions of the piezoelectric substrate 10.

Figure 16A:
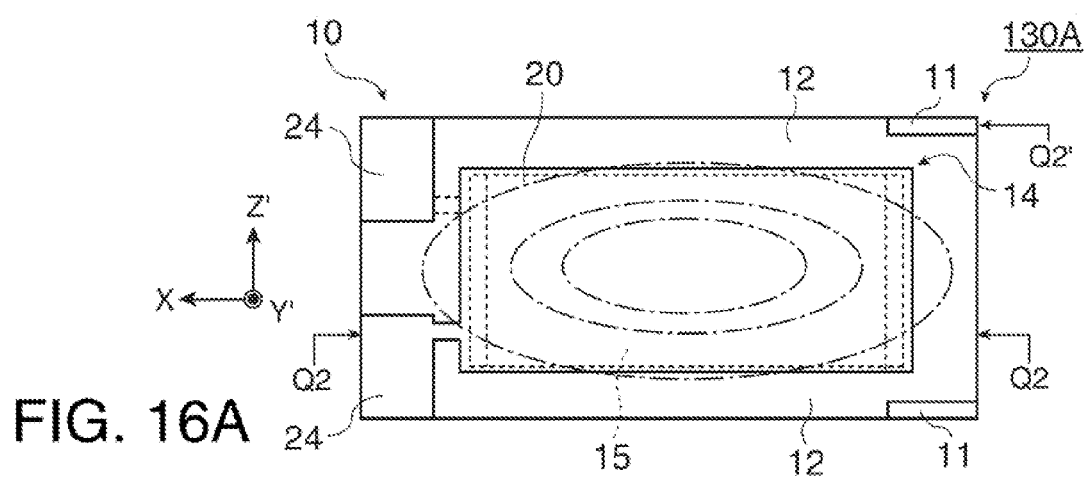
Figure 16B:
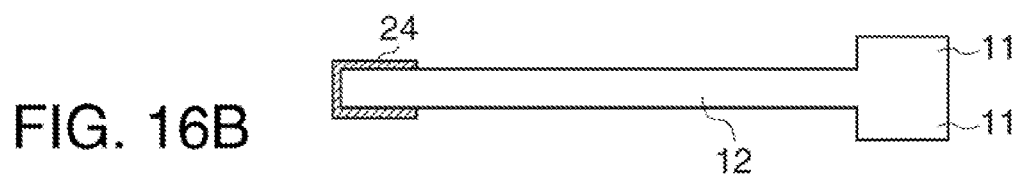

FIG. 16A is a plan view of the piezoelectric vibrating element 130A according to another modified example, and FIG. 16B is a Q2-Q2 cross-sectional view or a Q2'-Q2' cross-sectional view of FIG. 16A. The excitation section 14, the excitation electrodes 20, the extraction electrodes 22, and the pads 24 of the piezoelectric substrate 10 are substantially the same as those of the piezoelectric vibrating element 100A shown in FIGS. 1A through 1C, 2A, and 2B, and therefore, the explanation therefor will be omitted. The projection sections 11 each having a short thin strip shape formed along the respective long sides (in the X-axis direction) of the piezoelectric substrate 10 in the corner portions of the peripheral section 12 opposed to the two pads 24 disposed in the corner portions of the piezoelectric substrate 10, and on the obverse and reverse sides perpendicularly to the peripheral section 12. As shown in the example of the embodiment shown in FIGS. 14A and 14B, by forming the projection sections 11 (11a, 11b) having the bracket shape in the end portion of the piezoelectric substrate 10, there can be obtained an advantage that even if the piezoelectric vibrating element is fixed by bonding to the package after being rotated in the X-axis direction, there is no possibility that the excitation electrodes have contact with the inner surface of the package, and the yield ratio is significantly improved when manufacturing the piezoelectric vibrator.

As shown in the example of the embodiment shown in FIGS. 15A and 15B, by forming the projection sections 11 along the edge along the Z' axis on the piezoelectric substrate throughout the entire length thereof, since the function thereof, namely the function of eliminating the possibility for the excitation electrodes to have contact with the inner surface of the package when installing the element in the package, is never damaged even if some deformation is caused in the projection sections due to the etching process and so on, there is an advantage that the yield ratio can significantly be improved when manufacturing the piezoelectric vibrating element.

Further, as shown in the examples of the embodiment shown in FIGS. 1A through 1C, 2A, 2B, 12A through 12C, 13A, 13B, 14A, 14B, 15A, 15B, 16A, and 16B, by making the total thickness of the thicknesses of the respective projection sections 11 on the obverse and reverse sides and the thickness of the peripheral section 12 equal to the thickness of the excitation section 14, there is an advantage that the manufacture of the piezoelectric substrate is easy, there is no possibility for the excitation electrodes to have contact with the inner surface of the package, and the yield ratio can significantly be improved when manufacturing the piezoelectric vibrator.

4. Piezoelectric Vibrator (Vibrator)

Figure 17A:
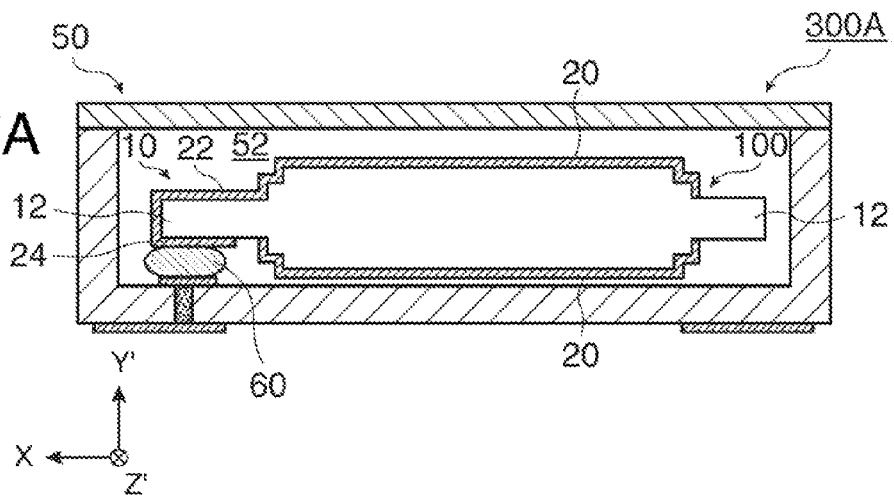
Figure 17B:
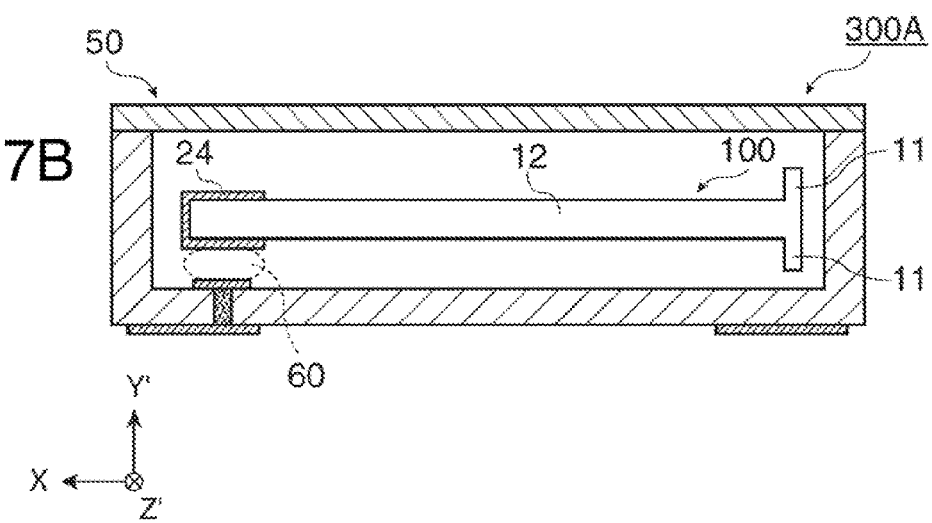

Then, a piezoelectric vibrator according to the present embodiment will be explained with reference to the accompanying drawings. FIGS. 17A and 17B are cross-sectional views schematically showing the piezoelectric vibrator 300A according to the present embodiment.

FIG. 17A is a cross-sectional view in the longitudinal direction (the X-axis direction) showing the configuration of the piezoelectric vibrator 300A, which is the cross-sectional view in substantially the same position as the cross-sectional view of the piezoelectric vibrating element 100A shown in FIG. 2A.

FIG. 17B is a cross-sectional view in the longitudinal direction (the X-axis direction) at the end portion in the short-side direction (the Z'-axis direction) of the piezoelectric vibrator 300A. As shown in FIG. 17A, the piezoelectric vibrator 300A includes the piezoelectric vibrating element (the piezoelectric vibrating element 100A in the example shown in the drawing), and a package 50.

The package 50 is capable of housing the piezoelectric vibrating element 100A in a cavity 52. As the material of the package 50, there can be cited, for example, ceramics and glass. The cavity 52 forms a space for the piezoelectric vibrating element 100A to operate. The cavity 52 is sealed, and is set to be a reduced-pressure space or an inert gas atmosphere. The piezoelectric vibrating element 100A is housed in the cavity 52 of the package 50. In the example shown in the drawing, the piezoelectric vibrating element 100A is fixed to the inside of the cavity 52 via an electrically-conductive adhesive 60 in a cantilevered manner. As the electrically-conductive adhesive 60, a solder or a silver paste, for example, can be used.

Figure 17C:
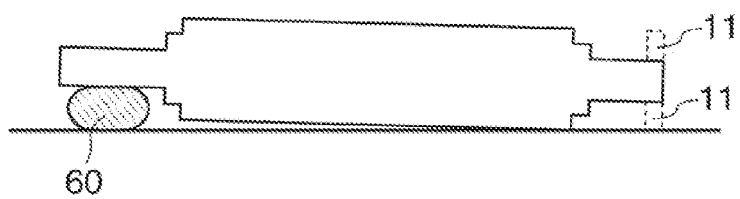
Figure 17D:
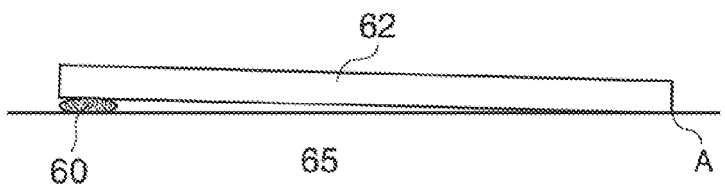

Although in the drawings shown in FIGS. 17A and 17B, there is shown an example in which both of the principal surfaces of the piezoelectric vibrating element 100A are configured to be parallel to the inner bottom surface (or the lid member) of the package 50, there is a case in which the both principal surfaces are tilted toward the inner bottom surface of the package 50 as in the cross-sectional view shown in FIG. 17C, or warped toward the lid member by contraries depending on the application amount or the viscosity of the electrically-conductive adhesive 60. However, in the case of the piezoelectric vibrating element (the piezoelectric vibrating element 100A in the example shown in the drawing) according to the present embodiment, since the projection sections 11 are formed on the obverse and reverse sides in the corner portions of the peripheral section 12 opposed to the pads 24 provided to the corner portions of the piezoelectric substrate 10, there is no chance for the excitation electrodes 20 provided to the excitation section 14 to have contact with either of the inner bottom surface and the lid member even in the case in which the piezoelectric vibrating element 100A is tilted toward the inner bottom surface of the package 50 or warped toward the lid member by contraries. This can easily be understood also from the fact that, as shown in FIG. 17D, in the case in which one side (the left side in the drawing) of a substrate 62 having a constant thickness is fixed to a base 65 with an adhesive 60, even if the substrate 62 is tilted downward, although a lower tip A on the other side (the right side in the drawing) of the substrate 62 has contact with an upper surface of the base 65, the other portion of the substrate 62 does not have contact with the upper surface of the base 65.

It should be noted that although not shown in the drawings an IC chip for oscillating the piezoelectric vibrating element 100A can be housed in the package 50. The IC chip is electrically connected to the pads 24 via the electrically-conductive adhesive 60.

As shown in the embodiment in FIGS. 17A and 17B, according to the piezoelectric vibrator 300A, since the piezoelectric vibrating element 100A according to the present embodiment is provided, the reduction in the CI value can be achieved.

Further, according to the piezoelectric vibrator 300A, since the projection sections 11 are disposed in the corner portions opposed to the pads 24 of the piezoelectric vibrating element 100A, or along the edge opposed thereto, and therefore, the excitation electrodes 20 do not have contact with the package bottom or the lid member when housing the piezoelectric vibrating element 10 in the package 50, there is an advantage that the yield ratio of the piezoelectric vibrator 300A is significantly improved.

5. Experimental Example

Hereinafter, an experimental example will be shown, and the present embodiment will more specifically be explained. It should be noted that the scope of the invention is not at all limited by the following experimental example.

5.1 Configuration of Piezoelectric Vibrating Element

As a specific example, the piezoelectric vibrating element 100A having the two-stage mesa structure shown in FIGS. 1A through 1C, 2A, and 2B is used. In the specific example, the AT-cut quartz crystal substrate is processed by a wet-etching process using a solution including hydrofluoric acid to thereby form the piezoelectric substrate 10 having the peripheral section 12 and the excitation section 14. The piezoelectric substrate 10 is formed to be symmetrical about a point (not shown) to be the center of symmetry. The thickness t of the excitation section 14 (the first part 15) is set to 0.065 mm, and the vibrational frequency is set to 24 MHz. Further, the dimension X of the long side of the piezoelectric substrate 10 is set to 1.1 mm (i.e., the X length-to-thickness ratio X/t is set to 17), the dimension Z of the short side of the piezoelectric substrate 10 is set to 0.629 mm (i.e., the Z length-to-thickness ratio Z/t is set to 9.7), the dimension Mz of the short side of the excitation section 14 is set to 0.43 mm, and each of the side surfaces 14a, 14b extending in the X-axis direction is formed in a single plane.

Figure 18A:
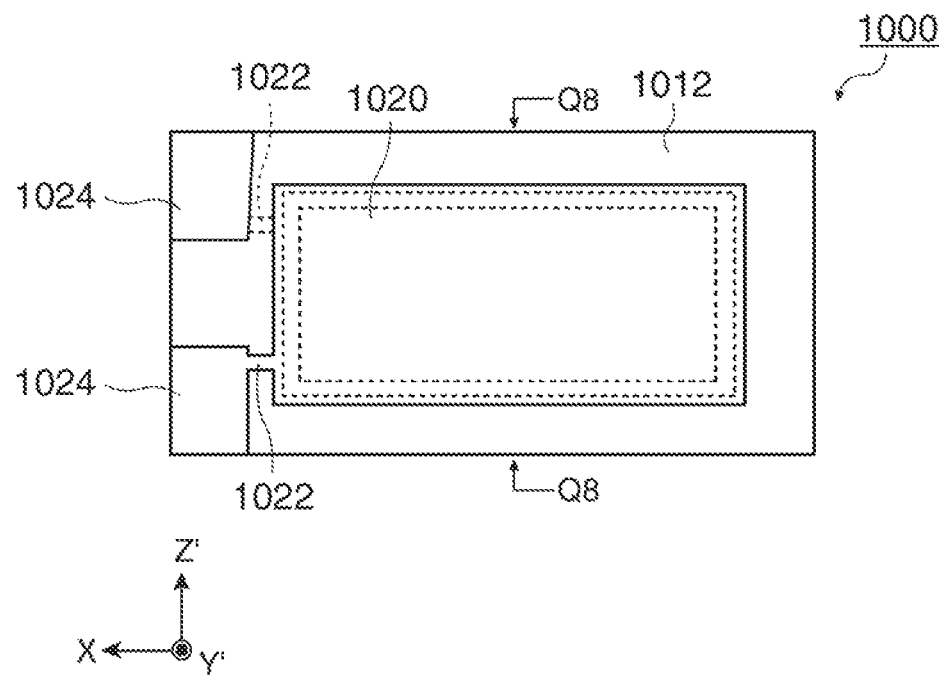
FIGS. 18A and 18B are a plan view and a cross-sectional view schematically showing a piezoelectric vibrating element of a comparative example.
Figure 18B:
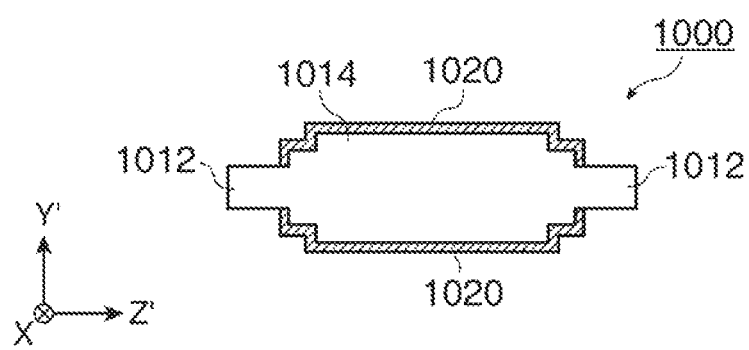

As a comparative example, a piezoelectric vibrating element 1000 shown in FIGS. 18A and 18B is used. FIG. 18A is a plan view, and FIG. 18B is a Q8-Q8 cross-sectional view of FIG. 18A. In the comparative example, the excitation section 1014 is formed to have substantially the same shape as that of the excitation section 14 of the specific example except that each of the side surfaces extending in the X-axis direction has a step as shown in FIG. 18B. It should be noted that a peripheral section 1012, excitation electrodes 1020, extraction electrodes 1022, and pads 1024 shown in FIG. 18 correspond respectively to the peripheral section 12, the excitation electrodes 20, the extraction electrodes 22, and the pads 24 shown in FIGS. 1A through 1C, 2A, and 2B.

5.2 Measurement Result of CI Value Distribution

Figure 19A:
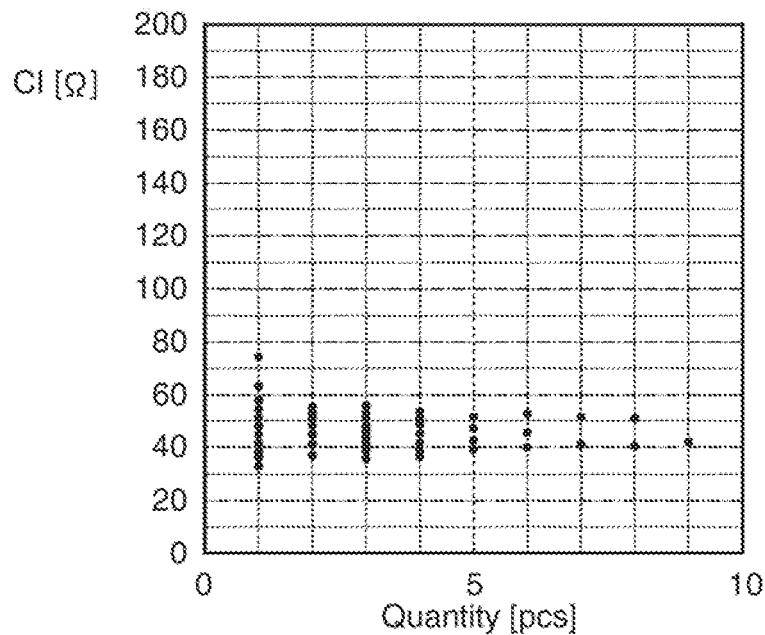
FIGS. 19A and 19B are diagrams showing a distribution of the CI value with graphs.
Figure 19B:
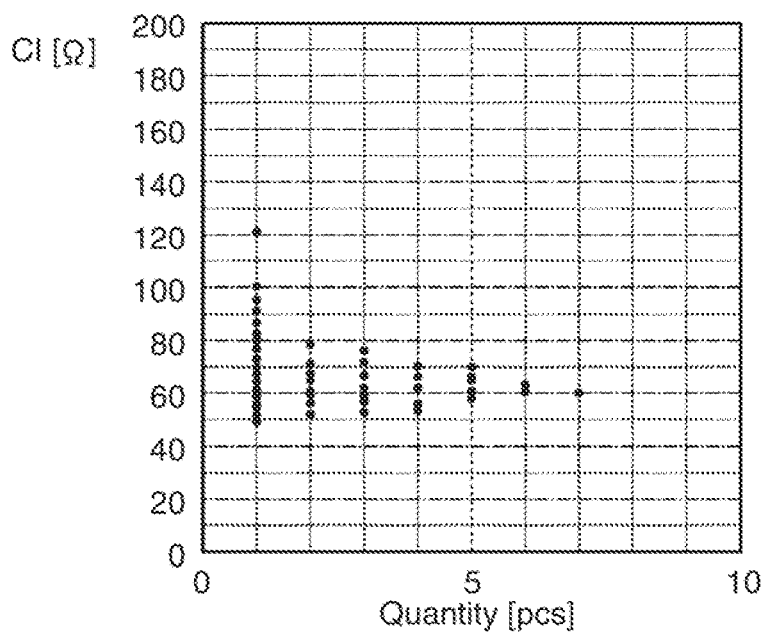

Two hundred piezoelectric vibrating elements of the specific example and two hundred piezoelectric vibrating elements of the comparative example are manufactured, and are each housed in a package, and then the CI value thereof (at room temperature) is measured. FIGS. 19A and 19B are graphs showing the CI value with respect to the number of elements measured, wherein FIG. 19A shows the measurement result of the specific example, and FIG. 19B shows the measurement result of the comparative example. In other words, FIGS. 19A and 19B respectively show the distributions of the CI value in the specific example and the comparative example.

It is understood from FIGS. 19A and 19B that the CI value is equal to or lower than 80Ω in all of the samples of the specific example, which is lower than the CI value in the comparative example. Further, it is also understood that the variation in the CI value in the specific example is smaller than in the comparative example. In other words, by forming each of the side surfaces of the excitation section extending in the X-axis direction in a single plane, the reduction of the CI value can be achieved. It is inferable that this is achieved due to the fact that by forming each of the side surfaces extending in the X-axis direction in a single plane, the combination of the thickness-shear vibration in the Z'-axis direction and the unwanted mode such as the contour vibration can be suppressed.

5.3 Evaluation of CI Value to Mz/Z

Figure 20:
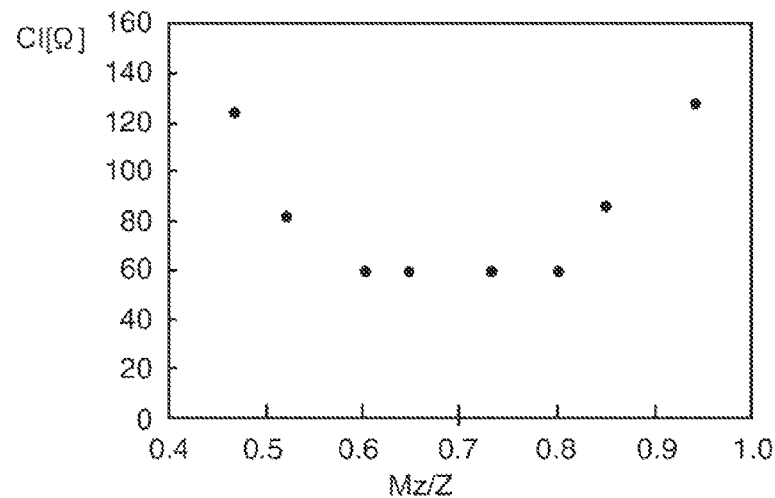
FIG. 20 is a diagram showing a relationship between Mz/Z and the CI value with a graph, wherein Mz denotes a dimension of a short side of the excitation section, and Z denotes a dimension of a short side of the piezoelectric substrate.

In the piezoelectric vibrating element of the specific example, the CI value (at room temperature) is measured while fixing the thickness t of the excitation section 14 to 0.065 mm, and the dimension of the short side Mz of the excitation section 14 to 0.43 mm, and varying the dimension Z of the short side of the piezoelectric substrate 10 to 0.46 mm, 0.5 mm, 0.54 mm, 0.59 mm, 0.65 mm, 0.72 mm, 0.81 mm, and 0.92 mm. The measurement is performed on the piezoelectric vibrating element housed in the package. FIG. 20 is a graph showing the relationship between Mz/Z and the CI value.

It is found out from FIG. 20 that the CI value is as low as about 60Ω in a range of Mz/Z from 0.6 to 0.8. The value of Z on this occasion is equal to or larger than 0.54 mm and equal to or smaller than 0.72 mm, and the Z length-to-thickness ratio (Z/t) becomes equal to or higher than 8 and equal to or lower than 11. It is found out from the above that by setting the range of the Z length-to-thickness ratio (Z/t) to 8≤Z/t≤11, and at the same time setting the range of Mz/Z to 0.6≤Mz/Z≤0.8 (i.e., by fulfilling the formula 1 above), the reduction of the CI value can be achieved. It is inferable that this is achieved due to the fact that by designing Z/t and Mz/Z so as to fulfill the formula 1, the combination of the thickness-shear vibration in the Z'-axis direction and the unwanted mode such as the contour vibration can further be suppressed.

It should be noted that according to the measurement of the CI value in the piezoelectric vibrating element with Mz set to 0.4 mm and Z set to 0.65 mm (i.e., Mz/Z=0.6) and the piezoelectric vibrating element with Mz set to 0.48 mm and Z set to 0.6 mm (i.e., Mz/Z=0.8), the CI value is about 60Ω in the both cases. According to this result, it can be said that the reduction of the CI value can be achieved as long as the formula 1 described above is fulfilled without being limited to the case of Mz=0.43 mm.

Although the experimental example described above is performed with respect to the piezoelectric vibrating element having the two-stage mesa structure shown in FIGS. 1A through 1C, 2A, and 2B, the present experimental result can also be applied to the piezoelectric vibrating element having, for example, a multistage mesa type of mesa structure shown in FIGS. 12A through 12C, 13A, and 13B.

Figure 21A:
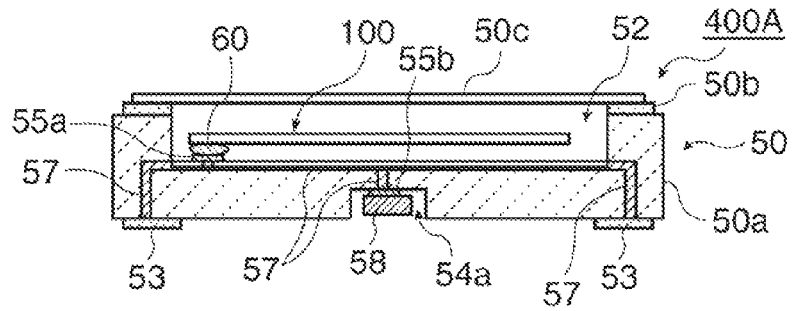
FIG. 21A is a cross-sectional view showing an electronic device as an embodiment of the invention.

FIG. 21A is a cross-sectional view of an example of an electronic device 400A according to the embodiment of the invention.

The electronic device 400A is mainly provided with the piezoelectric vibrating element 100A (other piezoelectric vibrating elements according to the present embodiment can also be adopted although the piezoelectric vibrating element 100A is shown in FIG. 21A) according to the present embodiment of the invention, a thermistor 58 as a thermosensor, and the package 50 for housing the piezoelectric vibrating element 100A and the thermistor 58. The package 50 is provided with a package main body 50a and a lid member 50c. The package main body 50a is provided with the cavity 52 for housing the piezoelectric vibrating element 100A disposed on the upper surface side, and is provided with a recessed section 54a for housing the thermistor 58 disposed on the lower surface side. A plurality of element mounting pads 55a is disposed in an end portion of the inner bottom surface of the cavity 52, and each of the element mounting pads 55a is electrically connected to a plurality of mounting terminals 53 with internal conductors 57. The piezoelectric vibrating element 100A is mounted on the element mounting pads 55a, then the pads 24 and the element mounting pads 55a are electrically connected to each other via the electrically-conductive adhesive 60, respectively, and are then fixed to each other. In the upper part of the package main body 50a, there is calcined a sealing ring 50b made of kovar or the like, and the lid member 50c is mounted on the sealing ring 50b, and is then welded using a resistance welder to thereby airtightly seal the cavity 52. The cavity 52 can be vacuated, or filled with an inert gas.

Figure 21B:
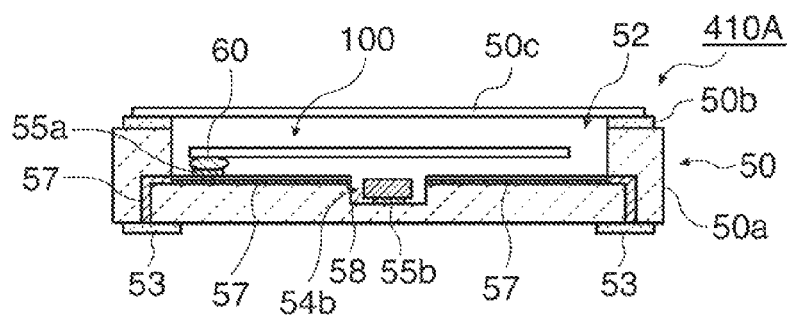
FIG. 21B is a cross-sectional view showing a modified example of the embodiment.

Incidentally, at the center of the lower surface of the package main body 50a, there is formed the recessed section 54a, and on the upper surface of the recessed section 54a there is calcined an electronic component mounting pads 55b. The thermistor 58 is mounted on the electronic component mounting pads 55b using solder or the like. The electronic component mounting pads 55b are electrically connected to a plurality of mounting terminals 53 with the internal conductors 57. FIG. 21B shows an electronic device 410A according to a modified example of one shown in FIG. 21A, and is different from the electronic device 400A in the point that the recessed section 54b is provided to the bottom surface of the cavity 52 of the package main body 50a, and the thermistor 58 is connected to the electronic component mounting pads 55b calcined on the bottom of the recessed section 54b via metal bumps or the like. The electronic component mounting pads 55b are electrically connected to the mounting terminals 53. Therefore, the piezoelectric vibrating element 100A and the thermistor 58 as a thermosensor are housed in the cavity 52 and encapsulated airtightly.

The example of housing both of the piezoelectric vibrating element 100A and the thermistor 58 in the package 50 is hereinabove explained. It is preferable to constitute the electronic device housing at least one of a thermistor, a capacitor, a reactive element, and a semiconductor element as an electronic component housed in the package 50.

The examples of the embodiment shown in FIGS. 21A and 21B are the examples housing the piezoelectric vibrating element 100A and the thermistor 58 in the package 50. According to such a configuration, since the thermistor 58 as a thermosensor is located extremely near to the piezoelectric vibrating element 100A, there can be obtained an advantage that the temperature variation in the piezoelectric vibrating element 100A can promptly be sensed. Further, since the electronic device having a piezoelectric vibrating element with a small CI value can be constituted by composing the electronic device mainly of the piezoelectric vibrating element according to the present embodiment and the electronic component described above, there can be obtained an advantage that the electronic device can be applied to purposes of a variety of fields. Then, by assembling an IC component equipped with an oscillator circuit for driving the piezoelectric vibrating element and then amplifying the output to the package of the piezoelectric vibrator using the piezoelectric vibrating element according to the present embodiment, a piezoelectric oscillator can be built.

Figure 22A:
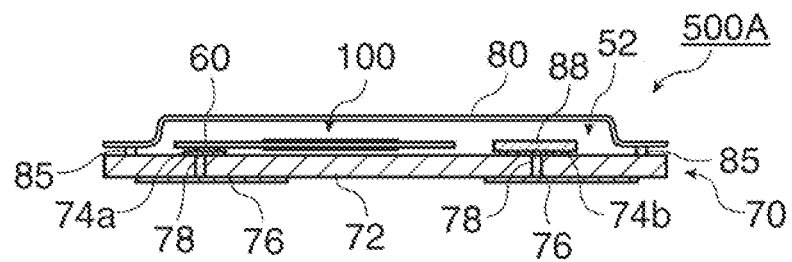
FIG. 22A is a cross-sectional view showing a piezoelectric oscillator as an embodiment of the invention.

FIG. 22A is a cross-sectional view of an example of a piezoelectric oscillator 500A according to an embodiment of the invention. The piezoelectric oscillator 500A is mainly provided with the piezoelectric vibrating element 100A (although the piezoelectric vibrating element 100A is shown in FIG. 22A, other piezoelectric vibrating elements according to the present embodiment can also be adopted) according to the present embodiment, a single layer insulating substrate 70, an IC (a semiconductor element) 88 for driving the piezoelectric vibrating element 100A, and a lid member 80 having a convex shape for airtightly sealing a surface space of the insulating substrate 70 including the piezoelectric vibrating element 100A and the IC 88. The insulating substrate 70 has a plurality of element mounting pads 74a and electronic component mounting pads 74b for mounting the piezoelectric vibrating element 100A and the IC 88 on the obverse surface thereof, and is at the same time provided with mounting terminals 76 on the reverse surface thereof for connection to an external circuit. The element mounting pads 74a and the electronic component mounting pads 74b are electrically connected to the mounting terminals 76 with conductors 78 penetrating the insulating substrate 70. Further, electrical connection between the element mounting pads 74a and the electronic component mounting pads 74b is achieved by conductor wiring (not shown) formed on the surface of the insulating substrate 70. After mounting the IC 88 on the electronic component mounting pads 74b using metal bumps or the like, the electrically-conductive adhesive 60 is applied to the element mounting pads 74a, then the pads 24 of the piezoelectric vibrating element 100A are mounted thereon, and then the electrically-conductive adhesive 60 is cured in a thermostatic chamber to thereby achieve the electrical connection and fixation. The lid member 80 having a convex shape and the insulating substrate 70 are sealed with low-melting-point glass 85 applied to the periphery of the upper surface of the insulating substrate 70. On this occasion, it is possible to vacate the inside by performing the sealing process in a vacuum atmosphere.

Figure 22B:
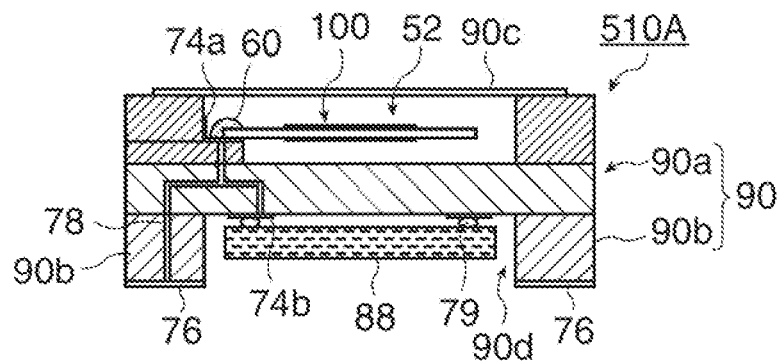
FIG. 22B is a cross-sectional view showing a modified example of the embodiment.
Figure 22C:
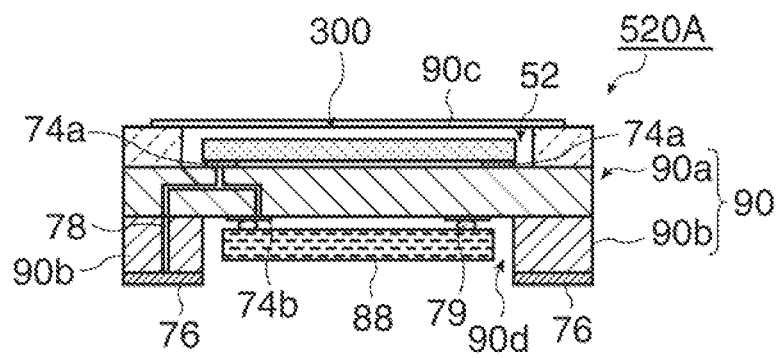
FIG. 22C is a cross-sectional view showing another modified example of the embodiment.

FIG. 22B is a cross-sectional view of a piezoelectric oscillator 510A according to another example of the present embodiment. The piezoelectric oscillator 510A is mainly provided with the piezoelectric vibrating element 100A according to the present embodiment, a package main body 90, the IC 88 for driving the piezoelectric vibrating element 100A, and a lid member 90c for airtightly encapsulating the piezoelectric vibrating element 100A. The package main body 90 is a main body of the package having a so-called H structure composed of an upper part 90a having the cavity 52 for housing the piezoelectric vibrating element 100A and a lower part 90b having a recessed section 90d for housing the IC 88. The piezoelectric vibrating element 100A is mounted on the electrically-conductive adhesive 60 applied to the surface of the element mounting pads 74a formed in an end portion of a bottom of the cavity 52, and is fixed in a conductive manner by thermally curing the adhesive. The IC 88 is connected and fixed to the electronic component mounting pads 74b formed on an upper surface of the recessed section 90d on the lower surface side of the package main body 90 with metal bumps 79. The element mounting pads 74a and the electronic component mounting pads 74b are electrically connected to each other with internal conductors 78. The lid member 90c is mounted on a sealing ring (not shown) calcined on the upper part of the package main body 90, and is then welded using a resistance welder or the like to thereby airtightly seal the package. The cavity 52 can be vacuated, or filled with an inert gas. FIG. 22C is a cross-sectional view of a piezoelectric oscillator 520A according to another example of the present embodiment. The piezoelectric oscillator 520A is mainly provided with the piezoelectric vibrator 300A according to the present embodiment, the package main body 90, the IC 88 for driving the piezoelectric vibrator 300A, and the lid member 90c for airtightly encapsulating the piezoelectric vibrator 300A. The package main body 90 is a main body of the package having a so-called H structure composed of the upper part 90a having the cavity 52 for housing the piezoelectric vibrator 300A and the lower part 90b having the recessed section 90d for housing the IC 88. The piezoelectric vibrator 300A is mounted on the element mounting pads 74a formed on both end portions of the bottom section of the cavity 52, and is connected and fixed thereto with solder, metal bumps, or the like. The IC 88 is connected and fixed to the electronic component mounting pads 74b formed on an upper surface of the recessed section 90d on the lower surface side of the package main body 90 with the metal bumps 79. The element mounting pads 74a and the electronic component mounting pads 74b are electrically connected to each other with internal conductors 78. The lid member 90c is mounted on a sealing ring (not shown) calcined on the upper part of the package main body 90, and is then welded using a resistance welder or the like. The piezoelectric vibrating element is airtightly encapsulated over again.

The IC 88 can include an oscillator circuit for driving the piezoelectric vibrator 300A, a thermosensor for sensing the temperature around the piezoelectric vibrator 300A, a compensation circuit for compensating the frequency temperature characteristics of the piezoelectric vibrator 300A, a voltage-controlled capacitive element, and so on. Since the piezoelectric oscillator 500A according to the embodiment shown in FIG. 22A has the piezoelectric vibrating element 100A with a small CI value according to the present embodiment and the IC (including the oscillator circuit) 88 disposed in the package, and therefore the piezoelectric vibrator can be miniaturized and the oscillation current of the oscillator circuit can be reduced, there can be obtained an advantage that low power consumption can be achieved. The piezoelectric oscillator 510A according to the embodiment shown in FIG. 22B has the piezoelectric vibrating element 100A with a small CI value according to the present embodiment and the IC (including the oscillator circuit) 88 disposed in the package, and therefore has an advantage that low power consumption of the piezoelectric oscillator can be achieved. Further, since the IC 88 can externally be controlled, there can be obtained an advantage that a multifunction piezoelectric oscillator further superior in frequency temperature characteristics can be constituted.

Since the piezoelectric oscillator 520A according to the present embodiment shown in FIG. 22C uses the piezoelectric vibrator 300A housed in the package, there can be obtained an advantage that a multifunction and reliable piezoelectric oscillator superior in frequency stability in, for example, aging can be constituted.

Second Embodiment of the Invention

Then, a second embodiment of the invention will hereinafter be explained with reference to the accompanying drawings.

1. Piezoelectric Vibrating Element (Vibrating Element)

Figure 23A:
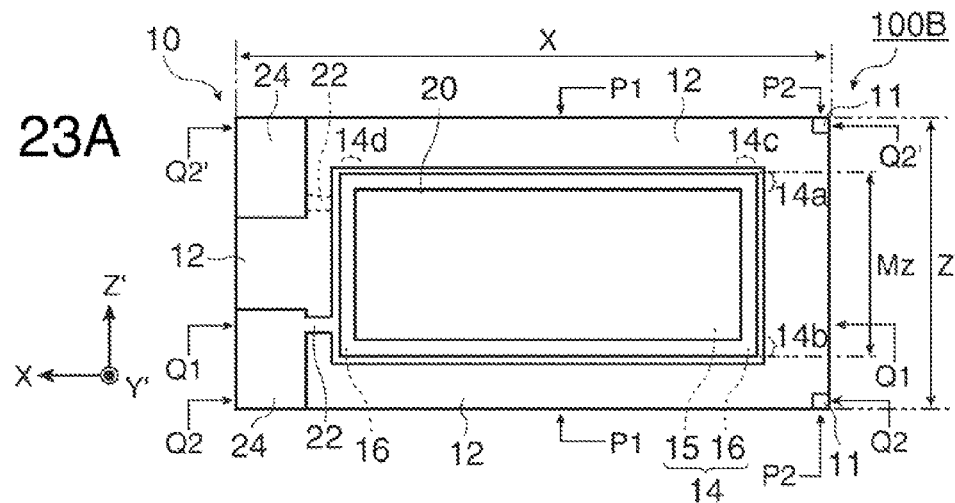
Figure 23B:
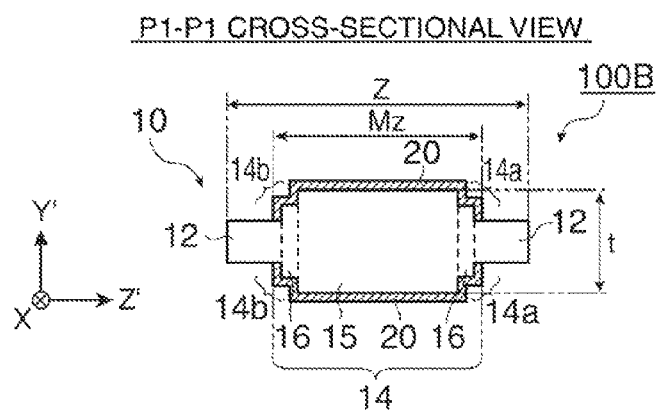
Figure 23C:
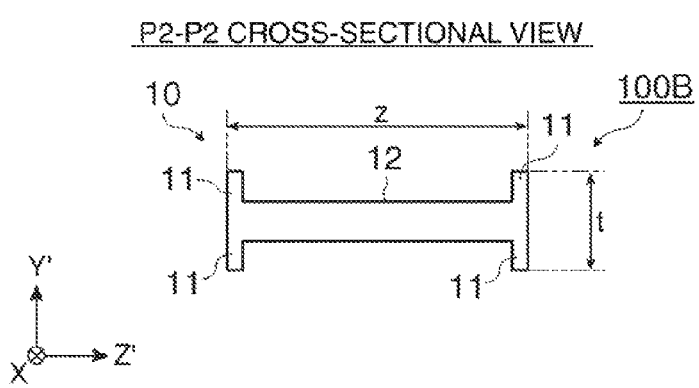
Figure 24A:
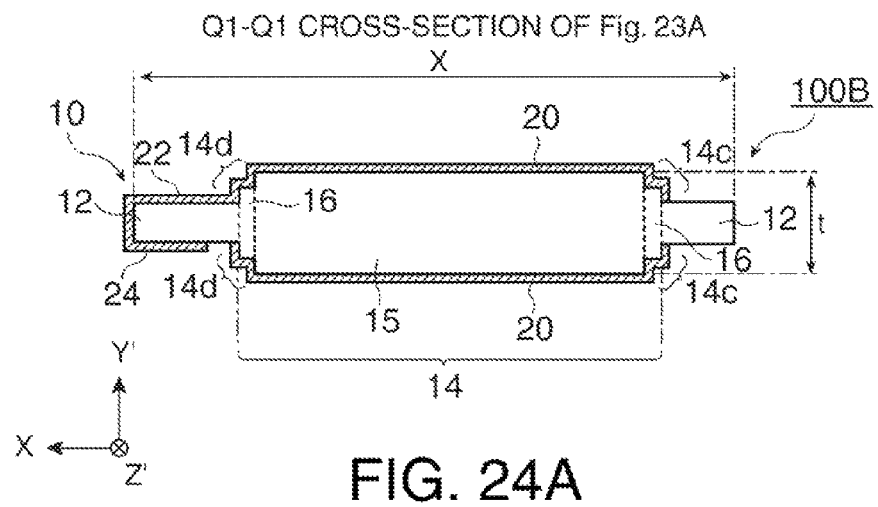
FIG. 24A is a Q1-Q1 cross-sectional view of FIG. 23A.
Figure 24B:
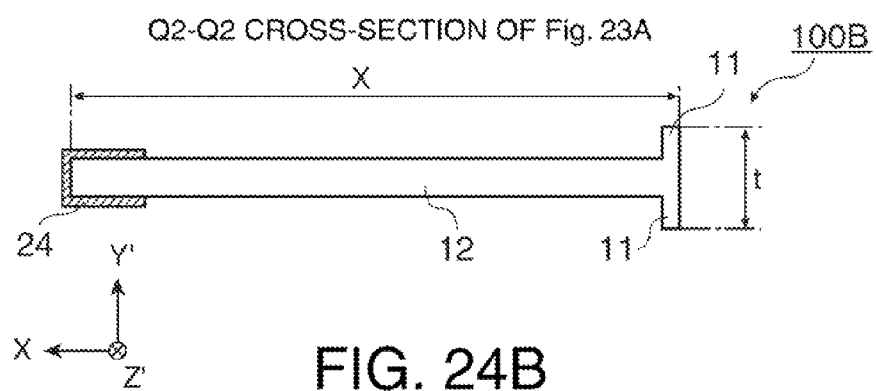
FIG. 24B is a Q2-Q2 cross-sectional view of FIG. 23A.

Firstly, a piezoelectric vibrating element according to the present embodiment will be explained with reference to the accompanying drawings. FIGS. 23A through 23C, 24A, and 24B are schematic diagrams showing a configuration of a piezoelectric vibrating element 100B according to the second embodiment of the invention. FIG. 23A is a plan view of the piezoelectric vibrating element 100B, FIG. 23B is a P1-P1 cross-sectional view of FIG. 23A, and FIG. 23C is a P2-P2 cross-sectional view of FIG. 23A. FIG. 24A is a Q1-Q1 cross-sectional view of FIG. 23A, and FIG. 24B is a Q2-Q2 cross-sectional view or a Q2'-Q2' cross-sectional view of FIG. 23A.

The piezoelectric vibrating element 100B according to the second embodiment is provided mainly with a piezoelectric substrate 10 having a excitation section 14 with a multistage mesa structure located in a central portion and a thin-wall peripheral section 12 contiguously formed on the periphery of the excitation section 14, excitation electrodes 20 disposed on the respective principal surfaces of the excitation section 14 so as to be opposed to each other, extraction electrodes 22 extending from the respective excitation electrodes 20 toward the end portion of the piezoelectric substrate 10, and pads 24 respectively formed at the ends of the extraction electrodes 22 and in two corner portions of the piezoelectric substrate 10.

The excitation section 14 is a thick-wall section having the roughly central portion of the piezoelectric substrate protruding in the both principal surface directions, and the peripheral section 12 is formed so as to project from an intermediate portion in the thickness direction of at least apart of the peripheral side surface of the excitation section 14 in the diameter direction forming a flange shape. The peripheral section 12 according the present embodiment is formed so as to be projected from the entire peripheral side surface of the excitation section 14 forming a flange shape. The piezoelectric substrate 10 has the excitation section 14 located in the central portion thereof and forming a principal vibration area, and the peripheral section 12 having a smaller thickness than the excitation section 14 and formed along the entire periphery of the excitation section 14 so as to form a flange shape. All of the side surfaces (four sides) of the excitation section 14 having a roughly rectangular planar shape each have a structure having step sections in the thickness direction. In other words, as shown in FIGS. 23B and 24A, the piezoelectric substrate 10 is a piezoelectric substrate having the excitation section 14 with all of the side surfaces each having a staircase shape viewed from the side surface, and the peripheral section 12 disposed on the periphery of the thickness center portion of the excitation section 14 so as to project therefrom.

When applying an alternating voltage to the excitation electrodes 20 on the obverse and reverse sides, the piezoelectric vibrating element 100B is excited at a natural vibration frequency inversely proportional to the thickness. The vibratory displacement thus excited is spread to the periphery, and on each of the obverse and reverse surfaces of the peripheral section 12 of the area where the vibratory displacement is sufficiently attenuated, there is formed at least one projection section 11 perpendicular to the principal surface direction of the piezoelectric substrate 10.

Figure 25:
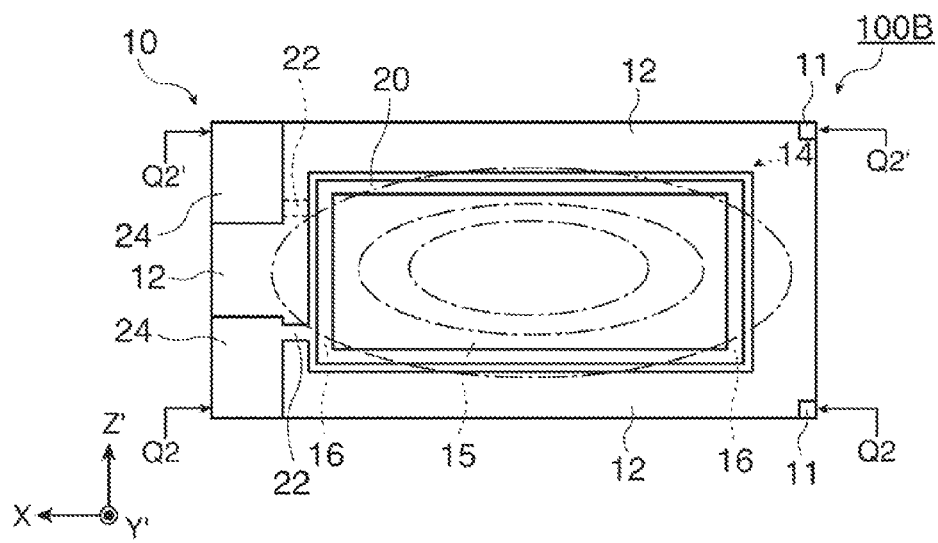
FIG. 25 is a diagram showing isodynamic lines formed by connecting the points having the same vibratory displacement energy superimposed on the plan view of the piezoelectric vibrating element with the mesa structure.

In the example of the embodiment shown in FIGS. 23A through 23C, 24A, and 24B, two projection sections 11 are formed on each of the obverse and reverse surfaces in corner portions (on the right side of FIG. 23A) opposed to pads 24 respectively formed in two corner portions (on the left side of FIG. 23A) of the piezoelectric substrate 10. In other words, as shown in the cross-sectional views of FIGS. 23C and 24B, the two projection sections 11 formed on each of the obverse and reverse surfaces of the peripheral section 12 are disposed in the corner portions of the peripheral section 12 of the piezoelectric substrate 10. The total of the thickness of the projection sections 11 on the obverse and reverse sides and the thickness of the peripheral section 12 can be arranged to be equal to the thickness of the center of the excitation section 14. In FIG. 25, the isodynamic lines, which are obtained by connecting the points having the same vibratory displacement energy (the product of the square of the vibratory displacement and the mass at the point) generated when the piezoelectric vibrating element 100B is excited, are overwritten on the plan view of the piezoelectric vibrating element 100B with the dashed-dotted line. In other words, the dashed-dotted lines shown in FIG. 25 form a drawing showing a distribution of the vibratory displacement energy. In the piezoelectric vibrating element 100B shown in FIG. 25, since the excitation section 14 has a rectangular shape elongated in the X-axis direction, each of the isodynamic lines has an elliptical shape with a large long diameter in the X-axis direction and a small short diameter in the Z'-axis direction. The dimension of the vibratory displacement is the largest in the central portion of the excitation section 14, and decreases as the distance from the central portion increases, and the distance from the periphery decreases. In other words, it is distributed on the cosine in both of the X-axis direction and the Z'-axis direction on the excitation electrodes 20, and is attenuated in an exponential manner in the area without the excitation electrodes 20.

In the piezoelectric vibrating element 100B shown in FIGS. 23A through 23C, the projection sections 11 are disposed in the areas where the vibratory displacement energy is sufficiently attenuated, namely the corner portions of the peripheral section 12. Therefore, even if the projection sections 11 are provided, the vibratory displacement of the piezoelectric vibrating element 100B is hardly affected. In other words, nothing is different in the electrical characteristics of the piezoelectric vibrating element 100B.

Figure 26:
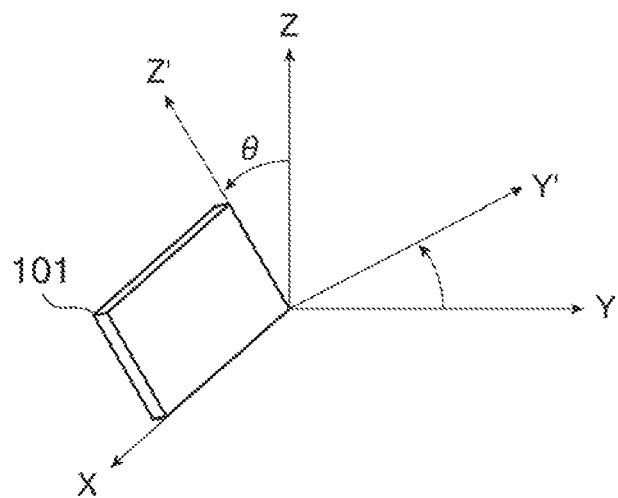
FIG. 26 is a diagram showing a relationship between new orthogonal coordinate axes X, Y', and Z' formed by rotating the crystal axes X, Y, and Z of a quartz crystal as much as an angle θ around the X axis and an AT-cut quartz crystal substrate.

The piezoelectric material such as a quartz crystal belongs to a trigonal system, and has the crystal axes X, Y, and Z perpendicular to each other as shown in FIG. 26. The X axis, the Y axis, and the Z axis are referred to the electrical axis, the mechanical axis, and the optical axis, respectively. The AT-cut quartz crystal substrate 101 is a flat plate carved from the quartz crystal along a plane obtained by rotating the X-Z plane as much as an angle θ around the X axis. In the case of the AT-cut quartz crystal substrate 101, the angle θ equals to about 35°15'. It should be noted that the Y' axis and the Z' axis are also obtained by rotating the Y axis and the Z axis as much as the angle θ around the X axis. Therefore, the AT-cut quartz crystal substrate 101 has the crystal axes X, Y', and Z' perpendicular to each other. The AT-cut quartz crystal substrate 101 has the thickness direction of the Y'-axis direction, and the principal surface of the X-Z' plane (the plane including the X axis and the Z' axis) perpendicular to the Y' axis, and the thickness-shear vibration is excited therein as the principal vibration. By processing the AT-cut quartz crystal substrate 101, the piezoelectric substrate 10 can be obtained.

In other words, as shown in FIG. 26, assuming that in the orthogonal coordinate system composed of the X axis (the electrical axis), the Y axis (the mechanical axis), and the Z axis (the optical axis), the axis obtained by tilting the Z axis toward the −Y direction of the Y axis around the X axis is the Z' axis, and the axis obtained by tilting the Y axis toward the +Z direction of the Z axis around the X axis is the Y' axis, the piezoelectric substrate 101 is formed of the AT-cut quartz crystal substrate composed of the planes parallel to the X axis and the Z' axis and having the thickness in the direction parallel to the Y' axis.

As shown in FIG. 23A, the piezoelectric substrate 10 has a rectangular shape having a direction (hereinafter referred to as a "Y'-axis direction") parallel to the Y' axis as the thickness direction, the direction (hereinafter referred to as an "X-axis direction") parallel to the X axis as the long side, and the direction (hereinafter referred to as a "Z'-axis direction") parallel to the Z' axis as the short side. The piezoelectric substrate 10 has the excitation section 14, and the peripheral section 12 formed along the periphery of the excitation section 14. Here, it is assumed that the "rectangular shape" includes rectangular shapes in a literal sense and roughly rectangular shapes with the corners chamfered to have a curved surface or a straight line.

As shown in FIGS. 23A through 23C, 24A, and 24B, the peripheral section 12 is provided to at least a part of the peripheral surface (the side surface) of the excitation section 14, and has a thickness (thinner wall) smaller than that of the excitation section 14.

As shown in FIGS. 23A through 23C, 24A, and 24B, the excitation section 14 according to the present embodiment has a stepped shape in all of the side surfaces, and is surrounded by the peripheral section 12 in the entire periphery thereof, and has a thickness (thicker wall) larger than the thickness of the peripheral section 12 in the Y'-axis direction. In other words, as shown in FIGS. 23B and 24A, the excitation section 14 projects in the both directions of the Y'-axis direction with respect to the peripheral section 12. In the example shown in the drawings, the excitation section 14 projects on the +Y'-axis side and the −Y'-axis side with respect to the peripheral section 12. Further, it is possible for the excitation section 14 to have, for example, a point (not shown) to be the center of symmetry, and have a shape point-symmetric (two-dimensionally or three-dimensionally point-symmetric) about the central point.

As shown in FIG. 23A, the excitation section 14 has a rectangular shape having the long side in the X-axis direction, and the short side in the Z'-axis direction. In other words, the excitation section 14 has a side parallel to the X axis as the long side, and a side parallel to the Z' axis as the short side. Therefore, the excitation section 14 has side surfaces 14a, 14b extending in the X-axis direction and side surfaces 14c, 14d extending in the Z'-axis direction. Therefore, the longitudinal direction of the side surfaces 14a, 14b extending in the X-axis direction is the X-axis direction, and the longitudinal direction of the side surfaces 14c, 14d extending in the Z'-axis direction is the Z'-axis direction. In the example shown in the drawings, among the side surfaces 14a, 14b, the side surfaces 14a are the side surfaces on the +Z'-axis side, and the side surfaces 14b are the side surfaces on the −Z'-axis side. Further, among the side surfaces 14c, 14d, the side surfaces 14c are the side surfaces on the −X-axis side, and the side surfaces 14d are the side surfaces on the +X-axis side.

As shown in FIGS. 23A through 23C, 24A, and 24B, the excitation section 14 has a first part 15 with the largest thickness and a second part 16 having a thickness smaller than that of the first part 15. As shown in FIG. 23A, the first part 15 has a rectangular shape having the long side in a direction parallel to the X axis, and the short side in a direction parallel to the Z' axis. The second part 16 is formed on the periphery of the first part 15.

The steps in the side surfaces 14a, 14b of the excitation section 14 are formed by the difference in thickness between the first part 15 and the second part 16. In the example shown in the drawings, each of the side surfaces 14a, 14b is composed of a surface parallel to the X-Y' plane of the first part 15, a surface parallel to the X-Z' plane of the second part 16, and a surface parallel to the Z-Y' plane of the second part 16. Similarly, each of the steps in the side surfaces 14c, 14d of the excitation section 14 is formed by the difference in thickness between the first part 15 and the second part 16, and is composed of a surface parallel to the Y'-Z' plane of the first part 15, a surface parallel to the X-Z' plane of the second part 16, and a surface parallel to the Y'-Z' plane of the second part 16.

As described above, the excitation section 14 has the two types of parts 15, 16 different in thickness from each other, and it can be said that the piezoelectric vibrating element 100B has a two-stage mesa structure. The excitation section 14 can vibrate with the thickness-shear vibration as the principal vibration. Since the excitation section 14 has the two-stage mesa structure, the piezoelectric vibrating element 100B can exert the energy confinement effect.

Here, assuming that the dimension (the dimension of the short side) of the piezoelectric substrate 10 in the Z'-axis direction is "Z," the dimension of the short side of the excitation section 14 is "Mz," and the thickness (the thickness of the first part 15 of the excitation section 14) of the excitation section is "t," the relationship of the formula 1 below is preferably fulfilled.

$$8 \leq Z/t \leq 11, \text{ and } 0.6 \leq Mz/Z \leq 0.8 \quad (1)$$

Thus, the combination of the thickness-shear vibration and the unwanted mode such as a contour vibration can be suppressed, and the reduction of the CI value and the improvement in the frequency temperature characteristics can be achieved (the details will be described later). In general, the smaller the area of the piezoelectric substrate is, the more difficult it is to suppress such a combination of the thickness-shear vibration and the contour vibration. Therefore, for example, assuming that the dimension (the dimension of the long side) of the piezoelectric substrate 10 in the X-axis direction is X, by adopting the design simultaneously fulfilling the relationship of the formula 1 described above in such a small piezoelectric vibrating element 100B as to fulfill the relationship of the formula 2 below, it is possible to more remarkably suppress the combination of the thickness-shear vibration and the contour vibration.

$$X/t \leq 17 \quad (2)$$

The excitation electrodes 20 are provided to the excitation section 14. In the example of the embodiment shown in FIGS. 23B and 24A, the excitation electrodes 20 are formed so as to sandwich the excitation section 14 on the obverse and reverse sides thereof. More specifically, the excitation electrodes are respectively disposed in vibrating areas (the excitation section 14) of the both principal surfaces (the surfaces parallel to the X-Z' plane) of the piezoelectric substrate 10 so as to be opposed to each other on the obverse and reverse sides. The excitation electrodes 20 can excite the vibration of the piezoelectric substrate 10 by applying a voltage to the excitation section 14. The excitation electrodes 20 are respectively connected to the pads 24 via, for example, the extraction electrodes 22. The pads 24 are electrically connected to, for example, an IC chip (not shown) for driving the piezoelectric vibrating element 100B. As a material of the excitation electrodes 20, the extraction electrodes 22, and the pads 24, a material having chromium and gold stacked in this order from the piezoelectric substrate 10 side, for example, can be used.

The piezoelectric vibrating element 100B according to the present embodiment has, for example, the following features. According to the piezoelectric vibrating element 100B, by setting the short side dimension Z of the piezoelectric substrate 10, the short side dimension Mz of the excitation section 14, and the thickness t of the first part 15 of the excitation section 14 so as to fulfill the relationship of the formula 1 as described above, the reduction of the CI value can advantageously be achieved.

According to the piezoelectric vibrating element 100B, by arranging that the X length-to-thickness ratio (X/t) fulfills the relationship of the formula 2 as described above, the reduction of the CI value can be achieved while achieving downsizing.

Further, according to the piezoelectric vibrating element 100B, since the excitation section 14 has the multistage mesa structure, the combination of the thickness-shear vibration and the unwanted mode such as the contour vibration can be suppressed, and at the same time, the vibration energy can be confined in the excitation section 14. Therefore, there can be obtained an advantage that the CI value can be reduced. Further, there can be obtained an advantage that by providing the projection sections 11 on the both principal surfaces in the area on the piezoelectric substrate 10 where the vibratory displacement is sufficiently attenuated as described above, the possibility for the excitation electrodes 20 provided to the excitation section 14 to have contact with the inner surface of the package when installing the element to the package can be eliminated.

By configuring the piezoelectric vibrating element 100B using the quartz crystal as described in the example of the embodiment shown in FIGS. 23A through 23C, 24A, and 24B, there is an advantage that the frequency temperature characteristics of the piezoelectric vibrating element 100B can be improved, and at the same time, the combination of the thickness-shear vibration and the contour vibration in the Z'-axis direction can be suppressed to thereby reduce the CI value. Further, by providing the projection sections 11 on the both principal surfaces in the area on the piezoelectric substrate 10 where the vibratory displacement is sufficiently attenuated, there is an advantage that the possibility for the excitation electrodes provided to the excitation section to have contact with the inner surface of the package when installing the element to the package can be eliminated.

Further, if the projection sections 11 are disposed in the corner portions of the piezoelectric substrate 10 as shown in the example of the embodiment in FIGS. 23A through 23C, 24A, and 24B, since the vibratory displacement of the thickness-shear vibration as the principal vibration excited on the piezoelectric substrate 10 is sufficiently attenuated, the operation thereof is not hindered, and no change is caused in the electrical characteristics. Moreover, since the possibility for the excitation electrodes 20 provided to the excitation section 14 to have contact with the inner surface of the package when installing the piezoelectric vibrating element 100B having the projection sections 11 to the package is eliminated, there is an advantage that the yield ratio in manufacturing the piezoelectric vibrator (the vibrator) can dramatically be improved.

2. Method of Manufacturing Piezoelectric Vibrating Element

Then, a method of manufacturing the piezoelectric vibrating element according to the present embodiment will be explained with reference to the accompanying drawings. FIGS. 27 through 30, 31A, 31B, 32A, 32B, 33A, and 33B are diagrams schematically showing the manufacturing process of the piezoelectric vibrating element 100B according to the present embodiment. It should be noted that FIGS. 27 through 30, 31A, 31B, 32A, 32B, 33A, and 33B each correspond to FIG. 24A. In other words, these drawings show the cross-sectional views from the Z'-axis direction.

Figure 27:
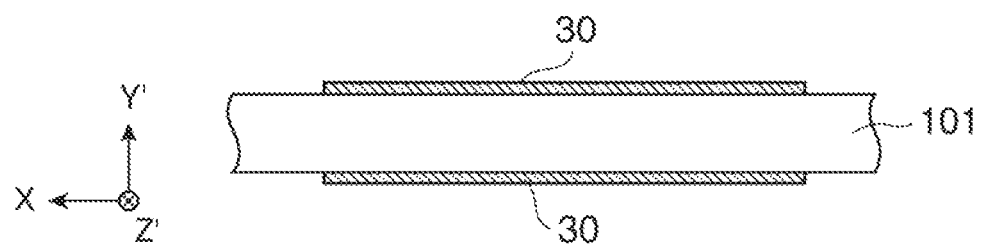
FIG. 27 is a cross-sectional view schematically showing a method of manufacturing the piezoelectric vibrating element according to the present embodiment.

As shown in FIG. 27, corrosion-resistant films 30 are formed respectively on the obverse and reverse principal surfaces (the surfaces parallel to the X-Z' plane) of the AT-cut quartz crystal substrate 101. The corrosion-resistant films 30 are formed by, for example, stacking chromium and gold in this order using a sputtering method or a vacuum evaporation method, and then patterning chromium and gold thus stacked. The patterning is performed using, for example, a photolithography process and an etching process. The corrosion-resistant films have corrosion resistance to the solution including hydrofluoric acid to be the etching liquid when processing the AT-cut quartz crystal substrate 101.

Figure 28:
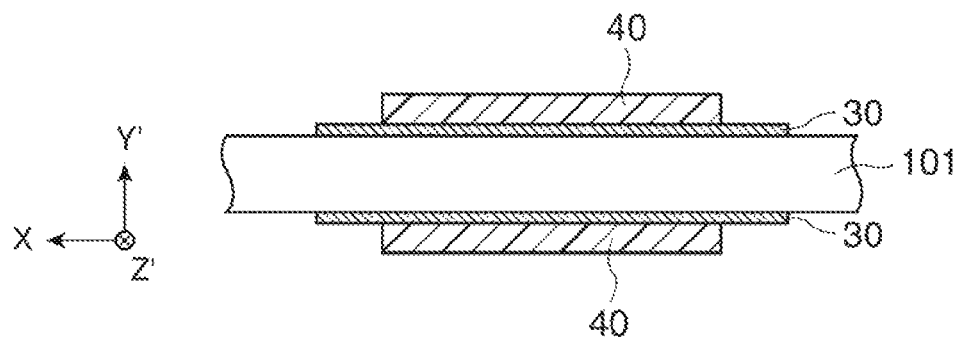
FIG. 28 is a cross-sectional view schematically showing the method of manufacturing the piezoelectric vibrating element according to the present embodiment.

As shown in FIG. 28, after applying positive photoresist films respectively to the surfaces of the corrosion-resistant films 30, the photoresist films are exposed and then developed to thereby form resist films 40 having predetermined shapes. The resist films 40 are each formed to partially cover the corresponding corrosion-resistant film 30.

Figure 29:
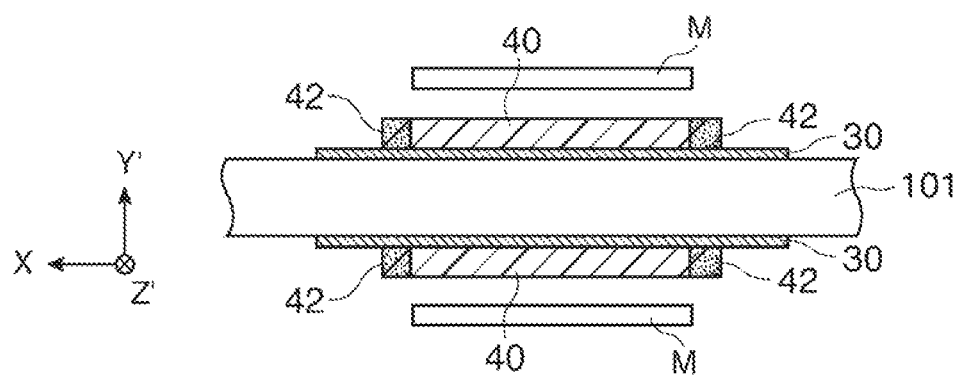
FIG. 29 is a cross-sectional view schematically showing the method of manufacturing the piezoelectric vibrating element according to the present embodiment.

Subsequently, as shown in FIG. 29, the resist films 40 are partially exposed again using masks M to thereby form exposed sections 42. Specifically, the masks M are disposed inside the outer edge of the resist film 40 viewed from the Y'-axis direction, and the exposure is performed.

Figure 30:
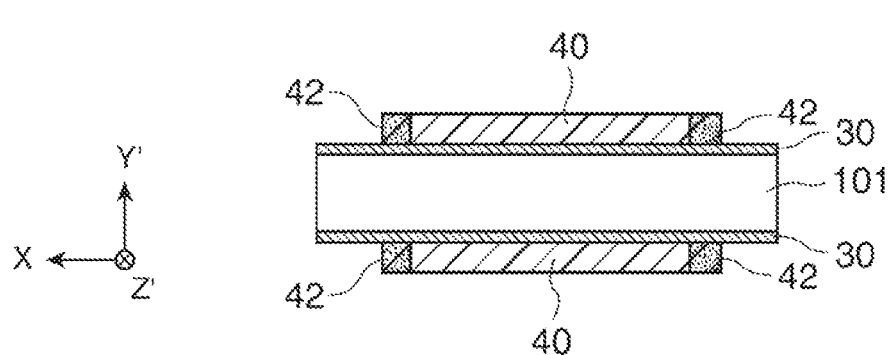
FIG. 30 is a cross-sectional view schematically showing the method of manufacturing the piezoelectric vibrating element according to the present embodiment.

Subsequently, as shown in FIG. 30, an etching process is performed on the AT-cut quartz crystal substrate 101 using the corrosion-resistant films 30 as masks. The etching process is performed using, for example, the compound liquid of hydrofluoric acid and ammonium fluoride as an etching liquid. Thus, the outer shape (the shape thereof viewed from the Y'-axis direction) of the piezoelectric substrate 10 is formed.

In FIGS. 31A, 31B, 32A, 32B, 33A, and 33B, FIGS. 31A, 32A, and 33A are each a cross-sectional view of a central portion of the AT-cut quartz crystal substrate 101 in the Z'-axis direction, and FIGS. 31B, 32B, and 33B are each a cross-sectional view in an end portion in the Z'-axis direction.

As shown in FIG. 31A, after etching the corrosion-resistant films 30 with a predetermined etching liquid using the resist films 40 as masks, the AT-cut quartz crystal substrate 101 is further half-etched to a predetermined depth using the compound liquid described above as an etching liquid to thereby form the outer shape of the excitation section 14. On this occasion, since the resist films 40 are left in the corner portions of the AT-cut quartz crystal substrate 101 as shown in FIG. 31B, the outer shapes of the projection sections 11 are formed.

Subsequently, as shown in FIGS. 32A and 32B, the exposed sections 42 of the resist films 40 are developed and then removed. Thus, the corrosion-resistant films 30 are partially exposed. It should be noted that prior to developing the exposed sections 42, asking is performed on altered layers (not shown) formed on the surfaces of the resist films 40 with, for example, oxygen plasma made by discharge in a vacuum or reduced-pressure atmosphere. Thus, the exposed sections 42 can surely be developed and then removed.

Subsequently, as shown in FIGS. 33A and 33B, after removing the exposed portions of the corrosion-resistant films 30 by etching with the predetermined etching liquid using the resist films 40 as masks, the AT-cut quartz crystal substrate 101 is further half-etched to a predetermined depth using the compound liquid described above as an etching liquid. Thus, it is possible to provide a step to each of the side surfaces 14c, 14d extending in the Z'-axis direction. Further, although not shown in the drawings, it is possible to provide a step to each of the side surfaces 14a, 14b extending in the X-axis direction. Further, it is possible to form the projection sections 11 perpendicular to the peripheral section 12 respectively on the obverse and reverse side in the corner portions of the peripheral section 12 of the piezoelectric substrate 10.

According to the process described above, the piezoelectric substrate 10 having the peripheral section 12, the excitation section 14, and the projection sections 11 can be formed. After removing the resist films 40 and the corrosion-resistant films 30, by forming the excitation electrodes 20, the extraction electrodes 22, and the pads 24 on the piezoelectric substrate 10, the piezoelectric vibrating element shown in FIGS. 23A through 23C, 24A, and 24B can be formed. The excitation electrodes 20, the extraction electrodes 22, and the pads 24 are formed by stacking chromium and gold in this order using, for example, a sputtering method or a vacuum evaporation method, and then patterning chromium and gold thus stacked.

The piezoelectric vibrating element 100B according to the present embodiment can be manufactured by the process described hereinabove.

According to the method of manufacturing the piezoelectric vibrating element 100B, after developing the resist films 40 used for forming the outer shape of the excitation section 14 and removing the exposed sections, the excitation section 14 can be formed by etching the AT-cut quartz crystal substrate 101 using the resist films 40 again. Therefore, it is possible to form the excitation section 14 having the two-stage mesa structure with accuracy.

In the case of, for example, applying the resist film two times for forming the excitation section 14 (in the case of, for example, forming the outer shape of the excitation section using a first resist film, then exfoliating the first resist film, and then applying a second resist film to thereby expose the side surfaces of the excitation section), a displacement in positioning is caused between the first resist film and the second resist film, and the excitation section 14 fails to be formed with accuracy in some cases. According to the method of manufacturing the piezoelectric vibrating element 100B, such a problem can be solved.

Further, according to the method of manufacturing the piezoelectric vibrating element 100B, the projection sections 11 perpendicular to the obverse and reverse sides of the peripheral section 12 can be formed respectively in the corner portions of the peripheral section 12 opposed to the two pads 24 in the corner portions of the piezoelectric substrate 10.

3. Modified Examples of Piezoelectric Vibrating Element

Figure 34A:
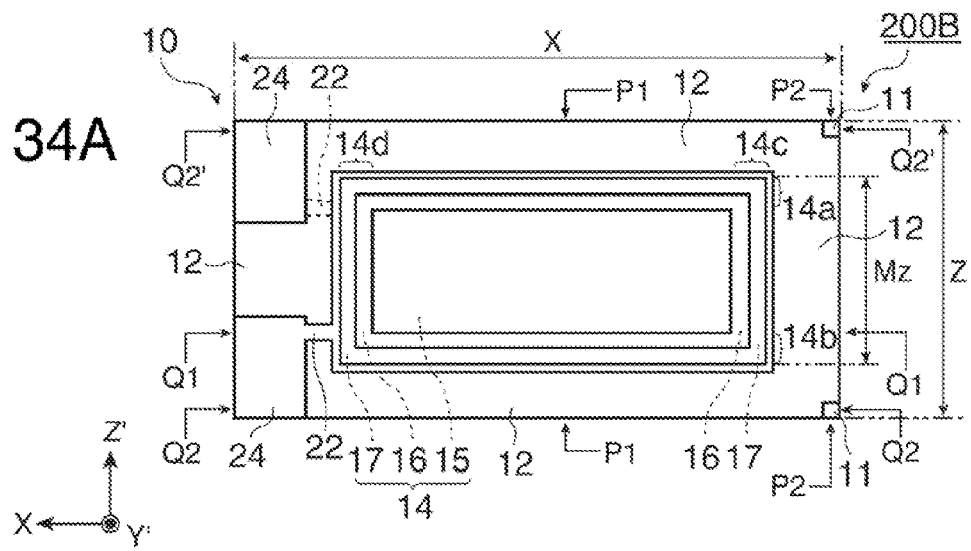
Figure 34B:
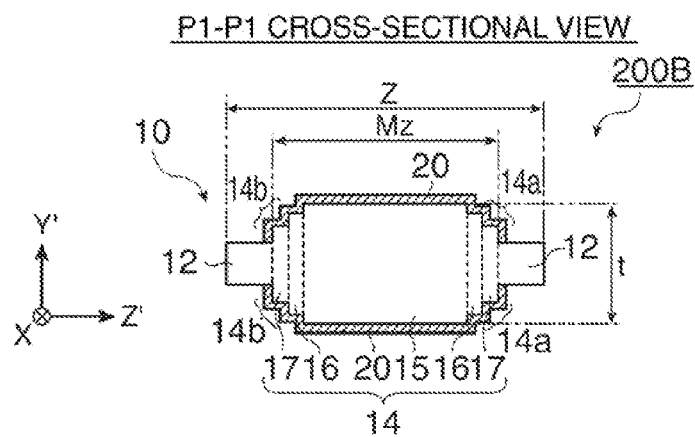
Figure 34C:
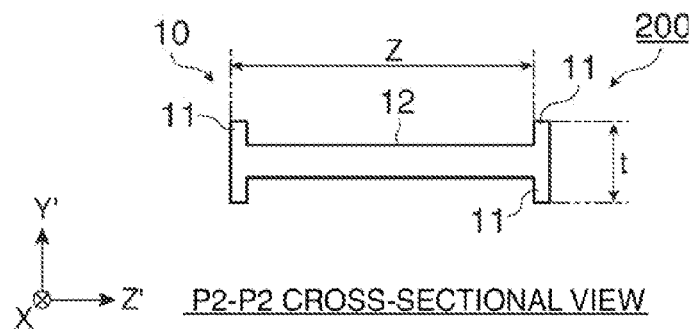

Then, piezoelectric vibrating elements according to modified examples of the present embodiment will be explained with reference to the accompanying drawings. FIG. 34A is a plan view schematically showing the piezoelectric vibrating element 200B according to the modified example of the present embodiment. FIG. 34B is a P1-P1 cross-sectional view of FIG. 34A, and FIG. 34C is a P2-P2 cross-sectional view of FIG. 34A. FIG. 35A is a Q1-Q1 cross-sectional view of FIG. 34A, and FIG. 35B is a Q2-Q2 cross-sectional view or a Q2'-Q2' cross-sectional view of FIG. 34A. Hereinafter, in the piezoelectric vibrating element 200B according to the modified example of the present embodiment, the members having similar structures or functions to those of the constituents of the piezoelectric vibrating element 100B according to the present embodiment will be denoted by the same reference symbols, and the detailed explanation thereof will be omitted.

In the example of the piezoelectric vibrating element 100B shown in FIGS. 23A through 23C, 24A, and 24B, the two-stage mesa structure having the first part 15 and the second part 16 different in thickness from each other is explained.

In contrast thereto, the piezoelectric vibrating element 200B is a three-stage mesa structure piezoelectric vibrating element having a three-stage mesa structure as shown in FIGS. 34A through 34C, 35A, and 35B. Specifically, the excitation section 14 of the piezoelectric vibrating element 200B has a third part 17 with a thickness smaller than that of the second part 16 in addition to the first part 15 and the second part 16. In the example shown in FIGS. 34A through 34C, 35A, and 35B, the third part 17 is formed so as to surround the periphery of the second part 16. The peripheral section 12 is contiguously formed on the periphery of the excitation section 14, namely the periphery of the central portion in the thickness direction of the side surface of the third part 17 in an integral manner. The excitation electrodes 20 formed on the both principal surfaces of the excitation section 14 opposed to each other on the obverse and reverse sides, the extraction electrodes 22 from the respective excitation electrodes 20, and the two pads 24 as the terminals of the respective extraction electrodes 22 are also formed similarly to the piezoelectric vibrating element 100B. The projection sections 11 are formed respectively on the obverse and reverse surfaces so as to be perpendicular to the peripheral section 12 in the corner areas of the peripheral section 12 so as to be opposed to the two pads 24 disposed in the corner portions of the piezoelectric substrate 10.

The piezoelectric vibrating element 200B can be manufactured by applying the method of manufacturing the piezoelectric vibrating element 100B. Specifically, as shown in FIGS. 32A and 32B, after developing and then removing the exposed sections 42, the resist films 40 are exposed again to thereby form second exposed section (not shown) with a predetermined shape. Subsequently, the corrosion-resistant films 30 and the AT-cut quartz crystal substrate 101 are etched using the resist films 40 having the second exposed sections as masks. Subsequently, asking is performed to remove the altered layers of the resist films 40, and then the second exposed sections are developed and then removed.

Subsequently, the corrosion-resistant films 30 and the AT-cut quartz crystal substrate 101 are etched using the resist films 40, from which the second exposed sections are removed, as masks. According to the process described hereinabove, it is possible to form the three-stage mesa structure and the projection sections 11 perpendicular to the peripheral section 12 respectively on the obverse and reverse sides of the corner portions of the peripheral section 12 of the piezoelectric substrate 10. By forming the excitation electrodes 20 opposed to the excitation section 14 having the three-stage mesa structure of the piezoelectric substrate 10, the extraction electrodes 22 from the excitation electrodes 20, and the two pads 24 as the terminals of the extraction electrodes 22, the piezoelectric vibrating element 200B having the projection sections 11 perpendicular to the principal surface on the obverse and reverse sides of the corner portions of the piezoelectric substrate 10 can be manufactured.

According to the piezoelectric vibrating element 200B, the energy confinement effect can further be enhanced compared to the piezoelectric vibrating element 100B having the two-stage mesa structure. Further, according to the piezoelectric vibrating element 200B, since the projection sections 11 perpendicular to the obverse and reverse sides of the peripheral section 12 are formed respectively in the corner portions of the peripheral section 12 opposed to the two pads 24 in the corner portions of the piezoelectric substrate 10, the yield ratio can significantly be improved when installing the element in the package.

It should be noted that although in the example described above the piezoelectric vibrating element 200B having the three-stage mesa structure is explained, the number of stages (the number of steps) of the mesa structure of the invention is not particularly limited.

FIG. 36A is a plan view of a piezoelectric vibrating element 110B according to another modified example (although it is shown based on the piezoelectric vibrating element 100B, it is also possible to use the piezoelectric vibrating element 200B as the base), FIG. 36B is a Q2-Q2 cross-sectional view or a Q2'-Q2' cross-sectional view of FIG. 36A. The piezoelectric vibrating element 110B is provided with the piezoelectric substrate 10 having the excitation section 14 with the mesa structure having the step formed in the central portion in the X-axis direction and the Z'-axis direction, and the thin-wall peripheral section 12 formed on the periphery of the excitation section 14, the excitation electrodes 20 formed on the obverse and reverse sides of the excitation section 14 so as to be opposed to each other, the extraction electrodes 22 extending from the respective excitation electrodes 20 toward the end portion of the piezoelectric substrate 10, and the pads 24 as the terminals of the extraction electrodes 22. Further, the projection sections 11 each having a bracket shape are formed on the obverse and reverse sides, the projection section 11 having a first projection part 11a disposed along an edge along the Z' axis (the short side) on the peripheral section 12, opposed to the two pads 24 disposed in the corner portions of the piezoelectric substrate 10, and second projection parts 11b contiguously disposed respectively from the both longitudinal end portions of the first projection part 11a in a direction along the X axis in a folded manner. The total thickness of the thickness of the peripheral section 12 and the thickness of the projection sections 11 on the obverse and reverse sides can be made equal to the thickness of the excitation section 14 in the center thereof.

Figure 37A:
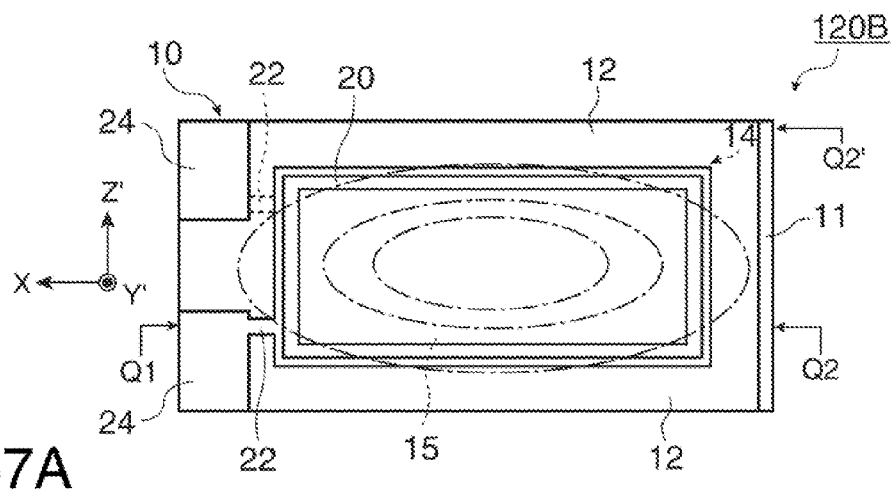
Figure 37B:
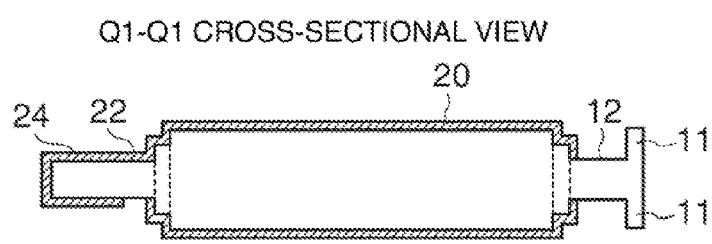

FIG. 37A is a plan view of the piezoelectric vibrating element 120B according to another modified example, and FIG. 37B is a Q1-Q1 cross-sectional view of FIG. 37A. The excitation section 14, the excitation electrodes 20, the extraction electrodes 22, and the pads 24 of the piezoelectric substrate 10 are substantially the same as those of the piezoelectric vibrating element 100B shown in FIGS. 23A through 23C, 24A, and 24B, and therefore, the explanation therefor will be omitted. The projection sections 11 each having a thin strip shape are formed along the edge along the Z' axis (the short side) respectively on the obverse and reverse sides of the peripheral section 12 opposed to the two pads 24 disposed in the corner portions of the piezoelectric substrate 10.

Figure 38A:
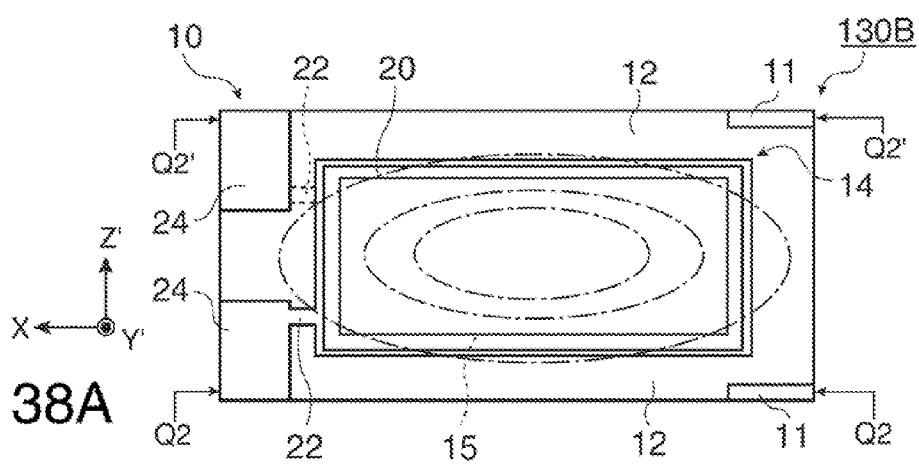
Figure 38B:
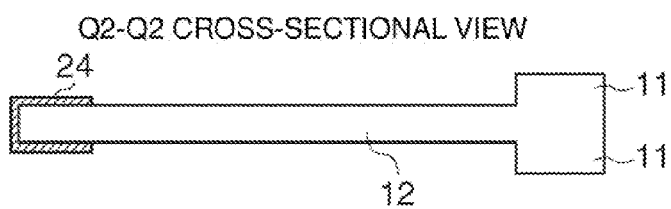

FIG. 38A is a plan view of the piezoelectric vibrating element 130B according to another modified example, and FIG. 38B is a Q2-Q2 cross-sectional view or a Q2'-Q2' cross-sectional view of FIG. 38A. The excitation section 14, the excitation electrodes 20, the extraction electrodes 22, and the pads 24 of the piezoelectric substrate 10 are substantially the same as those of the piezoelectric vibrating element 100B shown in FIGS. 23A through 23C, 24A, and 24B, and therefore, the explanation therefor will be omitted. The projection sections 11 each having a short thin strip shape formed along the respective long sides (in the X-axis direction) of the piezoelectric substrate 10 in the corner portions of the peripheral section 12 opposed to the two pads 24 disposed in the corner portions of the piezoelectric substrate 10, and on the obverse and reverse sides perpendicularly to the peripheral section 12.

Although the piezoelectric vibrating elements with the two-stage mesa structure are hereinabove explained, the same can also be applied to the piezoelectric vibrating elements with a multistage mesa structure in the same manner.

As shown in the example of the embodiment shown in FIGS. 36A and 36B, by forming the projection sections 11 (11a, 11b) having the bracket shape in the end portion of the piezoelectric substrate 10, there can be obtained an advantage that even if the piezoelectric vibrating element is fixed by bonding to the package after being rotated in the X-axis direction, there is no possibility that the excitation electrodes have contact with the inner surface of the package, and the yield ratio is significantly improved when manufacturing the piezoelectric vibrator.

As shown in the example of the embodiment shown in FIGS. 37A and 37B, by forming the projection sections 11 shaped like a single straight line along the edge along the Z' axis on the piezoelectric substrate throughout the entire length thereof, since the function thereof, namely the function of eliminating the possibility for the excitation electrodes to have contact with the inner surface of the package when mounting the element on the package, is never damaged even if some deformation is caused in the projection sections due to the etching process and so on, there is an advantage that the yield ratio can significantly be improved when manufacturing the piezoelectric vibrating element.

Further, as shown in the examples of the embodiment shown in FIGS. 23A through 23C, 24A, 24B, 34A through 34C, 35A, 35B, 36A, 36B, 37A, 37B, 38A, and 38B, by making the total thickness of the thicknesses of the respective projection sections 11 on the obverse and reverse sides and the thickness of the peripheral section 12 equal to the thickness of the excitation section 14, there is an advantage that the manufacture of the piezoelectric substrate is easy, there is no possibility for the excitation electrodes to have contact with the inner surface of the package, and the yield ratio can significantly be improved when manufacturing the piezoelectric vibrator.

4. Piezoelectric Vibrator

Figure 39A:
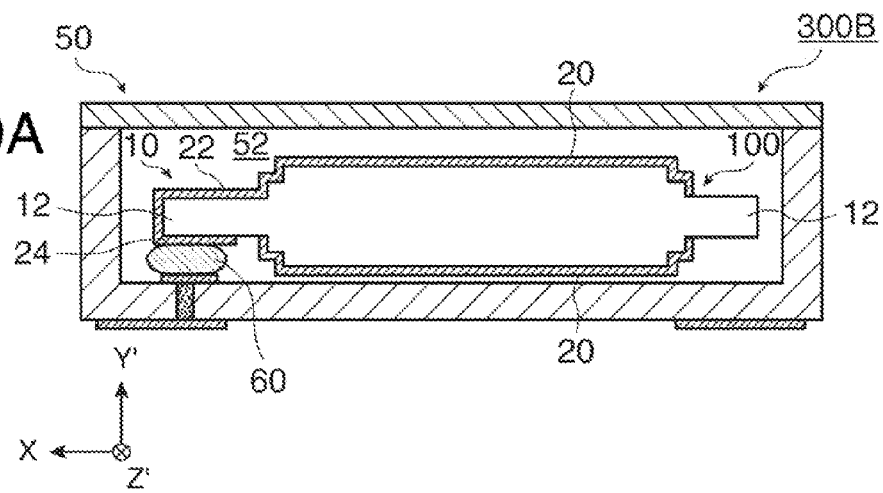
Figure 39B:
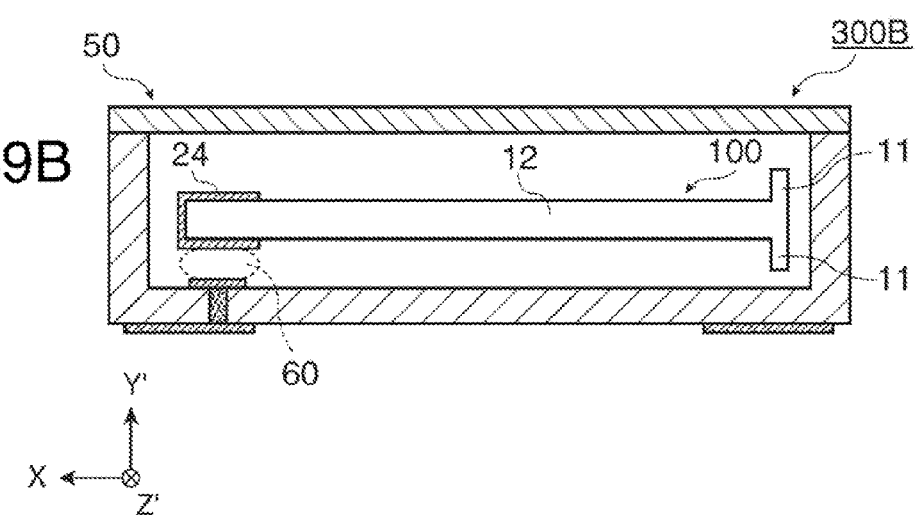

Then, a piezoelectric vibrator according to the present embodiment will be explained with reference to the accompanying drawings. FIGS. 39A and 39B are cross-sectional views schematically showing the piezoelectric vibrator 300B according to the present embodiment.

FIG. 39A is a cross-sectional view in the longitudinal direction (the X-axis direction) showing the configuration of the piezoelectric vibrator 300B, which is the cross-sectional view in substantially the same position as the cross-sectional view of the piezoelectric vibrating element 100B shown in FIG. 24A. FIG. 39B is a cross-sectional view in the longitudinal direction (the X-axis direction) at the end portion in the short-side direction (the Z'-axis direction) of the piezoelectric vibrator 300B. As shown in FIG. 39A, the piezoelectric vibrator 300B includes the piezoelectric vibrating element (the piezoelectric vibrating element 100B in the example shown in the drawing), and a package 50.

The package 50 is capable of housing the piezoelectric vibrating element 100B in a cavity 52. As the material of the package 50, there can be cited, for example, ceramics and glass. The cavity 52 forms a space for the piezoelectric vibrating element 100B to operate. The cavity 52 is sealed, and is set to be a reduced-pressure space or an inert gas atmosphere. The piezoelectric vibrating element 100B is housed in the cavity 52 of the package 50. In the example shown in the drawing, the piezoelectric vibrating element 100B is fixed to the inside of the cavity 52 via an electrically-conductive adhesive 60 in a cantilevered manner. As the electrically-conductive adhesive 60, a solder or a silver paste, for example, can be used.

Figure 39C:
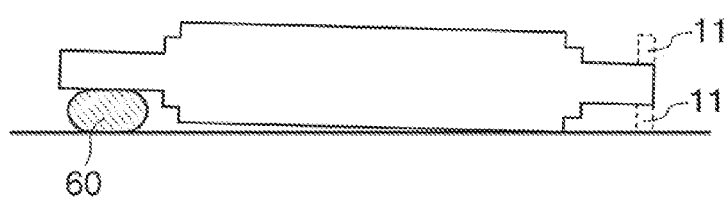
Figure 39D:
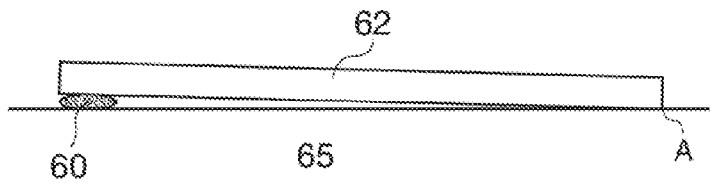

Although in the drawings of the embodiment shown in FIGS. 39A and 39B, there is shown an example in which both of the principal surfaces of the piezoelectric vibrating element 100B are configured to be parallel to the inner bottom surface (or the lid member) of the package 50, there is a case in which the both principal surfaces are tilted toward the inner bottom surface of the package 50 as in the cross-sectional view shown in FIG. 39C, or warped toward the lid member by contraries depending on the application amount or the viscosity of the electrically-conductive adhesive 60. However, in the case of the piezoelectric vibrating element (the piezoelectric vibrating element 100B in the example shown in the drawing) according to the present embodiment, since the projection sections 11 are formed on the obverse and reverse sides in the corner portions of the peripheral section 12 opposed to the pads 24 provided to the corner portions of the piezoelectric substrate 10, there is no chance for the excitation electrodes 20 provided to the excitation section 14 to have contact with either of the inner bottom surface and the lid member even in the case in which the piezoelectric vibrating element 100B is tilted toward the inner bottom surface of the package 50 or warped toward the lid member by contraries. This can easily be understood also from the fact that, as shown in FIG. 39D, in the case in which one side (the left side in the drawing) of a substrate 62 having a constant thickness is fixed to a base 65 with an adhesive 60, even if the substrate 62 is tilted downward, although a lower tip A on the other side (the right side in the drawing) of the substrate 62 has contact with an upper surface of the base 65, the other portion of the substrate 62 does not have contact with the upper surface of the base 65.

It should be noted that although not shown in the drawings an IC chip for oscillating the piezoelectric vibrating element 100B can be housed in the package 50. The IC chip is electrically connected to the pads 24 via the electrically-conductive adhesive 60. It is also possible to mount the IC chip outside the package.

As shown in the embodiment in FIGS. 39A and 39B, according to the piezoelectric vibrator 300B, since the piezoelectric vibrating element 100B according to the present embodiment is provided, the reduction in the CI value can be achieved. Further, according to the piezoelectric vibrator 300B, since the projection sections 11 are disposed in the corner portions opposed to the pads 24 of the piezoelectric vibrating element 100B, or along the edge opposed thereto, and therefore, the excitation electrodes 20 do not have contact with the package bottom or the lid member when housing the piezoelectric vibrating element 10 in the package 50, there is an advantage that the yield ratio of the piezoelectric vibrator 300B is significantly improved.

5. Experimental Example

Hereinafter, an experimental example will be shown, and the present embodiment will more specifically be explained. It should be noted that the scope of the invention is not at all limited by the following experimental example.

5.1 Configuration of Piezoelectric Vibrating Element

As a specific example, the piezoelectric vibrating element 100B having the two-stage mesa structure shown in FIGS. 23A through 23C, 24A, and 24B is used. Specifically, the AT-cut quartz crystal substrate is processed by a wet-etching process using a solution including hydrofluoric acid to thereby form the piezoelectric substrate 10 having the peripheral section 12 and the excitation section 14. The piezoelectric substrate 10 is formed to be symmetrical about a point (not shown) to be the center of symmetry. The thickness t of the first part 15 of the excitation section 14 is set to 0.065 mm, and the vibrational frequency is set to 24 MHz. Further, the dimension X of the long side of the piezoelectric substrate 10 is set to 1.1 mm (i.e., the X length-to-thickness ratio X/t is set to 17), and the short-side dimension Mz of the excitation section 14 is set to 0.43 mm. Further, the CI value (room temperature) is measured while varying the dimension Z of the short side of the piezoelectric substrate 10 to 0.46 mm, 0.5 mm, 0.54 mm, 0.59 mm, 0.65 mm, 0.72 mm, 0.81 mm, and 0.92 mm. The measurement is performed on the piezoelectric vibrating element housed in the package.

5.2 Measurement Result of CI Value

Figure 40:
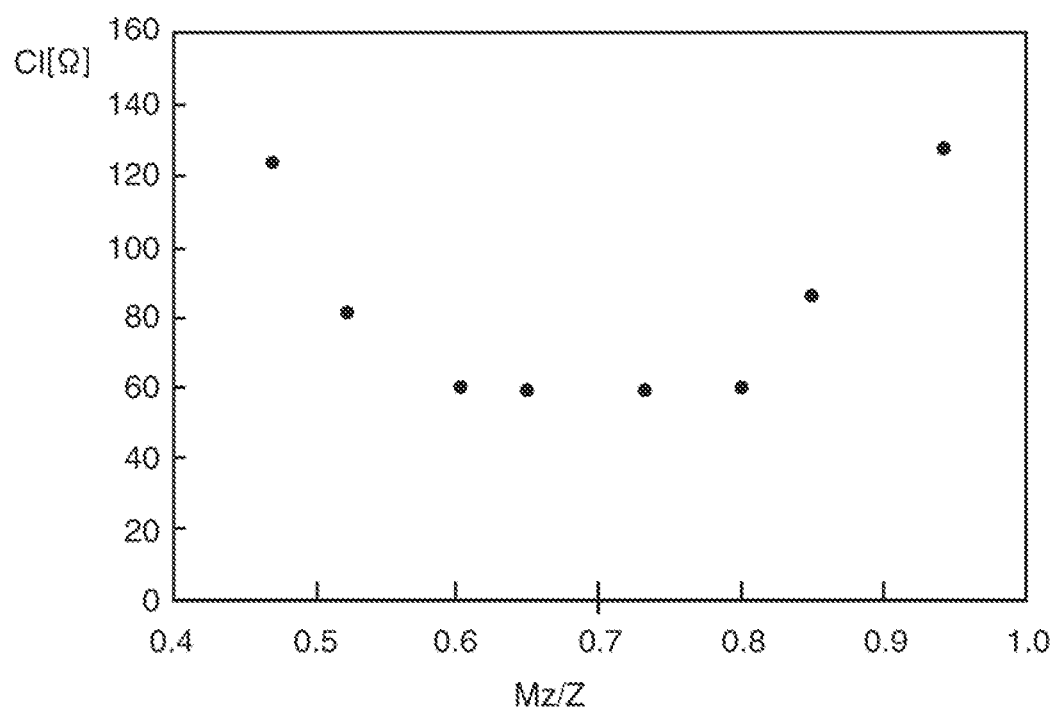
FIG. 40 is a diagram showing a relationship between Mz/Z and the CI value, wherein Mz denotes the dimension of the short side of the excitation section, and Z denotes the dimension of the short side of the piezoelectric substrate.

FIG. 40 is a diagram showing the relationship between Mz/Z and the CI value. It is found out from FIG. 40 that the CI value is as low as about 60Ω in a range of Mz/Z from 0.6 to 0.8. The value of Z on this occasion is equal to or larger than 0.54 mm and equal to or smaller than 0.72 mm, and the Z length-to-thickness ratio (Z/t) becomes equal to or higher than 8 and equal to or lower than 11. It is found out from the above that by setting the range of the Z length-to-thickness ratio (Z/t) to $8 \leq Z/t \leq 11$, and at the same time setting the range of Mz/Z to $0.6 \leq Mz/Z \leq 0.8$ (i.e., by fulfilling the formula 1 above), the reduction of the CI value can be achieved. It is inferable that this is achieved due to the fact that by designing Z/t and Mz/Z so as to fulfill the formula 1, the combination of the thickness-shear vibration in the Z'-axis direction and the unwanted mode such as the contour vibration can further be suppressed.

It should be noted that according to the measurement of the CI value in the piezoelectric vibrating element with Mz set to 0.4 mm and Z set to 0.65 mm (i.e., Mz/Z=0.6) and the piezoelectric vibrating element with Mz set to 0.48 mm and Z set to 0.6 mm (i.e., Mz/Z=0.8), the IC value is about 60Ω in the both cases. According to this result, it can be said that the reduction of the CI value can be achieved as long as the formula 1 described above is fulfilled without being limited to the case of Mz=0.43 mm.

Further, it can be assumed that the influence of the unwanted mode such as a contour vibration is caused by the distance from the periphery of the piezoelectric substrate 10 to the excitation section 14. Therefore, it is inferable that the combination of the thickness-shear vibration and the unwanted mode such as a contour vibration in the Z'-axis direction can be suppressed irrespective of, for example, the distance from the periphery of the second part 16 to the first part 15 providing the formula 1 is fulfilled.

Although the experimental example described above is performed with respect to the piezoelectric vibrating element having the two-stage mesa structure shown in FIGS. 23A through 23C, 24A, and 24B, the present experimental result can also be applied to the piezoelectric vibrating element having, for example, a multistage mesa type of mesa structure shown in FIGS. 34A through 34C, 35A, and 35B.

6. Electronic Device and Piezoelectric Oscillator

Figure 41A:
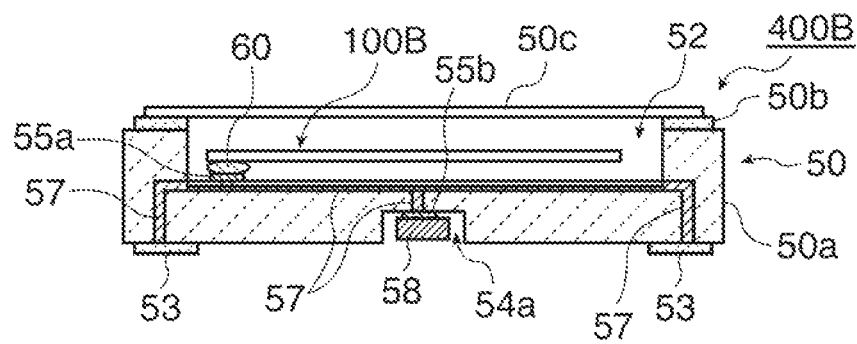
FIG. 41A is a cross-sectional view showing an electronic device as an embodiment of the invention.
Figure 41B:
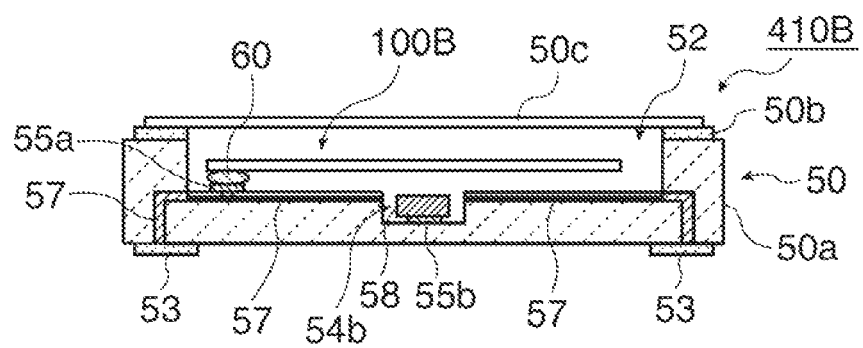
FIG. 41B is a cross-sectional view showing a modified example of the invention.

Then, an electronic device and a piezoelectric oscillator according to the present embodiment will be explained with reference to the accompanying drawings. FIGS. 41A and 41B are schematic cross-sectional views showing the electronic device according to an embodiment of the invention. FIG. 41A is a cross-sectional view of an example of an electronic device 400B according to the embodiment of the invention. The electronic device 400B is mainly provided with the piezoelectric vibrating element 100B (although the piezoelectric vibrating element 100B is shown in FIG. 41A, other piezoelectric vibrating elements according to the present embodiment can also be adopted) according to the present embodiment of the invention, a thermistor 58 as a thermosensor, and the package 50 for housing the piezoelectric vibrating element 100B and the thermistor 58. The package 50 is provided with a package main body 50a and a lid member 50c. The package main body 50a is provided with the cavity 52 for housing the piezoelectric vibrating element 100B disposed on the upper surface side, and is provided with a recessed section 54a for housing the thermistor 58 disposed on the lower surface side. A plurality of element mounting pads 55a is disposed in an end portion of the inner bottom surface of the cavity 52, and each of the element mounting pads 55a is electrically connected to a plurality of mounting terminals 53 with internal conductors 57. The piezoelectric vibrating element 100B is mounted on the element mounting pads 55a, then the pads 24 and the element mounting pads 55a are electrically connected to each other via the electrically-conductive adhesive 60, respectively, and are then fixed to each other. In the upper part of the package main body 50a, there is calcined a sealing ring 50b made of kovar or the like, and the lid member 50c is mounted on the sealing ring 50b, and is then welded using a resistance welder to thereby airtightly seal the cavity 52. The cavity 52 can be vacuated, or filled with an inert gas. Incidentally, at the center of the lower surface of the package main body 50a, there is formed the recessed section 54a, and on the upper surface of the recessed section 54a there is calcined an electronic component mounting pads 55b. The thermistor 58 is mounted on the electronic component mounting pads 55b using solder or the like. The electronic component mounting pads 55b are electrically connected to a plurality of mounting terminals 53 with the internal conductors 57.

FIG. 41B shows an electronic device 410B according to a modified example of one shown in FIG. 41A, and is different from the electronic device 400B in the point that the recessed section 54b is provided to the bottom surface of the cavity 52 of the package main body 50a, and the thermistor 58 is connected to the electronic component mounting pads 55b calcined on the bottom of the recessed section 54b via metal bumps or the like. The electronic component mounting pads 55b are electrically connected to the mounting terminals 53. Therefore, the piezoelectric vibrating element 100B and the thermistor 58 as a thermosensor are housed in the cavity 52 and encapsulated airtightly. The example of housing both of the piezoelectric vibrating element 100B and the thermistor 58 in the package 50 is hereinabove explained. It is preferable to constitute the electronic device housing at least one of a thermistor, a capacitor, a reactive element, and a semiconductor element as an electronic component housed in the package 50.

The examples of the embodiment shown in FIGS. 41A and 41B are the examples housing the piezoelectric vibrating element 100B and the thermistor 58 in the package 50. According to such a configuration, since the thermistor 58 as a thermosensor is located extremely near to the piezoelectric vibrating element 100B, there can be obtained an advantage that the temperature variation in the piezoelectric vibrating element 100B can promptly be sensed. Further, since the electronic device having a piezoelectric vibrating element with a small CI value can be constituted by composing the electronic device mainly of the piezoelectric vibrating element according to the present embodiment and the electronic component described above, there can be obtained an advantage that the electronic device can be applied to purposes of a variety of fields. Then, by assembling an IC component equipped with an oscillator circuit for driving the piezoelectric vibrating element and then amplifying the output to the package of the piezoelectric vibrator using the piezoelectric vibrating element according to the present embodiment, a piezoelectric oscillator can be built.

Figure 42A:
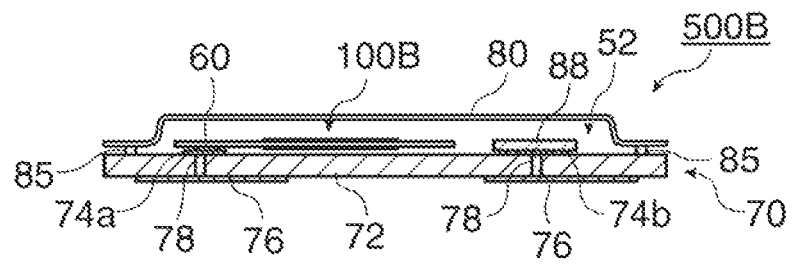
FIG. 42A is a cross-sectional view showing a piezoelectric oscillator as an embodiment of the invention.

FIG. 42A is a cross-sectional view of an example of a piezoelectric oscillator 500B according to an embodiment of the invention. The piezoelectric oscillator 500B is mainly provided with the piezoelectric vibrating element 100B (although the piezoelectric vibrating element 100B is shown in FIG. 22A, other piezoelectric vibrating elements according to the present embodiment can also be adopted) according to the present embodiment, a single layer insulating substrate 70, an IC (a semiconductor element) 88 for driving the piezoelectric vibrating element 100B, and a lid member 80 having a convex shape for airtightly sealing a surface space of the insulating substrate 70 including the piezoelectric vibrating element 100B and the IC 88. The insulating substrate 70 has a plurality of element mounting pads 74a and electronic component mounting pads 74b for mounting the piezoelectric vibrating element 100B and the IC 88 on the obverse surface thereof, and is at the same time provided with mounting terminals 76 on the reverse surface thereof for connection to an external circuit. The element mounting pads 74a and the electronic component mounting pads 74b are electrically connected to the mounting terminals 76 with conductors 78 penetrating the insulating substrate 70. Further, electrical connection between the element mounting pads 74a and the electronic component mounting pads 74b is achieved by conductor wiring (not shown) formed on the surface of the insulating substrate 70. After mounting the IC 88 on the electronic component mounting pads 74b using metal bumps or the like, the electrically-conductive adhesive 60 is applied to the element mounting pads 74a, then the pads 24 of the piezoelectric vibrating element 100B are mounted thereon, and then the electrically-conductive adhesive 60 is cured in a thermostatic chamber to thereby achieve the electrical connection and fixation. The lid member 80 having a convex shape and the insulating substrate 70 are sealed with low-melting-point glass 85 applied to the periphery of the upper surface of the insulating substrate 70. On this occasion, it is possible to vacuate the inside by performing the sealing process in a vacuum atmosphere.

Figure 42B:
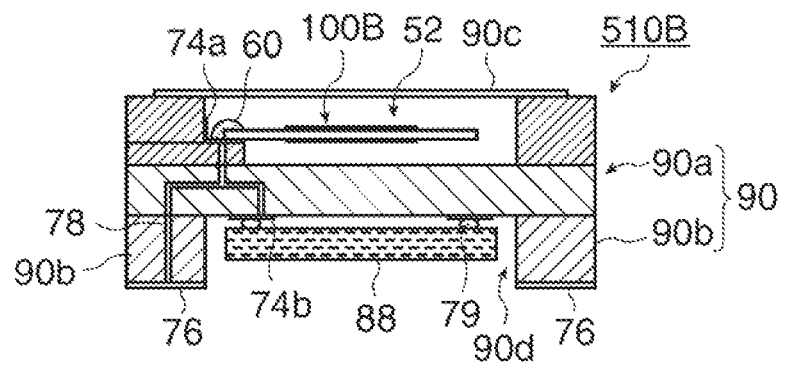
FIG. 42B is a cross-sectional view showing a modified example of the embodiment.
Figure 42C:
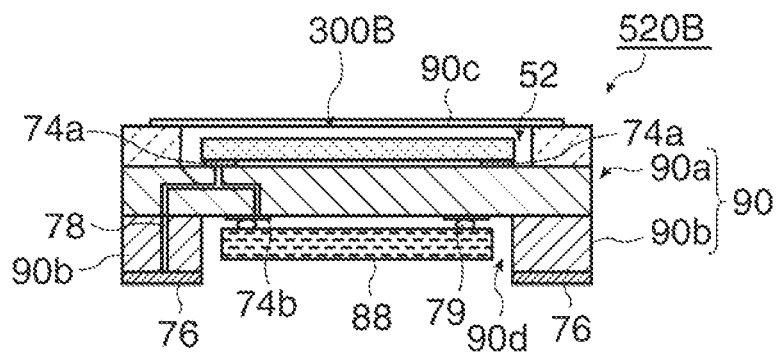
FIG. 42C is a cross-sectional view showing another modified example of the embodiment.

FIG. 42B is a cross-sectional view of a piezoelectric oscillator 510B according to another example of the present embodiment. The piezoelectric oscillator 510B is mainly provided with the piezoelectric vibrating element 100B according to the present embodiment, a package main body 90, the IC 88 for driving the piezoelectric vibrating element 100B, and a lid member 90c for airtightly encapsulating the piezoelectric vibrating element 100B. The package main body 90 is a main body of the package having a so-called H structure composed of an upper part 90a having the cavity 52 for housing the piezoelectric vibrating element 100B and a lower part 90b having a recessed section 90d for housing the IC 88. The piezoelectric vibrating element 100B is mounted on the electrically-conductive adhesive 60 applied to the surface of the element mounting pads 74a formed in an end portion of a bottom of the cavity 52, and is fixed in a conductive manner by thermally curing the adhesive. The IC 88 is connected and fixed to the electronic component mounting pads 74b formed on an upper surface of the recessed section 90d on the lower surface side of the package main body 90 with metal bumps 79. The element mounting pads 74a and the electronic component mounting pads 74b are electrically connected to each other with internal conductors 78. The lid member 90c is mounted on a sealing ring (not shown) calcined on the upper part of the package main body 90, and is then welded using a resistance welder or the like to thereby airtightly seal the package. The cavity 52 can be vacuated, or filled with an inert gas. FIG. 42C is a cross-sectional view of a piezoelectric oscillator 520B according to another example of the present embodiment. The piezoelectric oscillator 520B is mainly provided with the piezoelectric vibrator 300B according to the present embodiment, a package main body 90, the IC 88 for driving the piezoelectric vibrator 300B, and a lid member 90c for airtightly encapsulating the piezoelectric vibrator 300B. The package main body 90 is a main body of the package having a so-called H structure composed of the upper part 90a having the cavity 52 for housing the piezoelectric vibrator 300B and the lower part 90b having the recessed section 90d for housing the IC 88. The piezoelectric vibrator 300B is mounted on the element mounting pads 74a formed on both end portions of the bottom section of the cavity 52, and is connected and fixed thereto with solder, metal bumps, or the like. The IC 88 is connected and fixed to the electronic component mounting pads 74b formed on an upper surface of the recessed section 90d on the lower surface side of the package main body 90 with the metal bumps 79. The element mounting pads 74a and the electronic component mounting pads 74b are electrically connected to each other with internal conductors 78. The lid member 90c is mounted on a sealing ring (not shown) calcined on the upper part of the package main body 90, and is then welded using a resistance welder or the like. The piezoelectric vibrating element is airtightly encapsulated over again. The IC 88 can include an oscillator circuit for driving the piezoelectric vibrator 300B, a thermosensor for sensing the temperature around the piezoelectric vibrator 300B, a compensation circuit for compensating the frequency temperature characteristics of the piezoelectric vibrator 300B, a voltage-controlled capacitive element, and so on. Since the piezoelectric oscillator 500B according to the embodiment shown in FIG. 42A has the piezoelectric vibrating element 100B with small CI value according to the present embodiment and the IC (including the oscillator circuit) 88 disposed in the package, and therefore the piezoelectric oscillator can be miniaturized and the oscillation current of the oscillator circuit can be reduced, there can be obtained an advantage that low power consumption can be achieved. The piezoelectric oscillator 510B according to the embodiment shown in FIG. 42B has the piezoelectric vibrating element 100B with a small CI value according to the present embodiment and the IC (including the oscillator circuit) 88 disposed in the package, and therefore has an advantage that low power consumption of the piezoelectric oscillator can be achieved. Further, since the IC 88 can externally be controlled, there can be obtained an advantage that a multifunction piezoelectric oscillator further superior in frequency temperature characteristics can be constituted.

Since the piezoelectric oscillator 520B according to the present embodiment shown in FIG. 42C uses the piezoelectric vibrator 300B housed in the package, there can be obtained an advantage that a multifunction and reliable piezoelectric oscillator superior in frequency stability in, for example, aging can be constituted.

The invention is not limited to the embodiments described above, but various modifications are possible. For example, the invention includes configurations (e.g., configurations having the same function, the same way, and the same result, or configurations having the same object and the same advantages) substantially the same as those described in the embodiment section. Further, the invention includes configurations obtained by replacing a non-essential part of the configurations described in the embodiment section. Further, the invention includes configurations exerting the same advantages or configurations capable of achieving the same object as the configurations described in the embodiment section. Further, the invention includes configurations obtained by adding technologies known to the public to the configurations described in the embodiment section.

It should be noted that although the explanation is presented assuming that the electronic device such as the piezoelectric oscillator described above has the configuration of providing the electronic component represented by a semiconductor element (IC) to the piezoelectric vibrator, it is preferable to provide at least one electronic component. Further, as the electronic component, a thermistor, a capacitor, a reactive element, and so on can be applied, and thus, the electronic device using a piezoelectric vibrator element as an oscillation source can be built.

The entire disclosure of Japanese Patent Application No. 2011-051311, filed Mar. 9, 2011 and Japanese Patent Application No. 2011-051312, filed Mar. 9, 2011 is expressly incorporated by reference herein.

What is claimed is:

1. A piezoelectric vibrating element, comprising:
    a piezoelectric substrate formed of an AT-cut quartz crystal substrate in an orthogonal coordinate system composed of an X axis as an electrical axis, a Y axis as a mechanical axis, and a Z axis as an optical axis, which are crystal axes of a quartz crystal, an axis obtained by tilting the Z axis toward a −Y direction of the Y axis so as to rotate the +Z side is a Z' axis, and an axis obtained by tilting the Y axis toward a +Z direction of the Z axis so as to rotate the +Y side is a Y' axis, the piezoelectric substrate is a quartz crystal substrate in which a principal surface is a surface including the X axis and the Z' axis in a plan view along the Y' axis and has a thickness in a direction along the Y' axis; and
    excitation electrodes disposed respectively on principal surfaces of the piezoelectric substrate;
    the piezoelectric substrate having (i) an excitation section; and (ii) a peripheral section, a thickness of the peripheral section being smaller than a thickness of the excitation section, the peripheral section surrounds the excitation section in plan view;
    the excitation section includes a stepped section placed between the peripheral section and a center of the excitation section in a direction along the X axis, and
    the excitation section includes an R-plane or an m-plane of the quartz crystal substrate exposed between the peripheral section and the center of the excitation section in a direction along the Z' axis,
    at least one projection section that projects from the peripheral section along a thickness direction.

2. The piezoelectric vibrating element according to claim 1, wherein:
    the R-plane of the quartz crystal substrate is included between a center of the excitation section and the peripheral section on one side in the direction along the Z' axis, and the m-plane having irregularity is included between a center of the excitation section and the peripheral section on another side in the direction along the Z' axis.

3. The piezoelectric vibrating element according to claim 1, wherein:
    the piezoelectric substrate has a plurality of corner portions;
    a plurality of pads disposed at some of the plurality of corner portions; and
    the projection section is arranged at a corner portion other than the corner portions at which the pads are disposed.

4. The piezoelectric vibrating element according to claim 1, wherein:
    the piezoelectric substrate has a plurality of corner portions;
    a plurality of pads disposed at some of the plurality of corner portions; and
    the projection section is arranged at a corner portion other than the corner portions at which the pads are disposed, and is arranged along an edge periphery along the Z' axis.

5. The piezoelectric vibrating element according to claim 1, wherein:
    the piezoelectric substrate has a plurality of corner portions;
    a plurality of pads disposed at some of the plurality of corner portions; and
    the projection section is arranged at a corner portion other than the corner portions at which the pads are arranged and includes (i) a first projection part that is disposed along an edge periphery along the Z' axis and (ii) second projection parts that are continuous to the first projection part and are disposed along the X axis.

6. The piezoelectric vibrating element according to claim 1, wherein:
    the at least one projection section comprises two projection sections, the two projection sections being disposed respectively on obverse and reverse principal surfaces, which are in a front-and-rear relationship, of the peripheral section; and
    a length along a thickness from an apex of the projection section on the obverse principal surface side to an apex of the projection section on the reverse principal surface side is equal to a thickness of the first section.

7. The piezoelectric vibrating element according to claim 1, wherein:
    when a length of the piezoelectric substrate along the Z' axis is Z, a length of the excitation section along the Z axis is Mz, and a thickness of the first section is t, the relationships $8 \leq Z/t \leq 11$ and $0.6 \leq Mz/Z \leq 0.8$ are fulfilled.

8. The piezoelectric vibrating element according to claim 1, wherein:
    when a length of the piezoelectric substrate along the X axis is X, and a thickness of the first section is t, the relationship $X/t \leq 17$ is fulfilled.

9. A piezoelectric vibrator comprising:
    the piezoelectric vibrating element according to claim 1; and
    a package that houses the piezoelectric vibrating element.

10. A piezoelectric oscillator comprising:
    the piezoelectric vibrating element according to claim 1; and
    an oscillator circuit that drives the piezoelectric vibrating element.

11. A piezoelectric oscillator comprising:
    the piezoelectric vibrator according to claim 10; and
    an oscillator circuit that drives the piezoelectric vibrator.

12. The piezoelectric oscillator according to claim 10, wherein:
    the oscillator circuit is installed in a semiconductor element.

13. The piezoelectric oscillator according to claim 11, wherein:
    the oscillator circuit is installed in a semiconductor element.

14. An electronic device, comprising:
    the piezoelectric vibrating element according to claim 1; and
    at least one electronic component.

15. The electronic device according to claim 14, wherein:
    the electronic component is any of a thermistor, a capacitor, a reactive element, or a semiconductor element.

16. The piezoelectric vibrating element according to claim 1, wherein:
    the excitation electrodes cover the stepped sections.

* * * * *